US007650274B2

(12) United States Patent
Higuchi et al.

(10) Patent No.: US 7,650,274 B2
(45) Date of Patent: *Jan. 19, 2010

(54) MICROCOMPUTER LOGIC DEVELOPMENT SYSTEM

(75) Inventors: Takashi Higuchi, Kobe (JP); Shougo Imada, Kobe (JP); Toshihiro Kashihara, Kobe (JP)

(73) Assignee: Fujitsu Ten Limited, Hyogo (JP)

( * ) Notice: Subject to any disclaimer, the term of this patent is extended or adjusted under 35 U.S.C. 154(b) by 408 days.

This patent is subject to a terminal disclaimer.

(21) Appl. No.: 11/707,974

(22) Filed: Feb. 15, 2007

(65) Prior Publication Data

US 2007/0143091 A1 Jun. 21, 2007

Related U.S. Application Data

(63) Continuation of application No. 10/631,620, filed on Jul. 30, 2003, now Pat. No. 7,283,946, which is a continuation of application No. PCT/JP02/12563, filed on Nov. 29, 2002.

(30) Foreign Application Priority Data

Nov. 30, 2001 (JP) .............................. 2001-367496
Jun. 7, 2002 (JP) .............................. 2002-167711

(51) Int. Cl.
G06F 9/44 (2006.01)
G06F 13/10 (2006.01)
G06F 13/12 (2006.01)
G06F 9/455 (2006.01)
G06F 7/00 (2006.01)

(52) U.S. Cl. .............................. 703/21; 703/24; 701/29
(58) Field of Classification Search .................... 703/21, 703/24; 701/29
See application file for complete search history.

(56) References Cited

U.S. PATENT DOCUMENTS 5,467,461 A * 11/1995 Nasu et al. ................... 711/147

(Continued)

FOREIGN PATENT DOCUMENTS

EP        1 202 193 A2        5/2002

(Continued)

OTHER PUBLICATIONS

Takeshi Kukazawa, Naoya Kamiyama, Norio Yamada, Takeshi Yasuda, "Development of PC-based HIL Simulator "CRAMAS 2001"", Fujitsu TEN TECH. J. No. 17(2001), 2001 pp. 14-24.*

(Continued)

*Primary Examiner*—Paul L Rodriguez
*Assistant Examiner*—Dwin M Craig
(74) *Attorney, Agent, or Firm*—Christie, Parker & Hale, LLP.

(57) ABSTRACT

A system for developing the preceding logic to be implemented in a built-in microcomputer that is used while being incorporated in an electronic control unit. The system includes: a motherboard having a first CPU, a first memory, and a first interface via which the motherboard communicates with the outside, interconnected over a first internal bus; a core board having a second CPU, a second memory, quasi microcomputer peripheral devices, which simulate by software the peripheral devices of a microcomputer, and a second interface via which the core board communicates with the outside, interconnected over a second internal bus; and a PCI bus that links the motherboard and the core board. The development system is substituted for the built-in microcomputer in order to implement the preceding logic.

34 Claims, 55 Drawing Sheets

U.S. PATENT DOCUMENTS

| | | | |
|---|---|---|---|
| 5,557,774 A * | 9/1996 | Shimabukuro et al. | 703/21 |
| 5,742,914 A | 4/1998 | Hagenbuch | |
| 5,805,792 A * | 9/1998 | Swoboda et al. | 714/28 |
| 5,828,840 A | 10/1998 | Cowan et al. | |
| 5,838,948 A * | 11/1998 | Bunza | 703/27 |
| 5,848,581 A | 12/1998 | Hirose et al. | |
| 6,021,307 A | 2/2000 | Chan | |
| 6,022,315 A | 2/2000 | Iliff | |
| 6,028,537 A | 2/2000 | Suman et al. | |
| 6,038,542 A | 3/2000 | Ruckdashel | |
| 6,061,721 A | 5/2000 | Ismael et al. | |
| 6,083,276 A | 7/2000 | Davidson et al. | |
| 6,085,198 A | 7/2000 | Skinner et al. | |
| 6,105,080 A * | 8/2000 | Holt et al. | 710/26 |
| 6,202,100 B1 | 3/2001 | Maltby et al. | |
| 6,236,909 B1 | 5/2001 | Colson et al. | |
| 6,266,723 B1 * | 7/2001 | Ghodrat et al. | 710/100 |
| 6,526,340 B1 * | 2/2003 | Reul et al. | 701/29 |
| 6,697,693 B2 | 2/2004 | Hagiwara et al. | |
| 6,732,031 B1 | 5/2004 | Lightner et al. | |
| 7,283,946 B2 * | 10/2007 | Hiquchi et al. | 703/21 |
| 2004/0031003 A1 | 2/2004 | Hiquchi et al. | |
| 2006/0075182 A1 | 4/2006 | Hsieh et al. | |
| 2006/0149595 A1 | 7/2006 | Williams et al. | |

FOREIGN PATENT DOCUMENTS

| | | |
|---|---|---|
| JP | 58-033766 | 2/1983 |
| JP | 62-190542 | 8/1987 |
| JP | 2-83731 | 3/1990 |
| JP | 2-85934 | 3/1990 |
| JP | 05-020278 | 1/1993 |
| JP | 6-35681 | 2/1994 |
| JP | 7-129428 | 5/1995 |
| JP | 7-271735 | 10/1995 |
| JP | 8-16425 | 1/1996 |
| JP | 9-288593 | 11/1997 |
| JP | 10-105391 | 4/1998 |
| JP | 2000-20291 | 1/2000 |
| JP | 2000-67030 | 3/2000 |
| JP | 2000-215191 | 8/2000 |
| JP | 2000-298596 | 10/2000 |
| JP | 2001-22569 | 1/2001 |
| JP | 2001-109632 | 4/2001 |
| WO | WO 00/57273 | 9/2000 |
| WO | WO 03/046725 A1 | 5/2003 |

OTHER PUBLICATIONS

Patent Abstracts of Japan, Publication No. 02083731, dated Mar. 23, 1990, in the name of Naito et al.

Patent Abstracts of Japan, Publication No. 06-035681, dated Feb. 10, 1994, in the name of Atsushi Mitani.

Patent Abstracts of Japan, Publication No. 10-105391, dated Apr. 24, 1998, in the name of Akiyoshi Nakadai.

Patent Abstracts of Japan, Publication No. 2000-020291, dated Jan. 21, 2000, in the name of Noriyasu Adachi.

Patent Abstract of Japan, Publication No. 2001-022569, dated Jan. 26, 2001, in the name of Kishigami, with Brief Explanation.

Patent Abstracts of Japan, Publication No. 2001-109632, dated Apr. 20, 2001, in the name of Shuichi Nasu et al.

Japan Office action dated Aug. 22, 2006, for priority JP 2002-083713 with partial English translation.

International Search Report of PCT/JP02/12563, dated Mar. 25, 2003.

Patent Abstract of Japan, Publication No. 62190542 A, Published on Aug. 20, 1987, in the name of Shinohara Kazuo.

Patent Abstract of Japan, Publication No. 02085934 A, Published on Mar. 27, 1990, in the name of Watanabe Masamitsu, et al.

Patent Abstract of Japan, Publication No. 07-129428, Published on May 19, 1995, in the name of Suzuki Noriyuki.

Patent Abstract of Japan, Publication No. 08-016425, Published on Jan. 19, 1996, in the name of Nakajima Toshio, et al.

Patent Abstract of Japan, Publication No. 09-288593, Published on Nov. 4, 1997, in the name of Nagatome Toshihide.

Patent Abstract of Japan, Publication No. 2000067030 A, Published on Mar. 3, 2000, in the name of Tsutai Atsunobu, et al.

Patent Abstract of Japan, Publication No. 2000215191 A, Published on Aug. 4, 2000, in the name of Aoyama Kazuhiro.

Patent Abstracts of Japan for Publication No. 58-033766; Date of publication of application Feb. 28, 1983, in the name of Yoshio Sasajima et al.

Patent Abstracts of Japan for Publication No. 05-020278; Date of publication of application Jan. 29, 1993, in the name of Masaki Nasu et al.

Patent Abstracts of Japan for Publication No. 2000-067030; Date of publication of application Mar. 3, 2000, in the name of Atsunobu Tsutai et al.

Patent Abstracts of Japan for Publication No. 2000-298596; Date of publication of application Oct. 24, 2000, in the name of Chong Min Kyung et al.

* cited by examiner

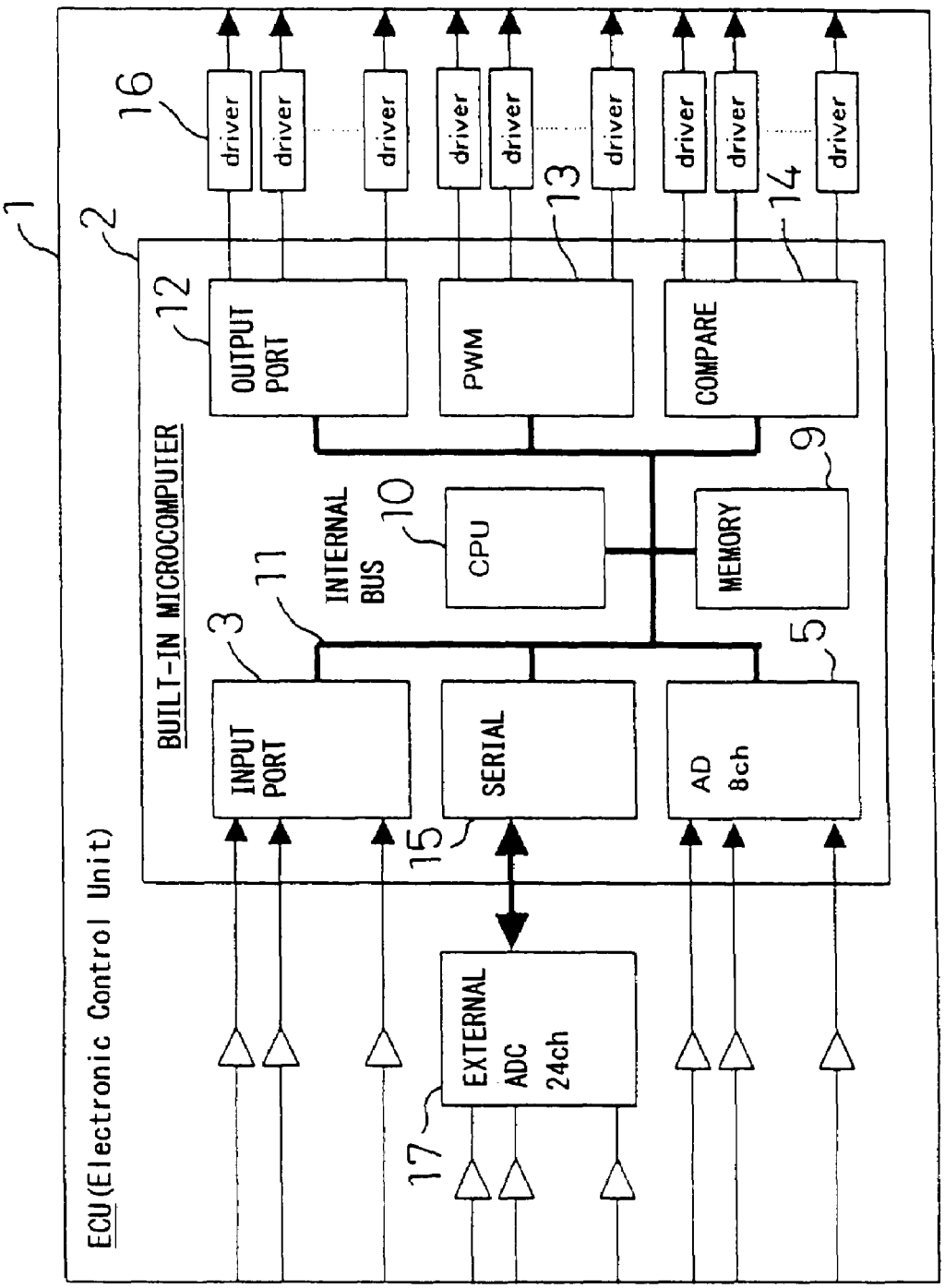

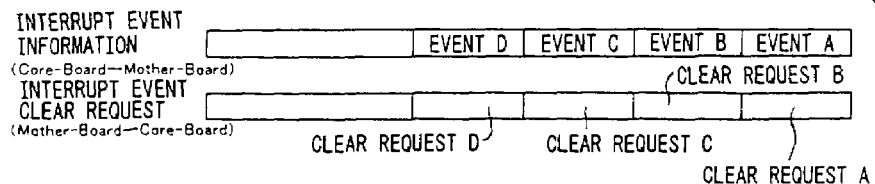
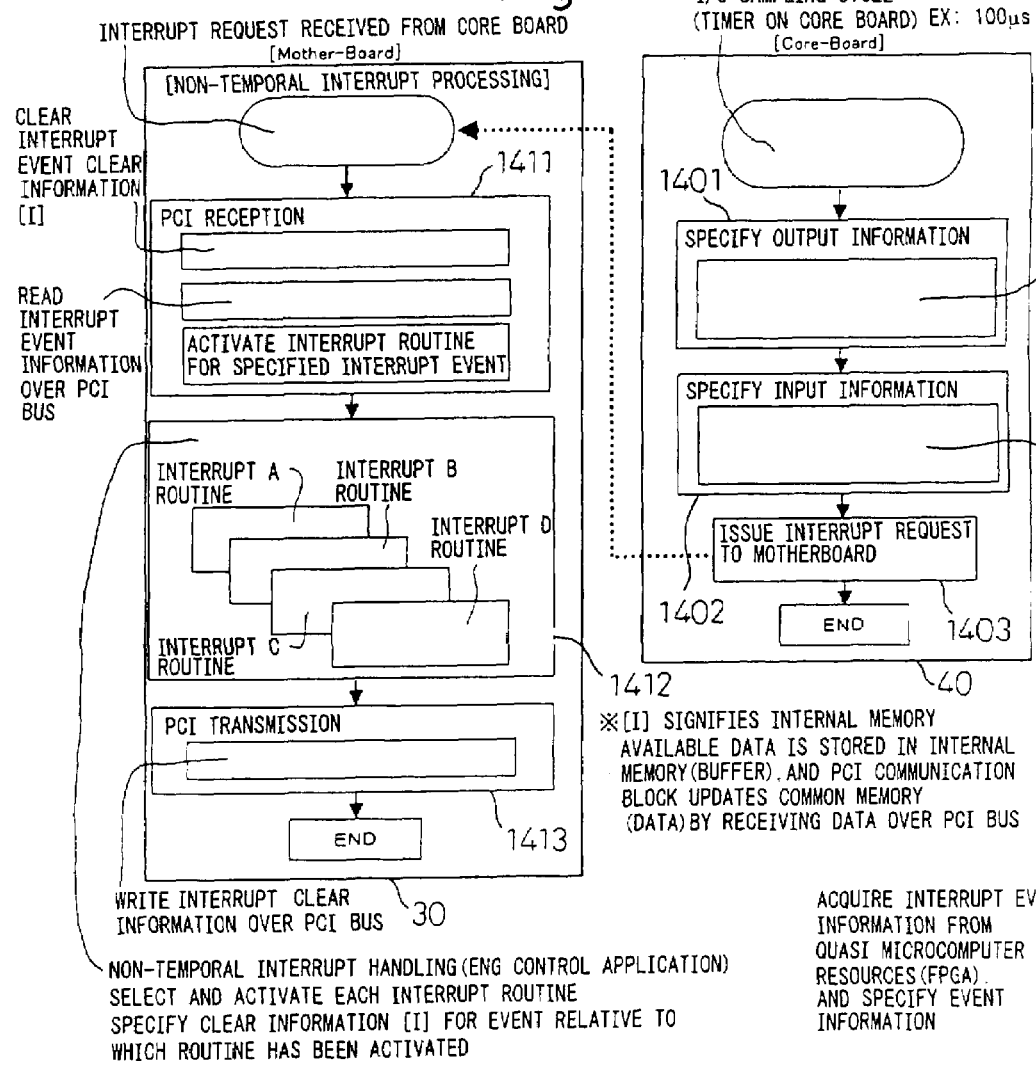

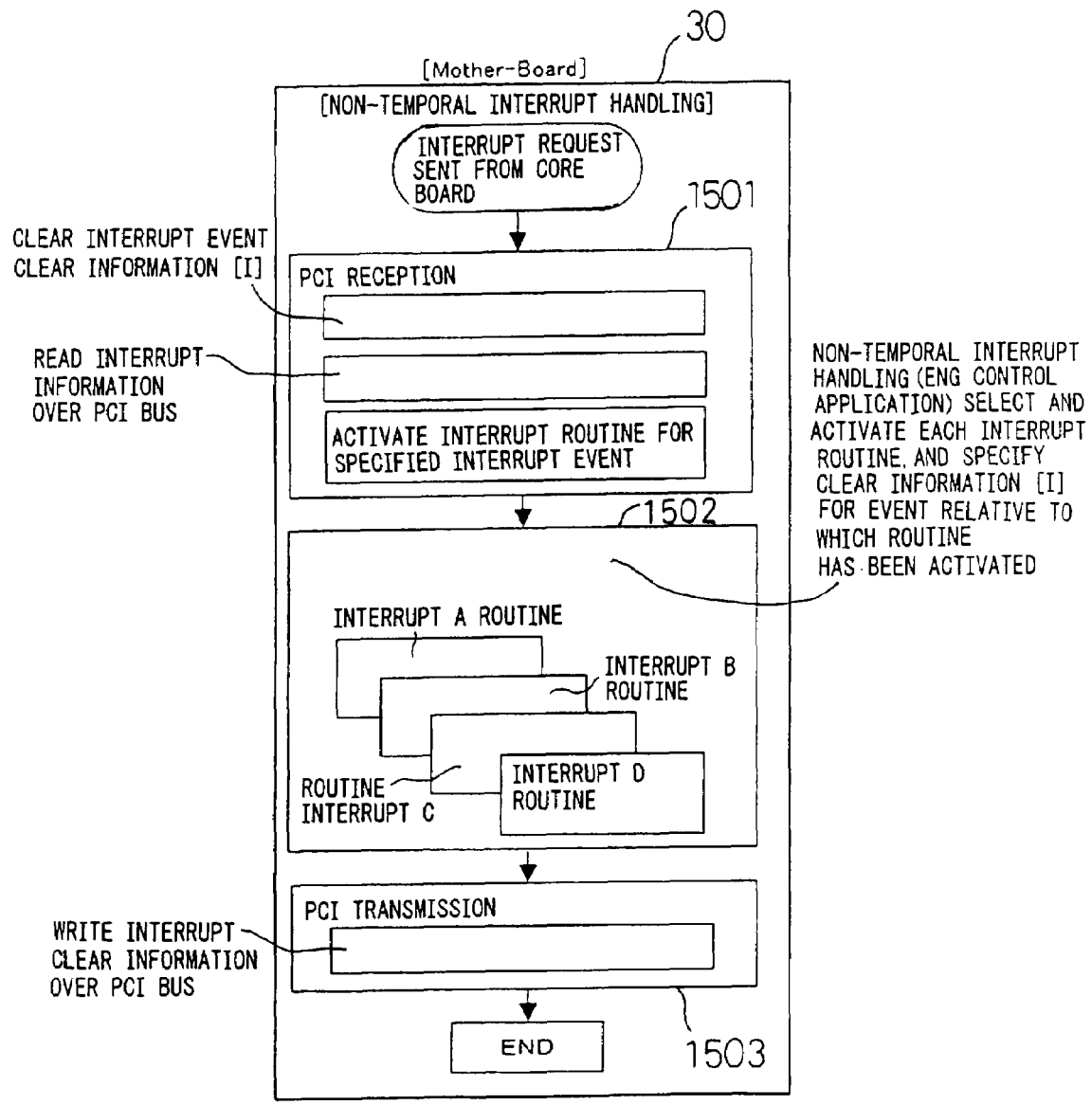

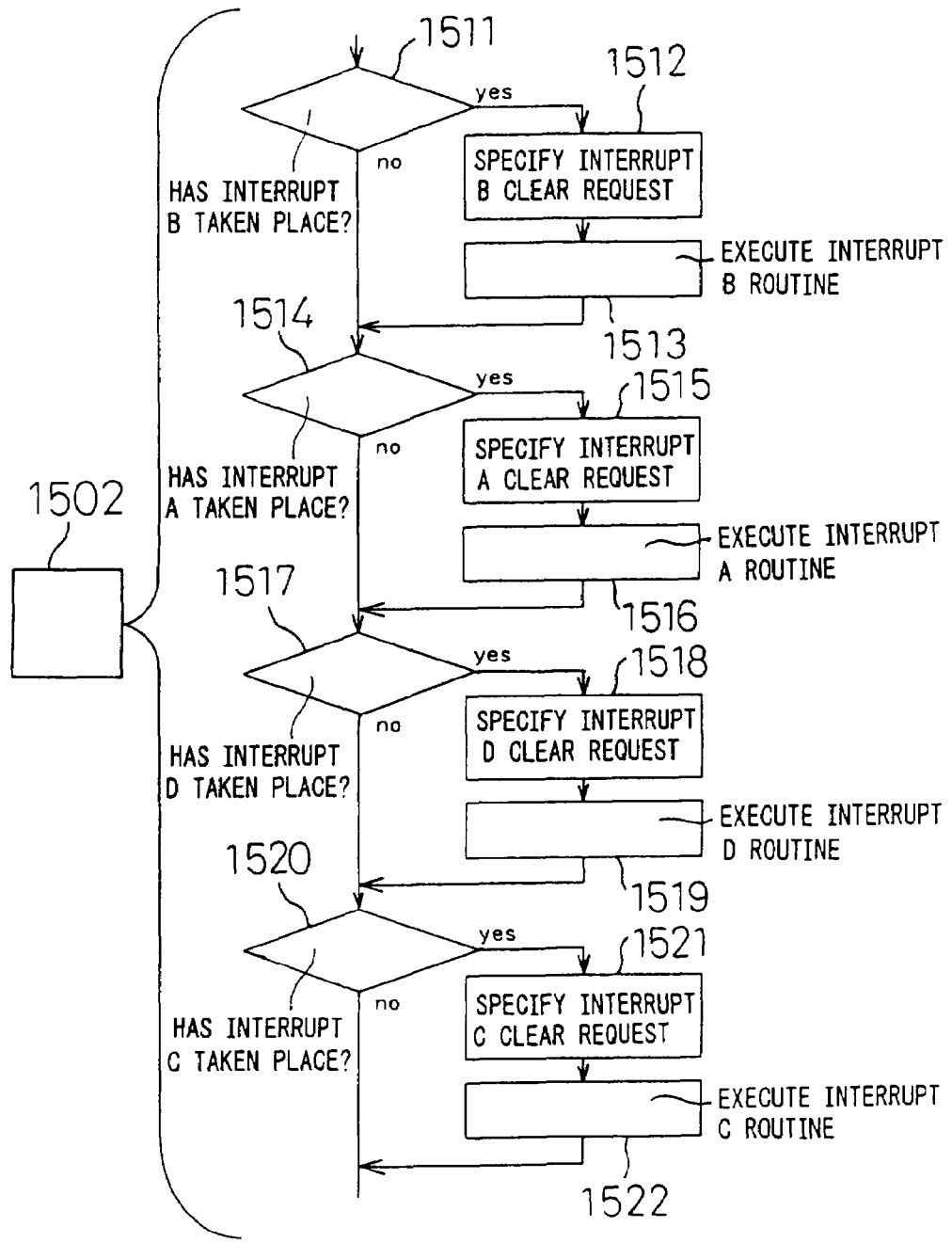

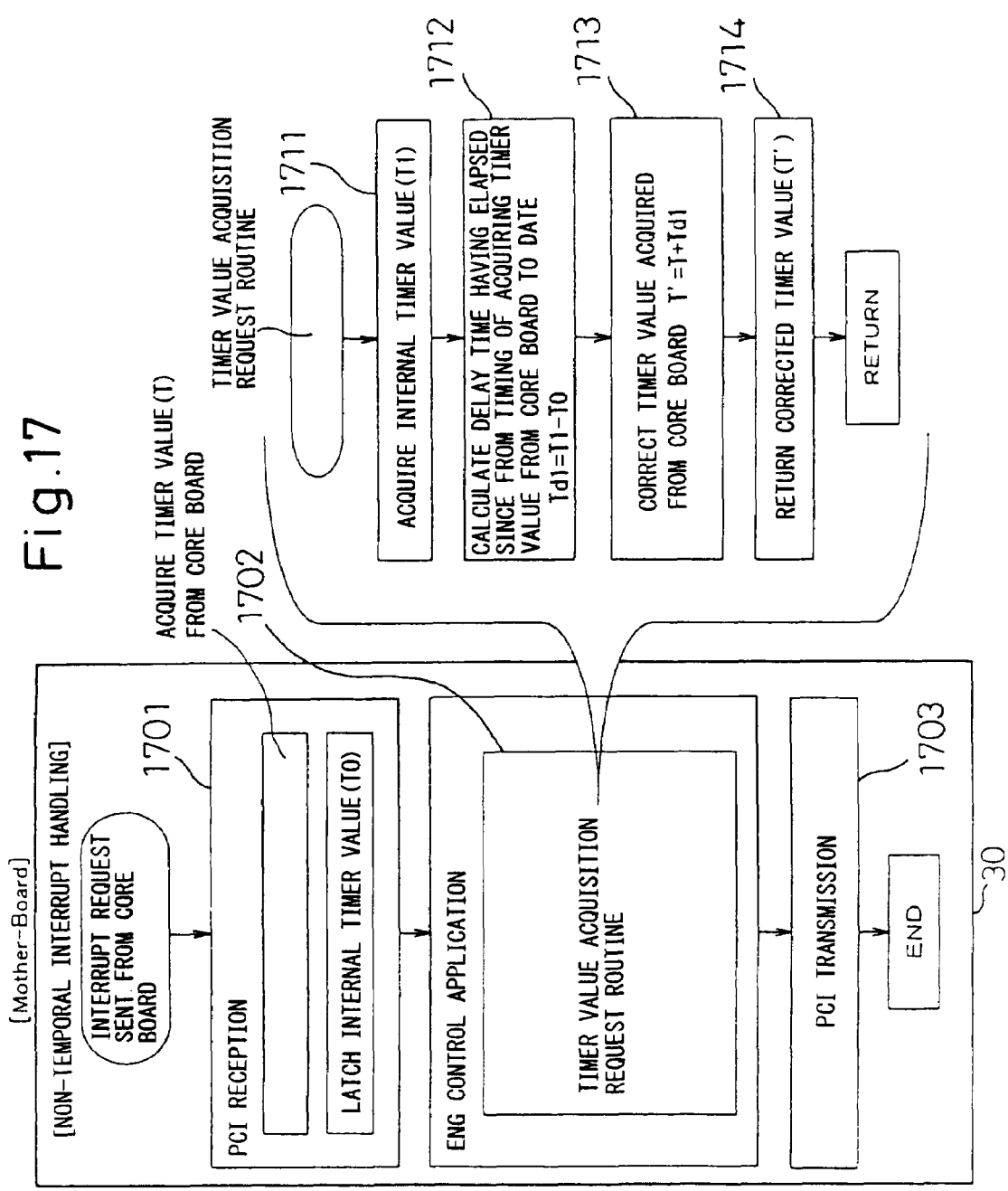

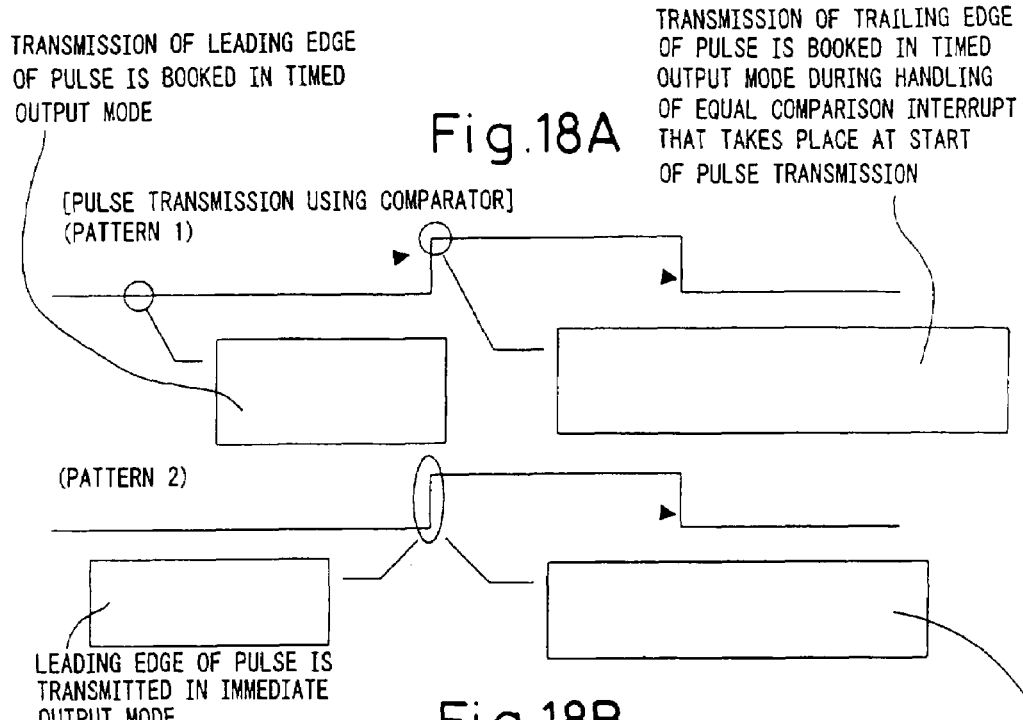
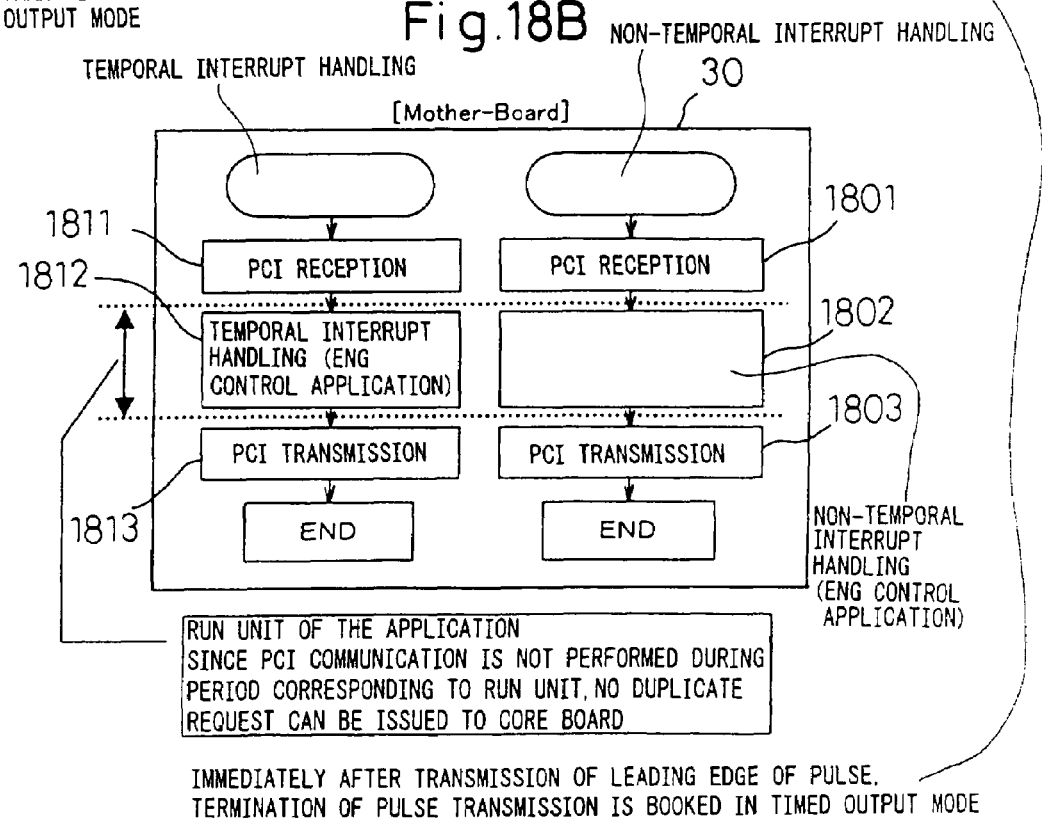

Fig.19A

[PATTERN FOR REQUESTING PULSE TRANSMISSION WITHIN SINGLE RUN UNIT]

| | DESCRIPTION | COMPARATIVE INTERRUPT EVENT NEEDED |
|---|---|---|
| PATTERN 1 | TIMED OUTPUT | |
| PATTERN 2 | IMMEDIATE OUTPUT → TIMED OUTPUT | |
| PATTERN 3 | IMMEDIATE OUTPUT | — |

COMPARATIVE INTERRUPT EVENT NEEDED

Fig.19B

DATA FORMAT FOR PULSE TRANSMISSION REQUEST
(FOR EACH CHANNEL ON WHICH DATA TO BE COMPARED IS TRANSMITTED)

| Tout | TMREQ | TMLVL | IMMREQ | IMMLVL | ADJ |
|---|---|---|---|---|---|

- Tout: TRANSMISSION BOOKING TIME INSTANT (FOR TIMED OUTPUT) FIELD
- TMREQ: TIMED-OUTPUT TRANSMISSION REQUEST FIELD
- TMLVL: TIMED-OUTPUT TRANSMISSION LEVEL FIELD
- IMMREQ: IMMEDIATE-OUTPUT TRANSMISSION REQUEST FIELD
- IMMLVL: IMMEDIATE-OUTPUT TRANSMISSION LEVEL FIELD
- ADJ: FIELD INDICATING WHETHER CORRECTION IS NEEDED

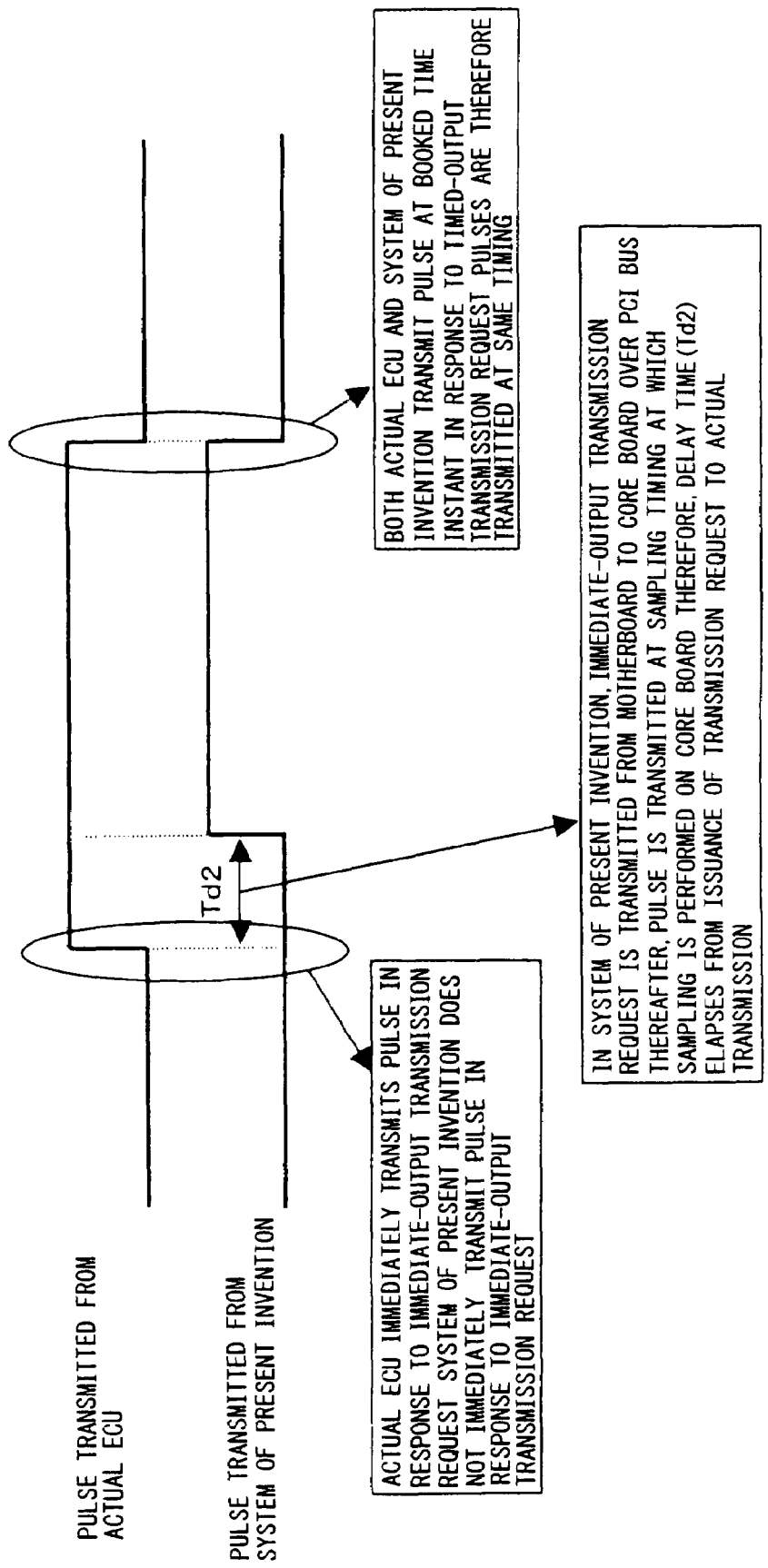

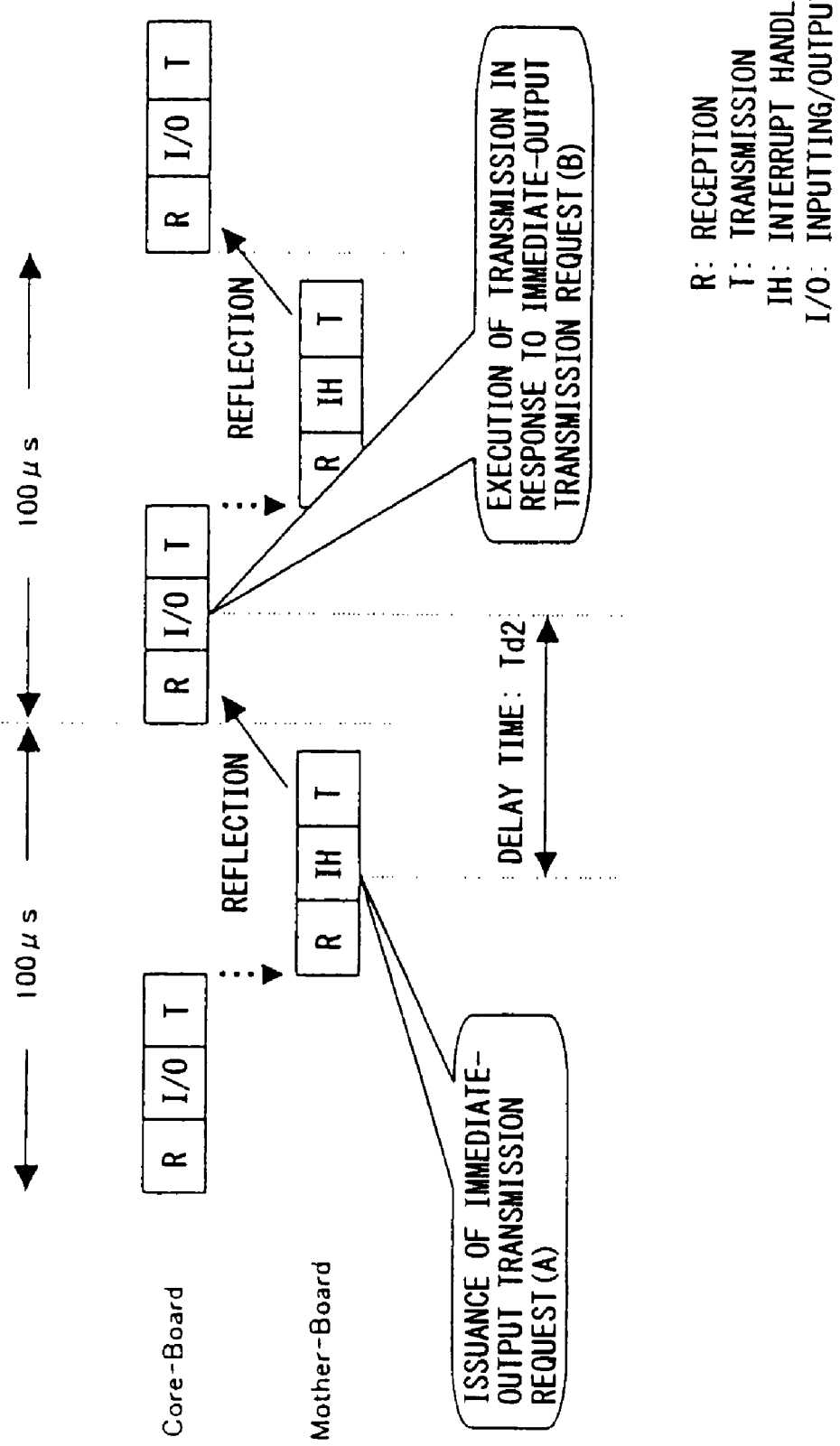

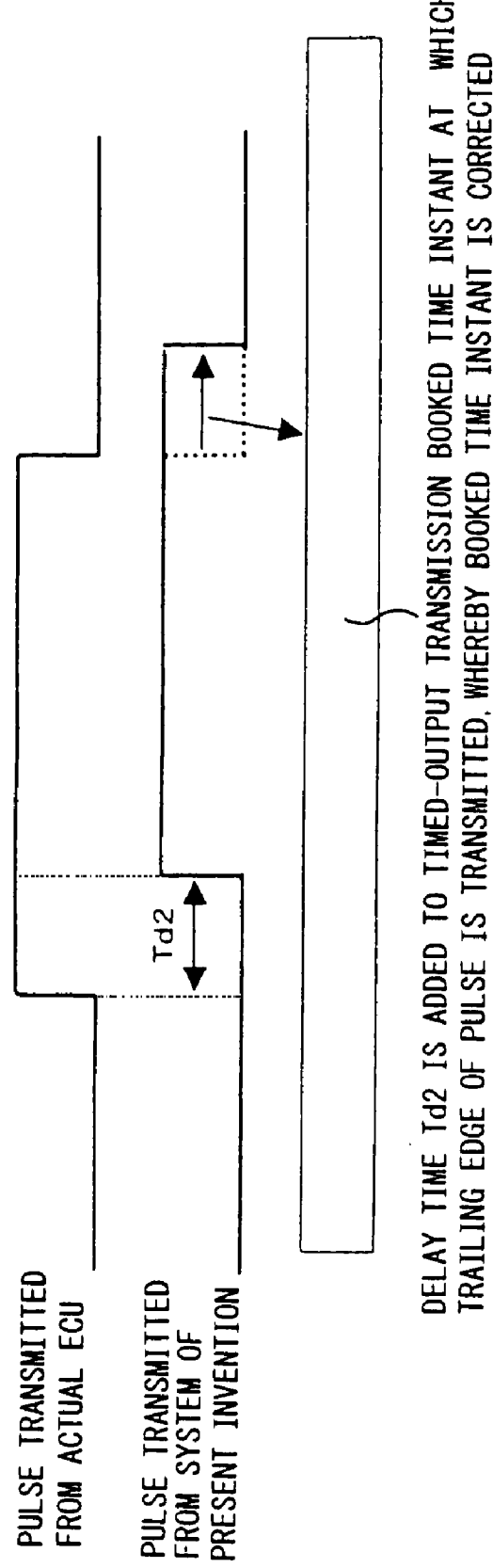

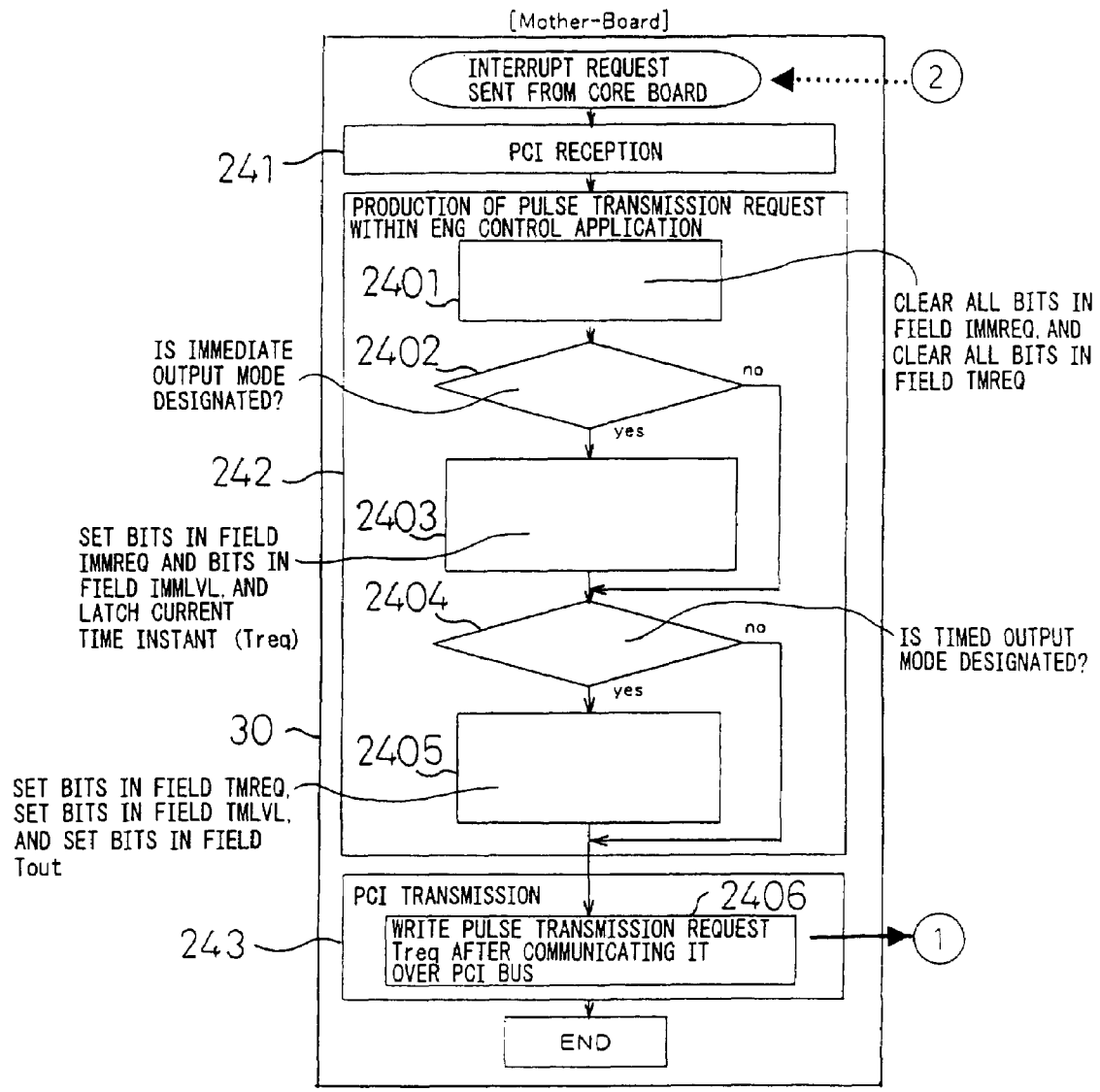

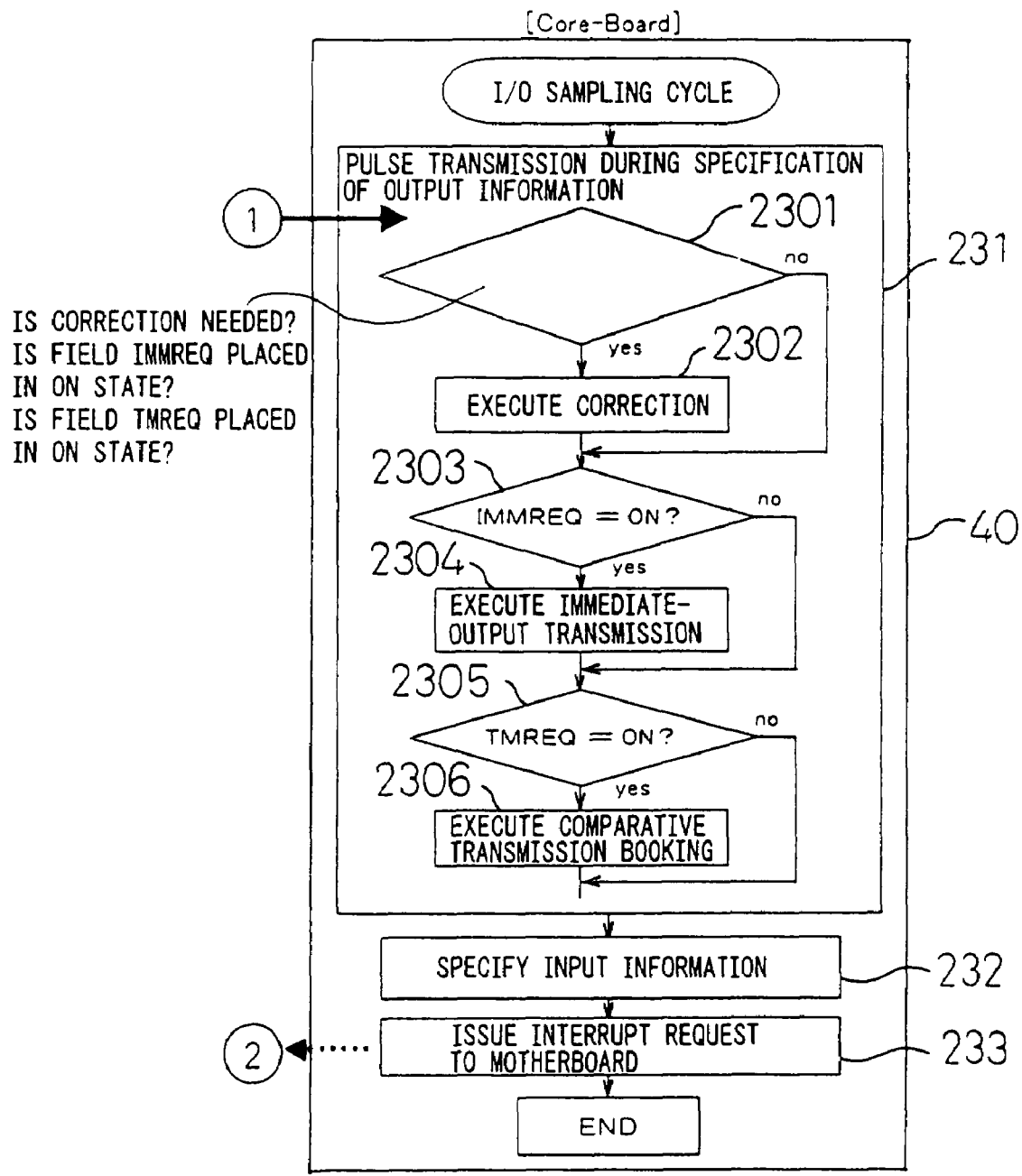

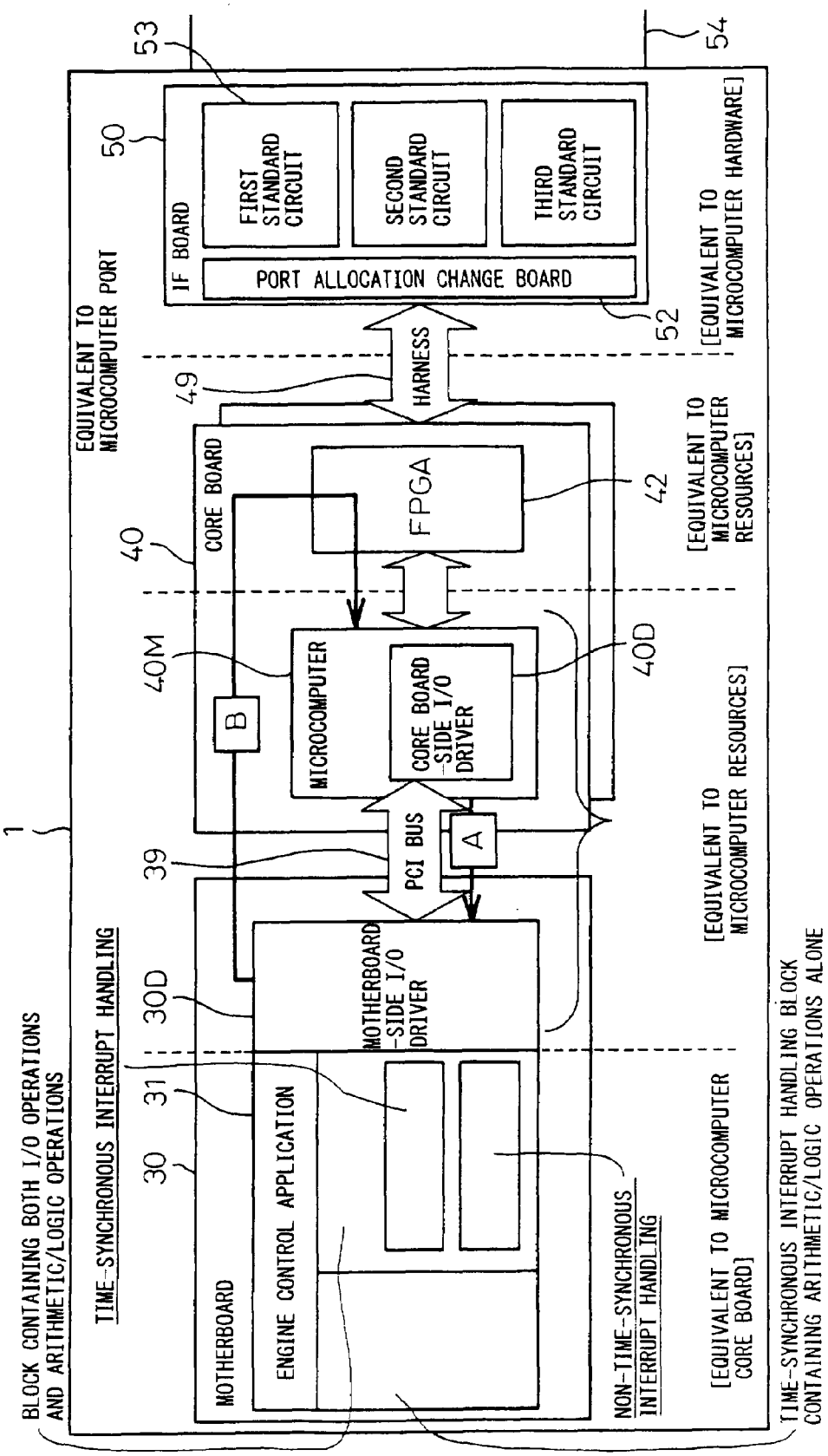

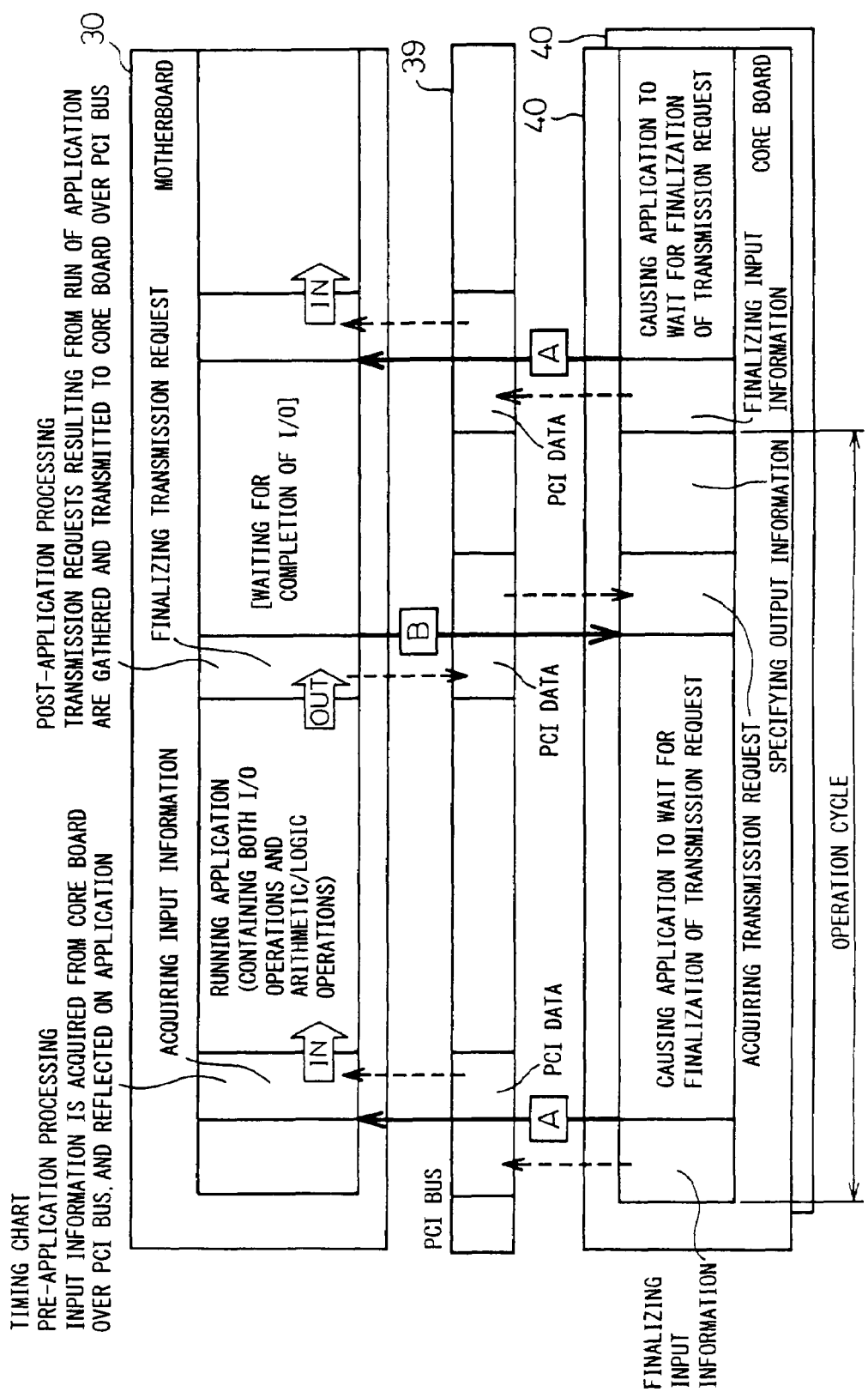

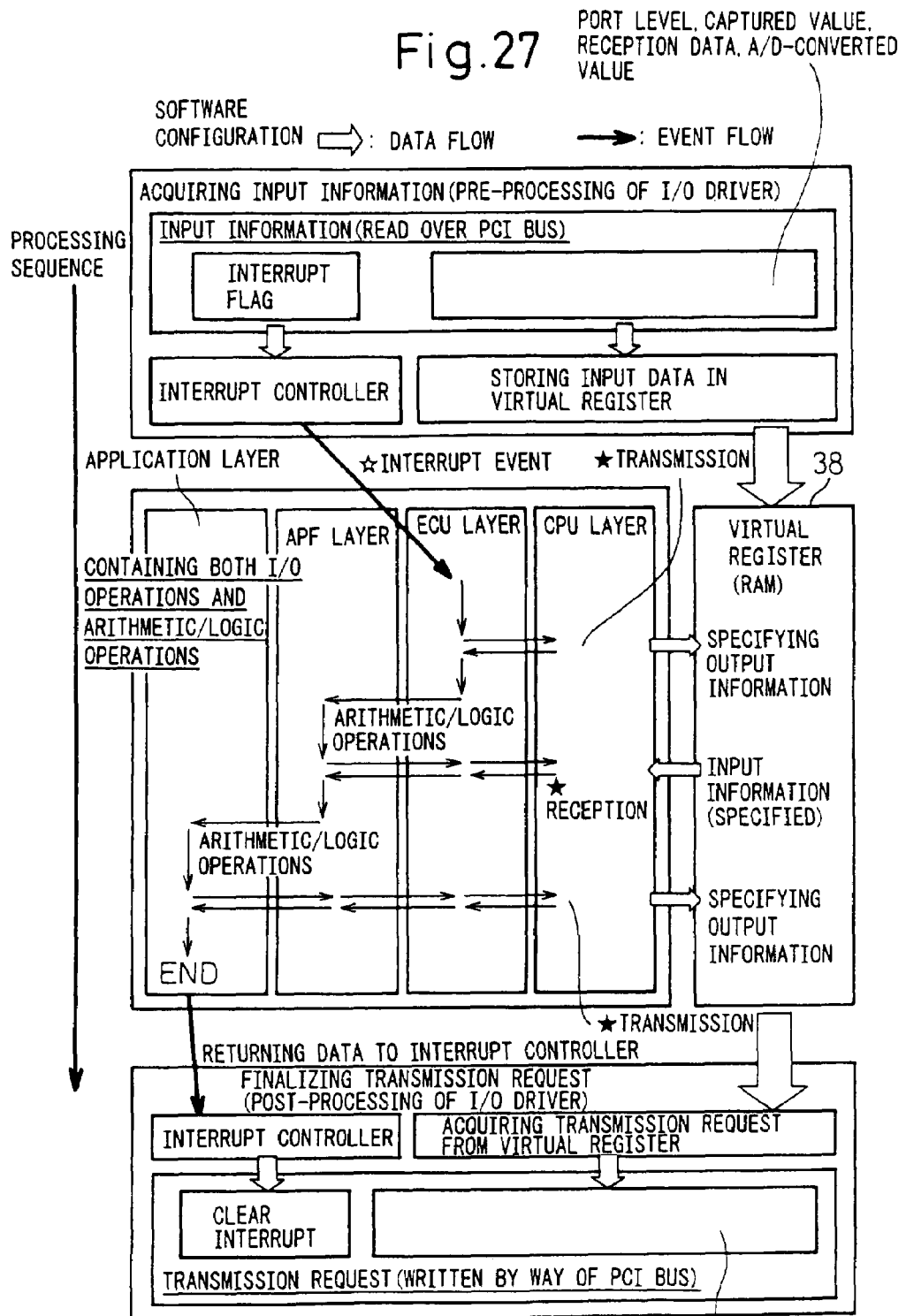

Fig.28

| NESTING LEVEL | | DESCRIPTION |
|---|---|---|
| PROCESSING CONTAINING BOTH I/O OPERATIONS AND ARITHMETIC/ LOGIC OPERATIONS | TIME-SYNCHRONOUS INTERRUPT HANDLING 1 | PERFORMED AT REGULAR INTERVALS (DOES NOT DEPEND ON EXTERNAL STATE) CONTAINING I/O OPERATIONS |
| | NON-TIME- SYNCHRONOUS INTERRUPT HANDLING | PERFORMED SYNCHRONOUSLY WITH EVENT WHOSE INFORMATION IS DETECTED FROM EXTERNAL STATE SUCH AS RECEPTION OF ENGINE SPEED SIGNAL OR VEHICLE SPEED SIGNAL, INJECTION TIMING, OR IGNITION TIMING CONTAINING I/O OPERATIONS |
| | TIME-SYNCHRONOUS INTERRUPT HANDLING 2 | PERFORMED AT REGULAR INTERVALS (DOES NOT DEPEND ON EXTERNAL STATE) CONTAINING ARITHMETIC/LOGIC OPERATIONS ALONE BUT NOT I/O OPERATIONS |

PROCESSING CONTAINING ARITHMETIC/LOGIC OPERATIONS ALONE

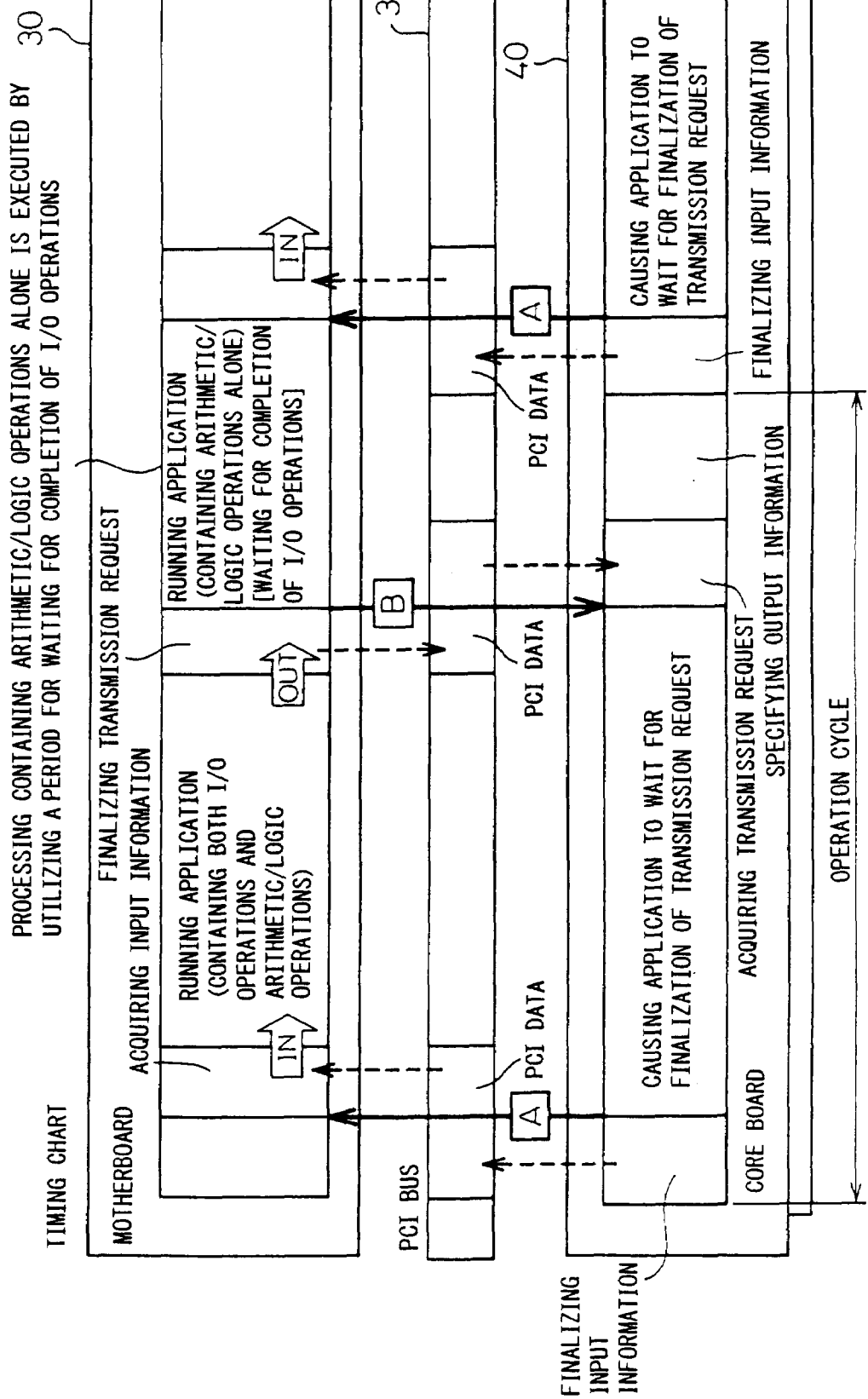

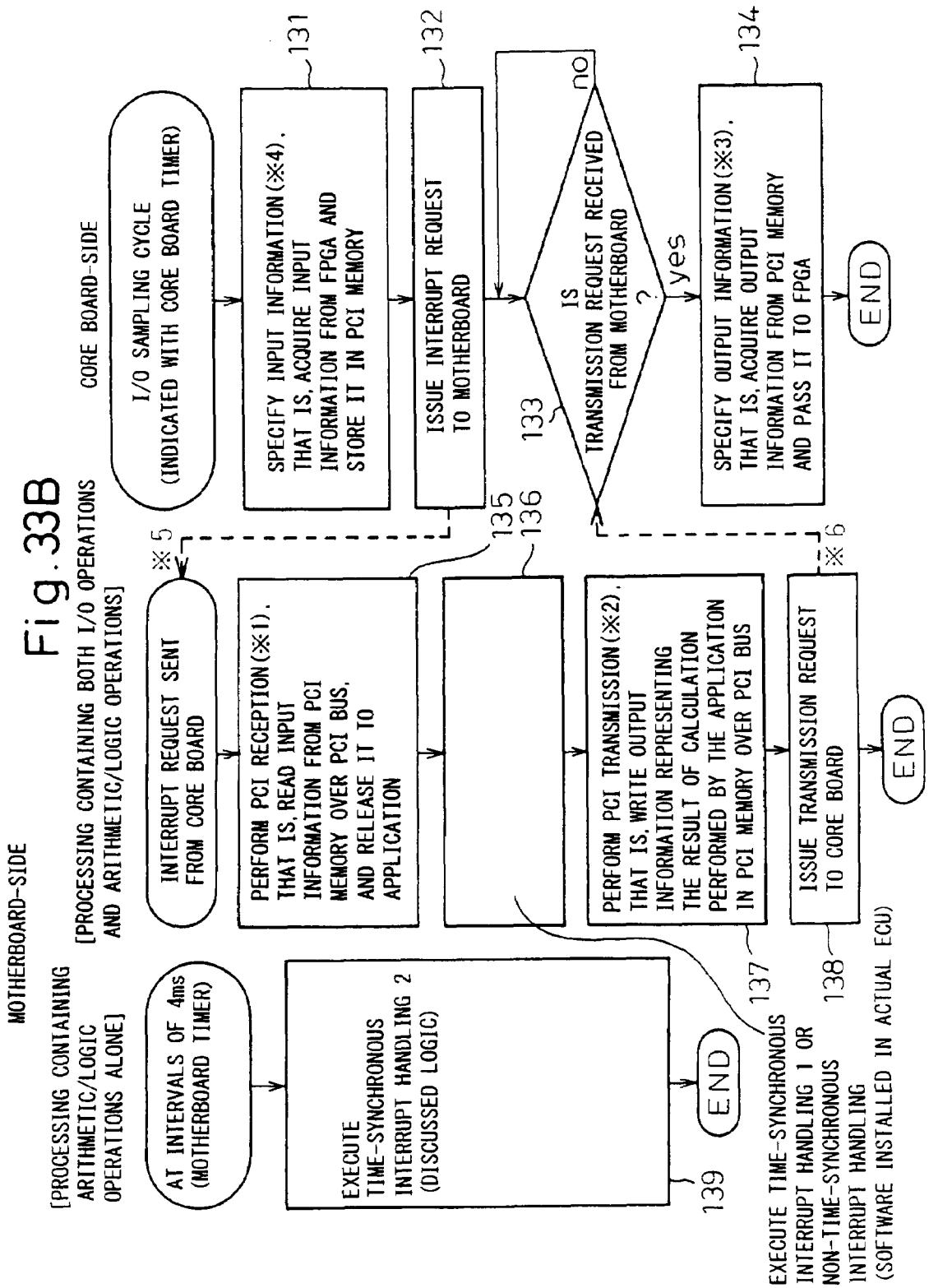

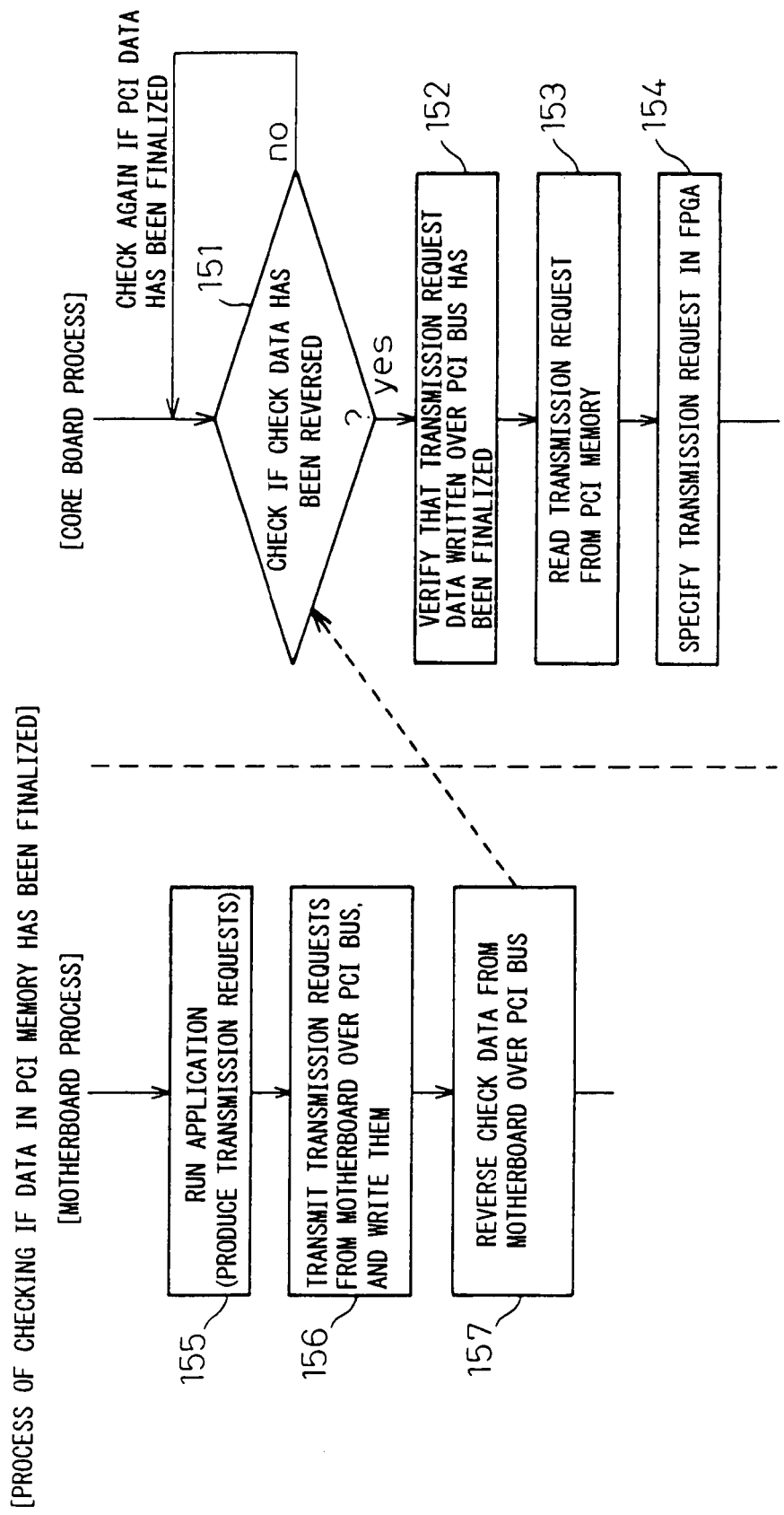

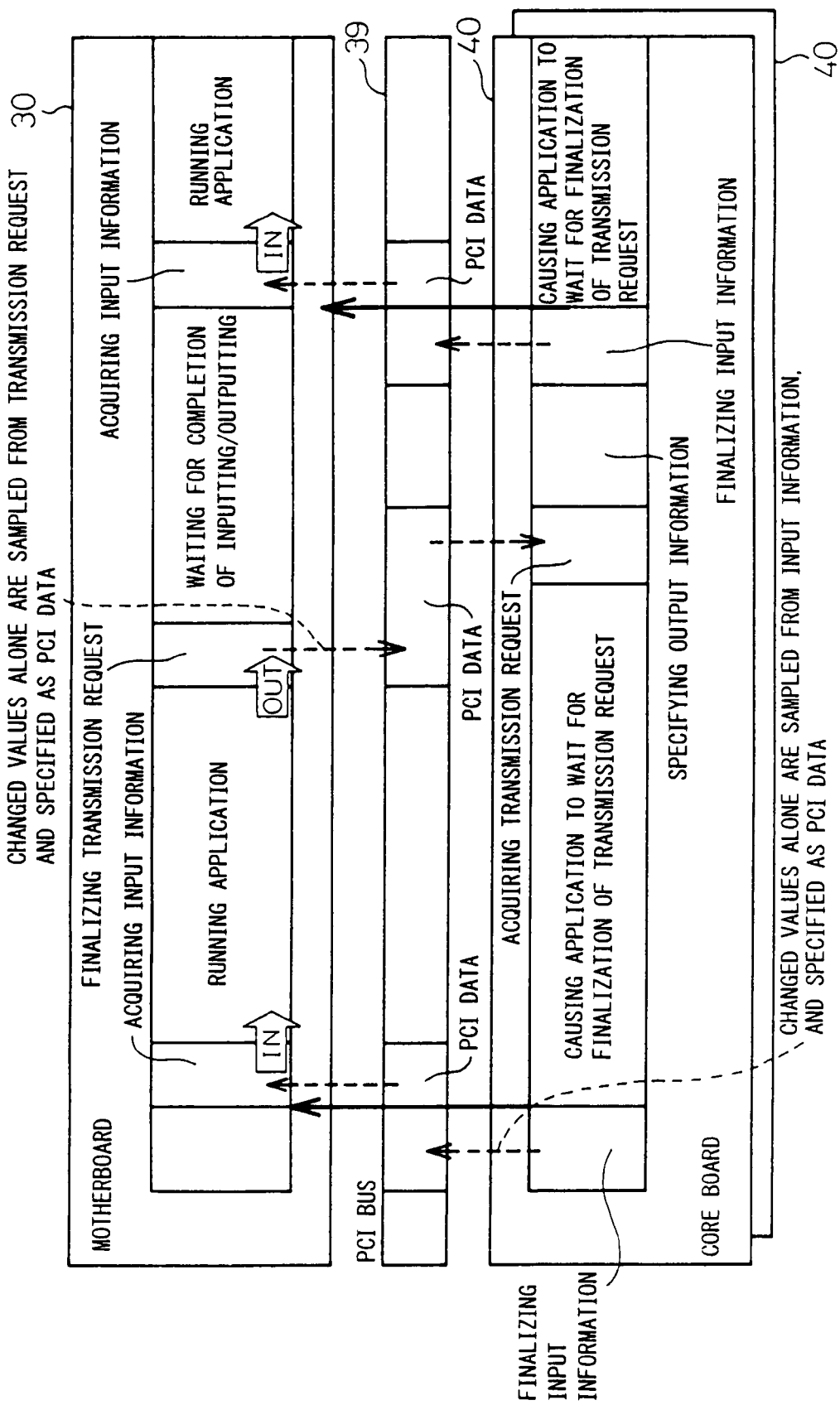

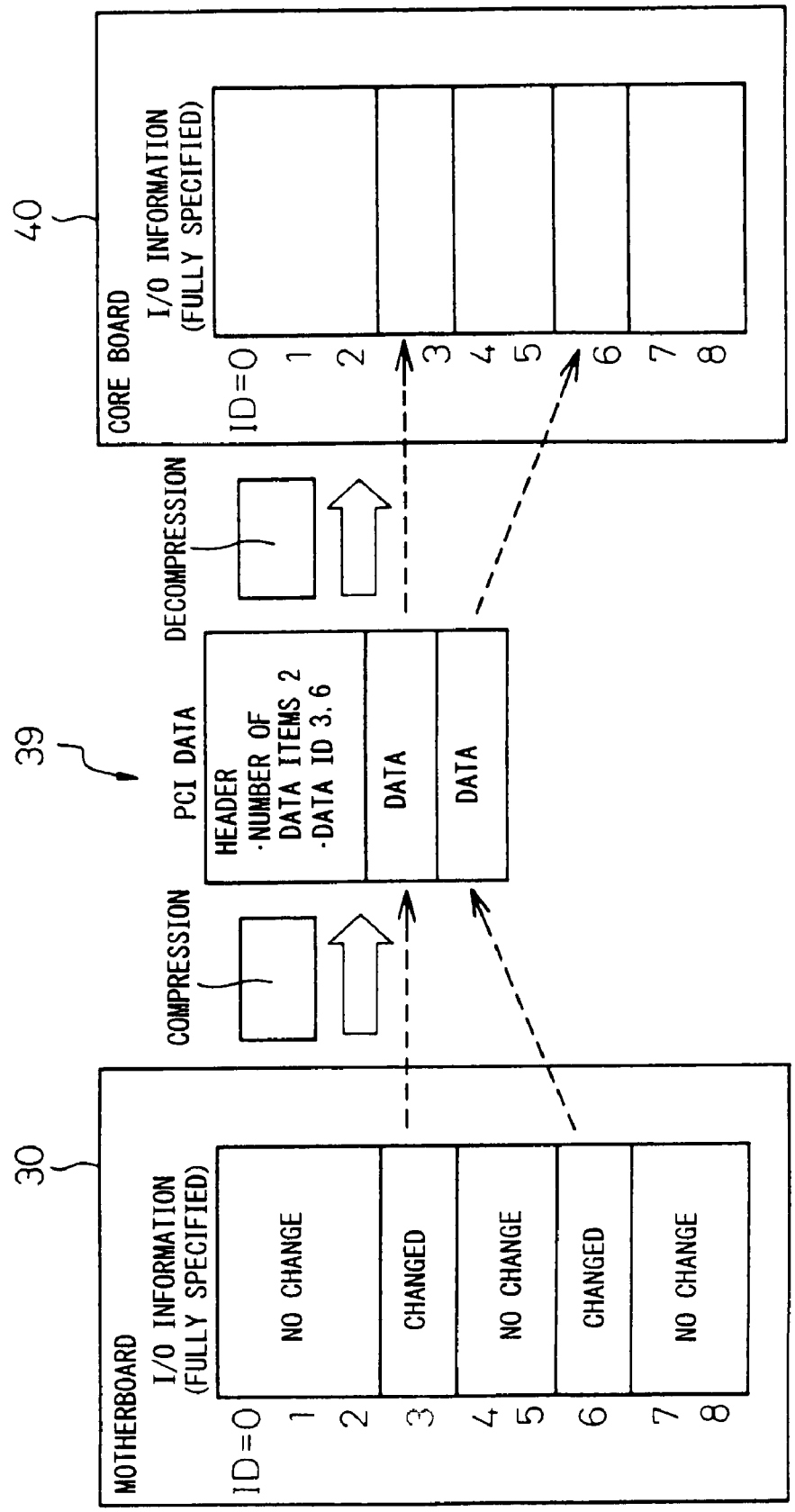

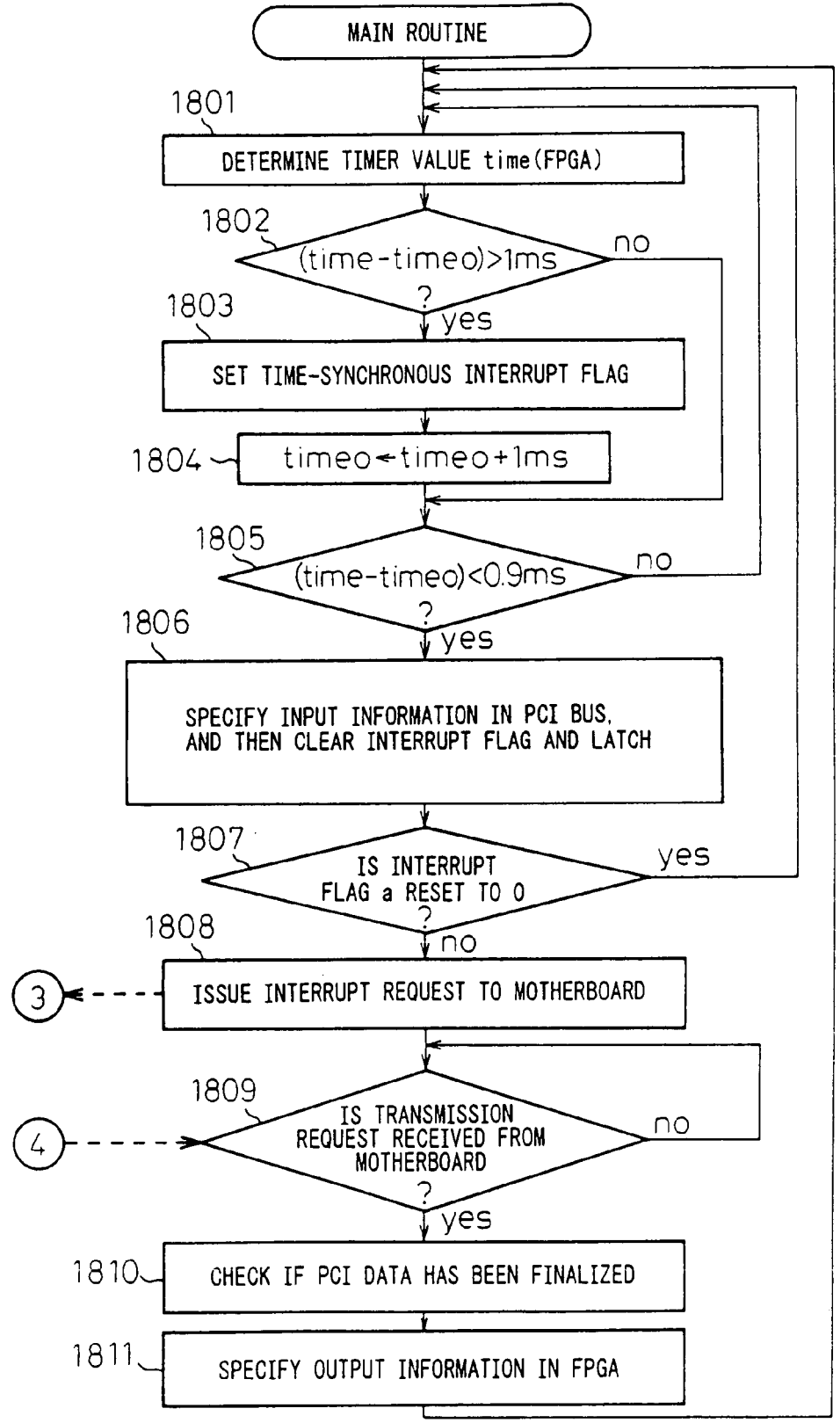

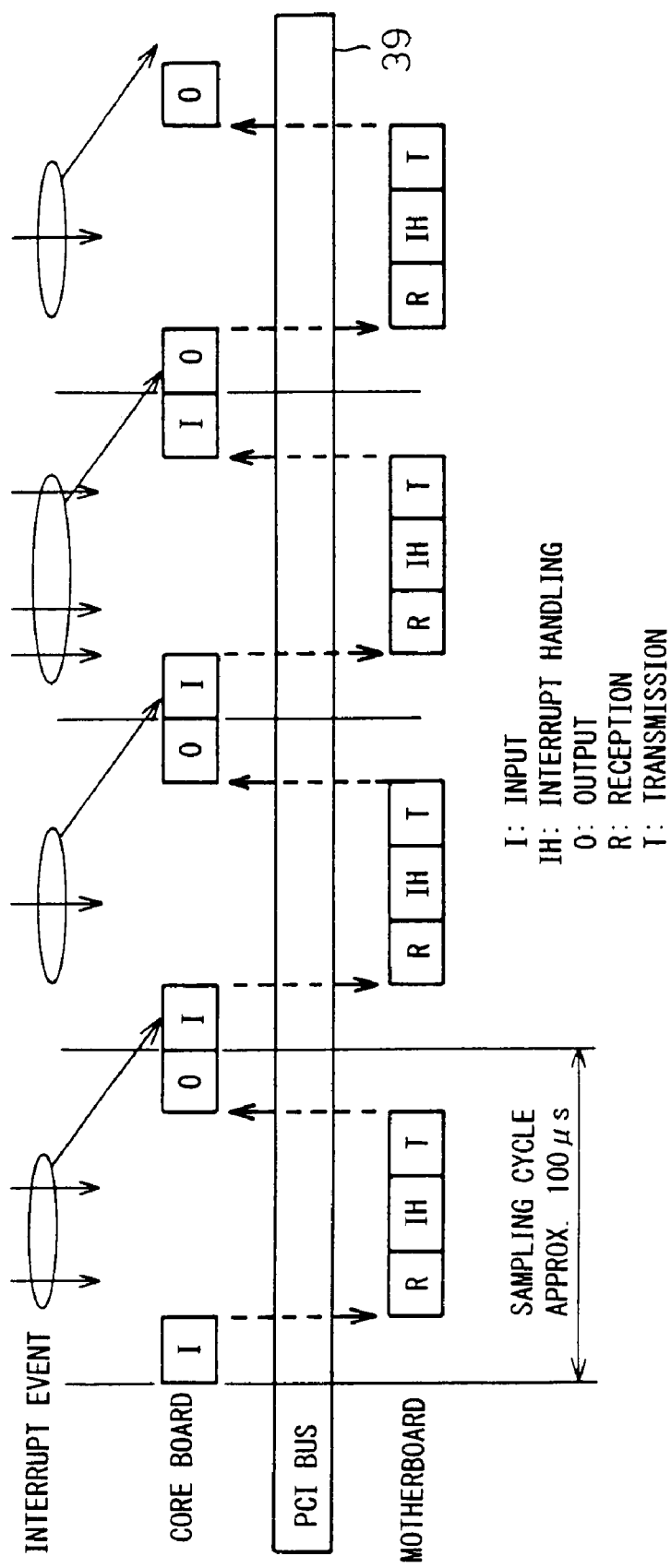

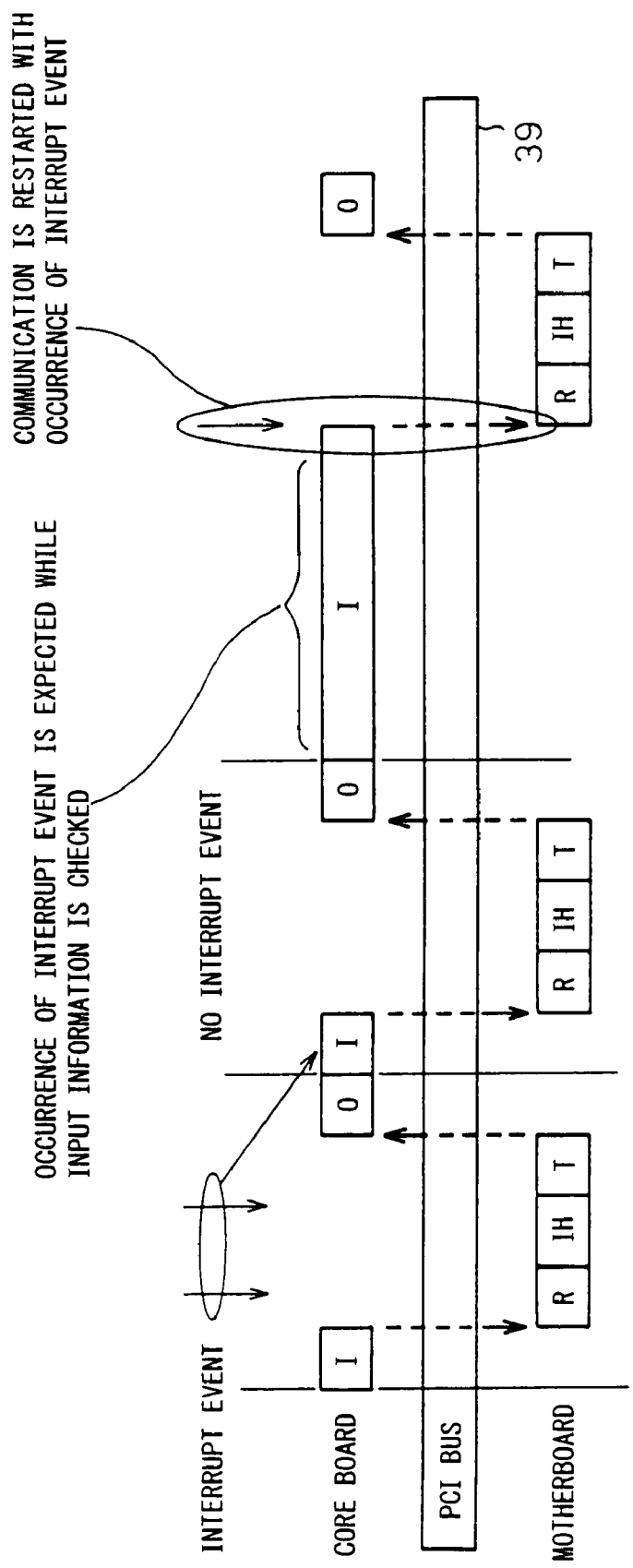

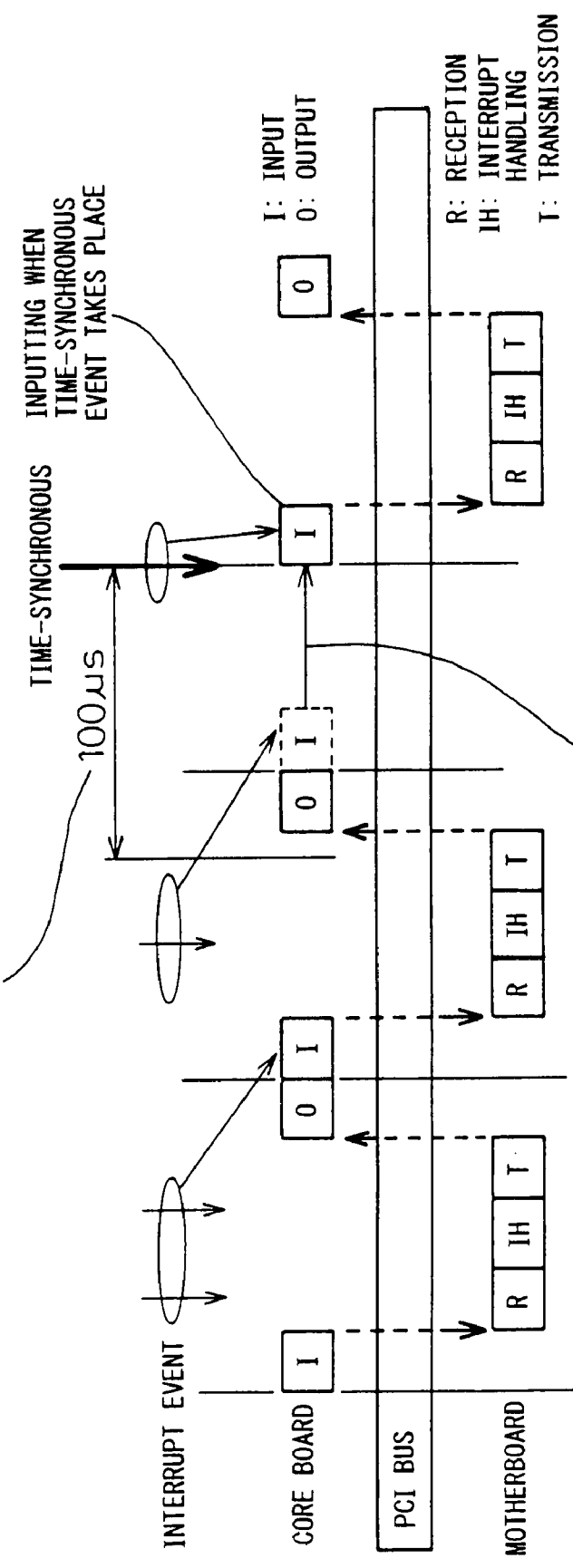

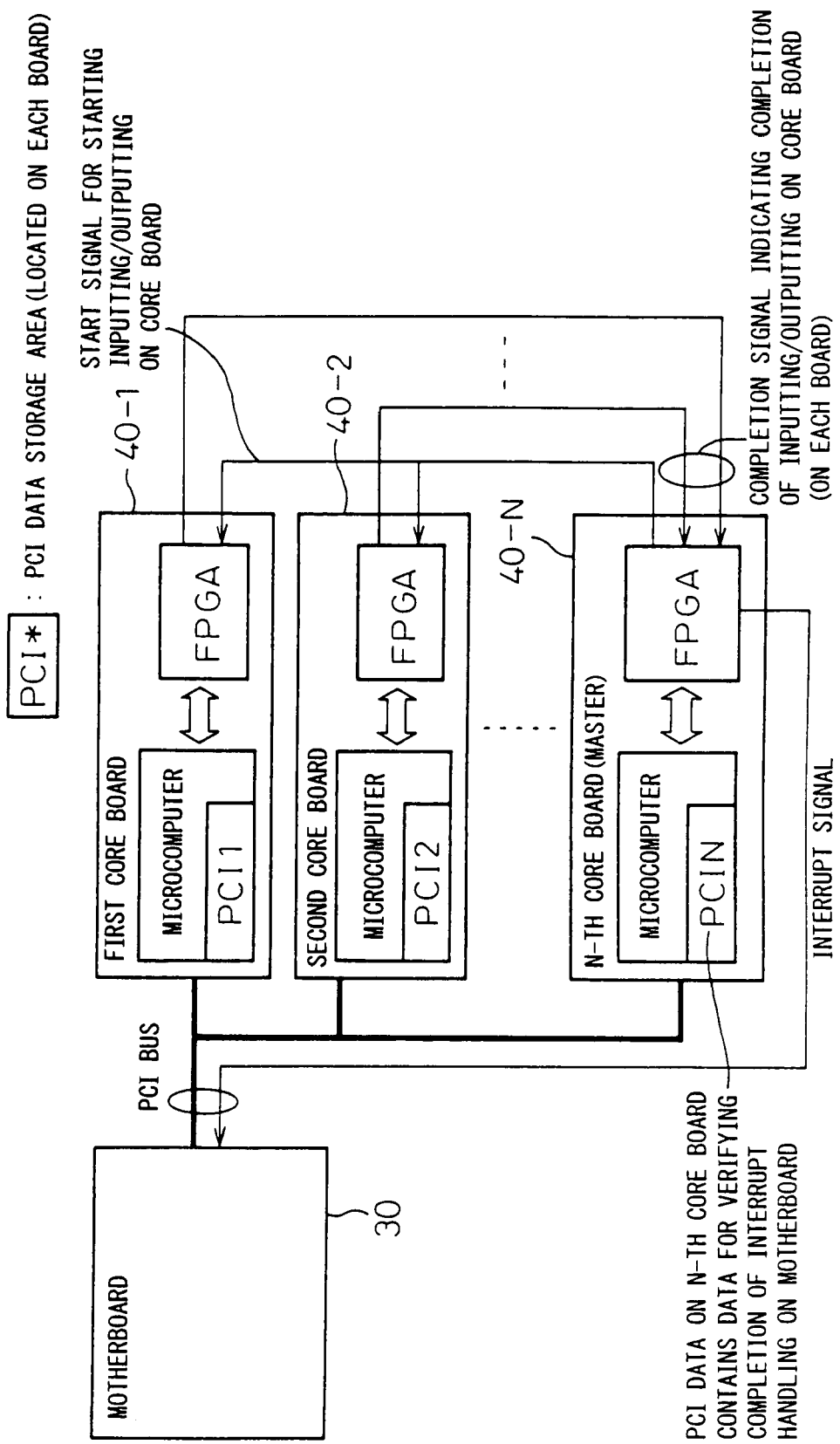

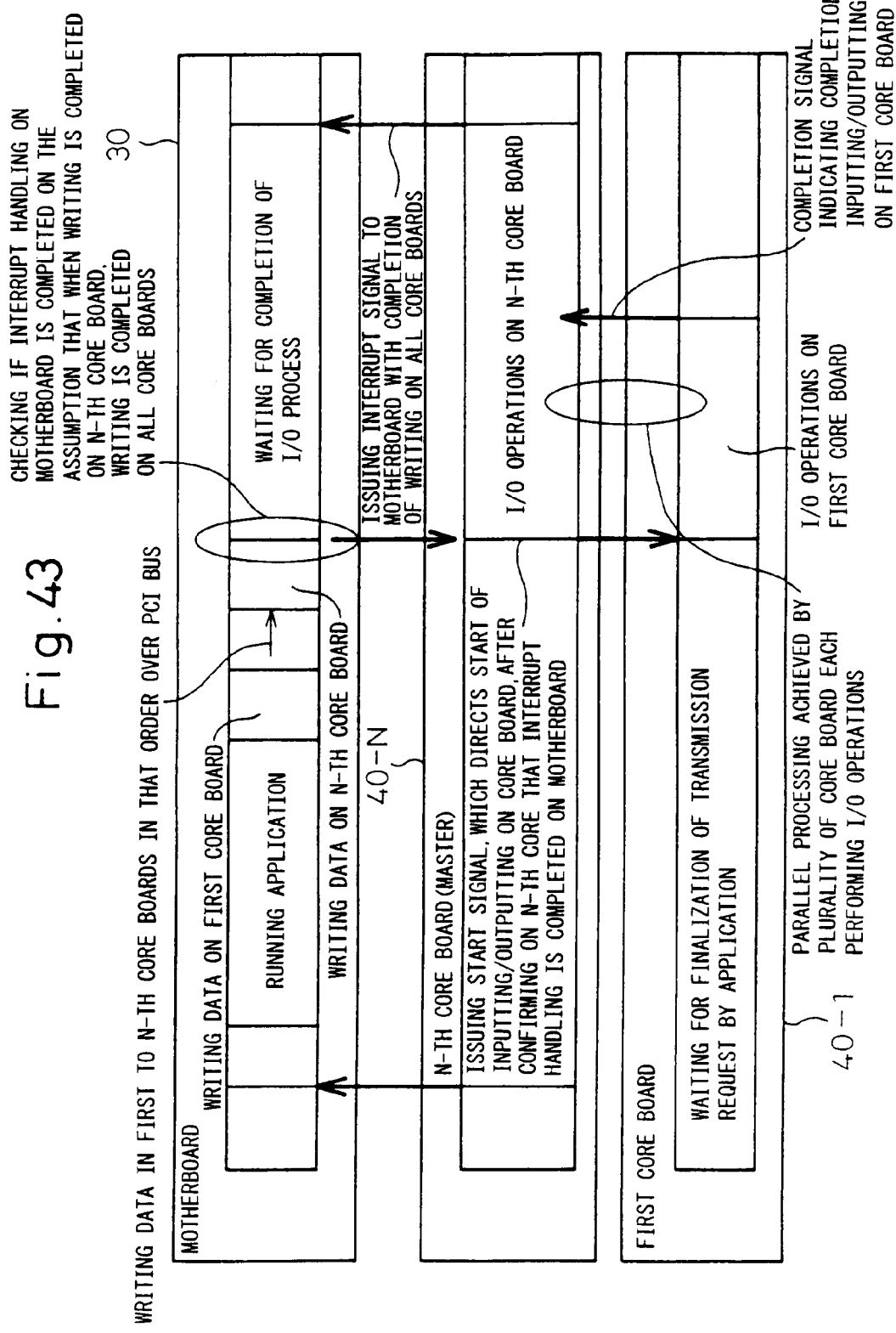

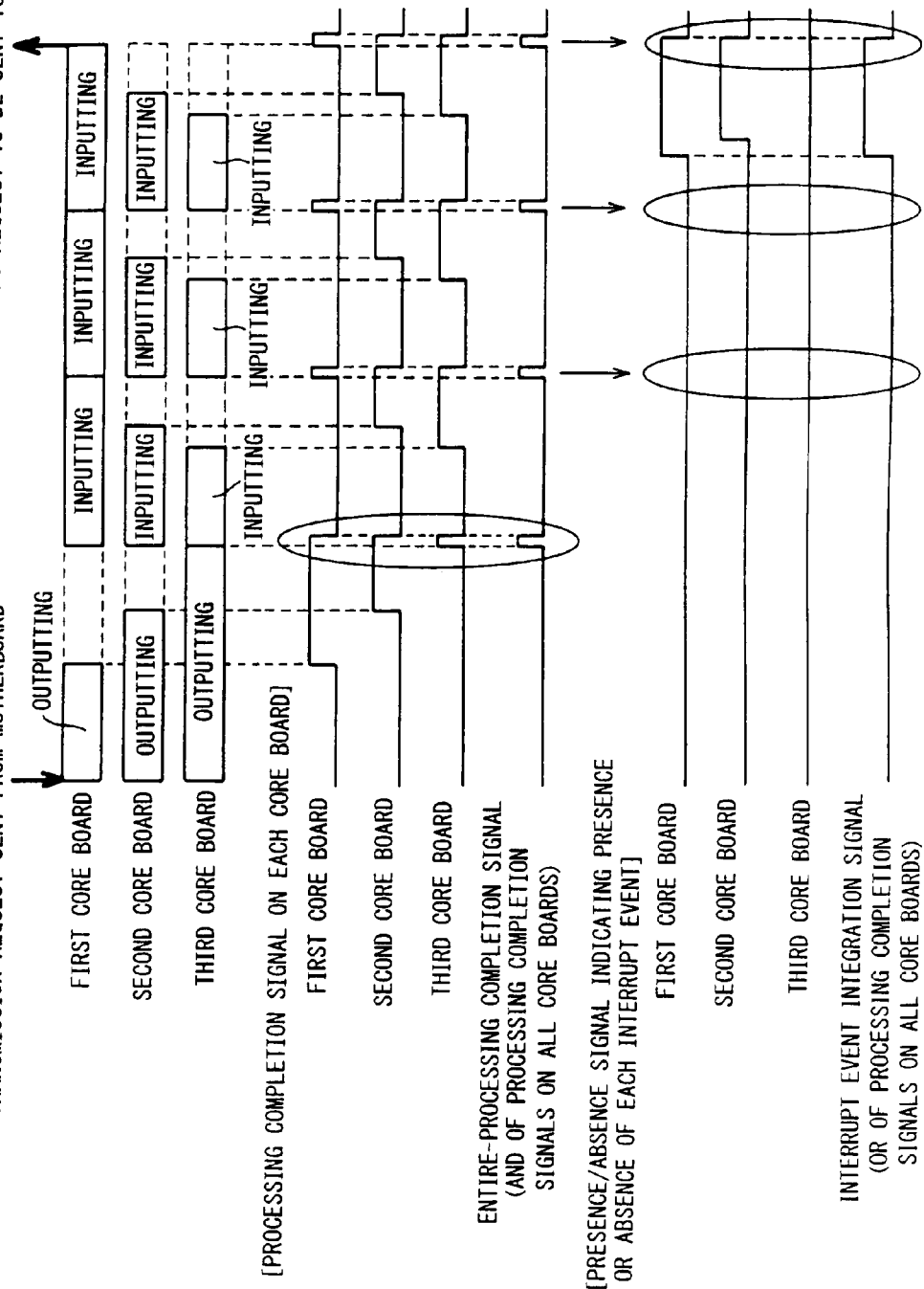

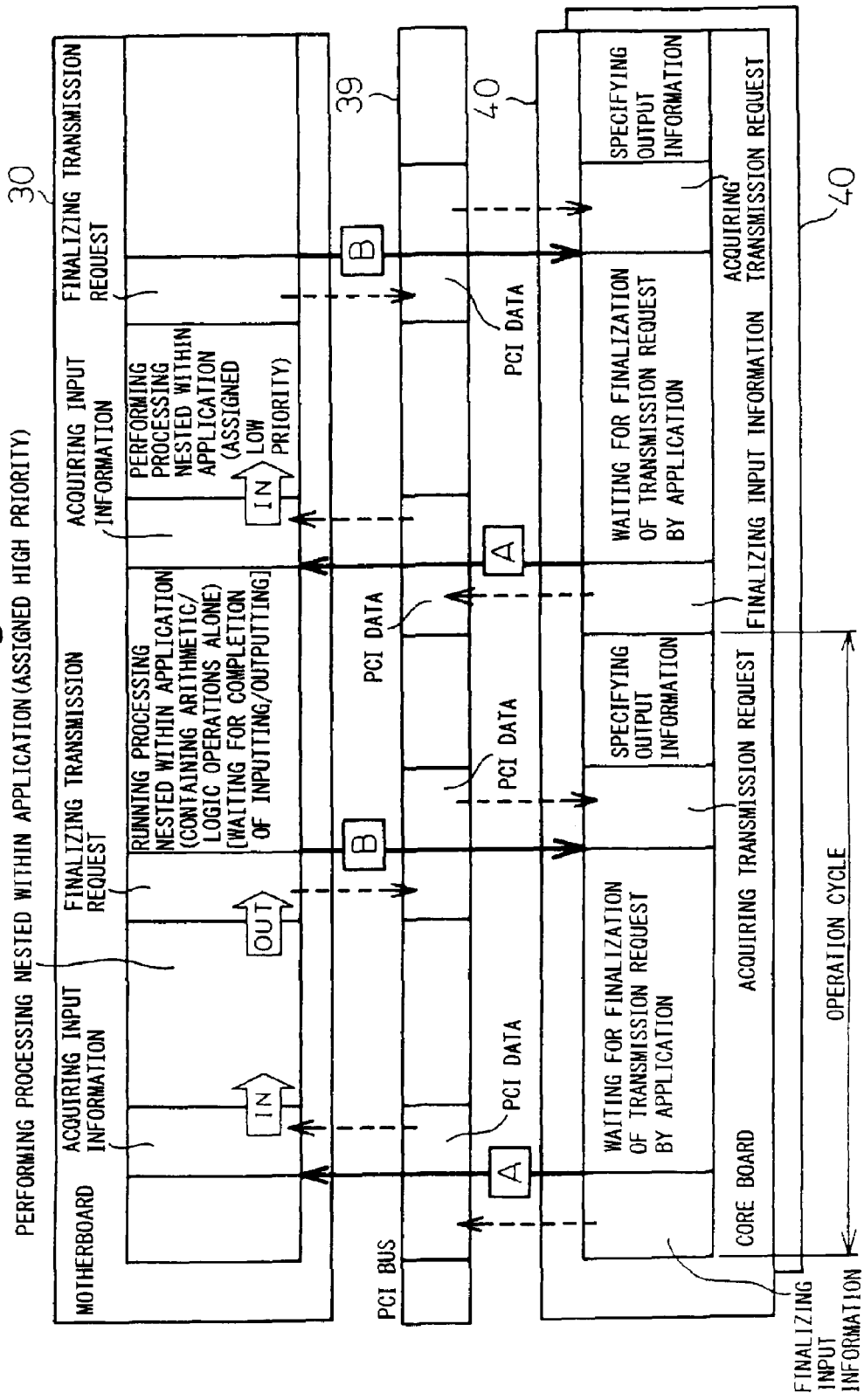

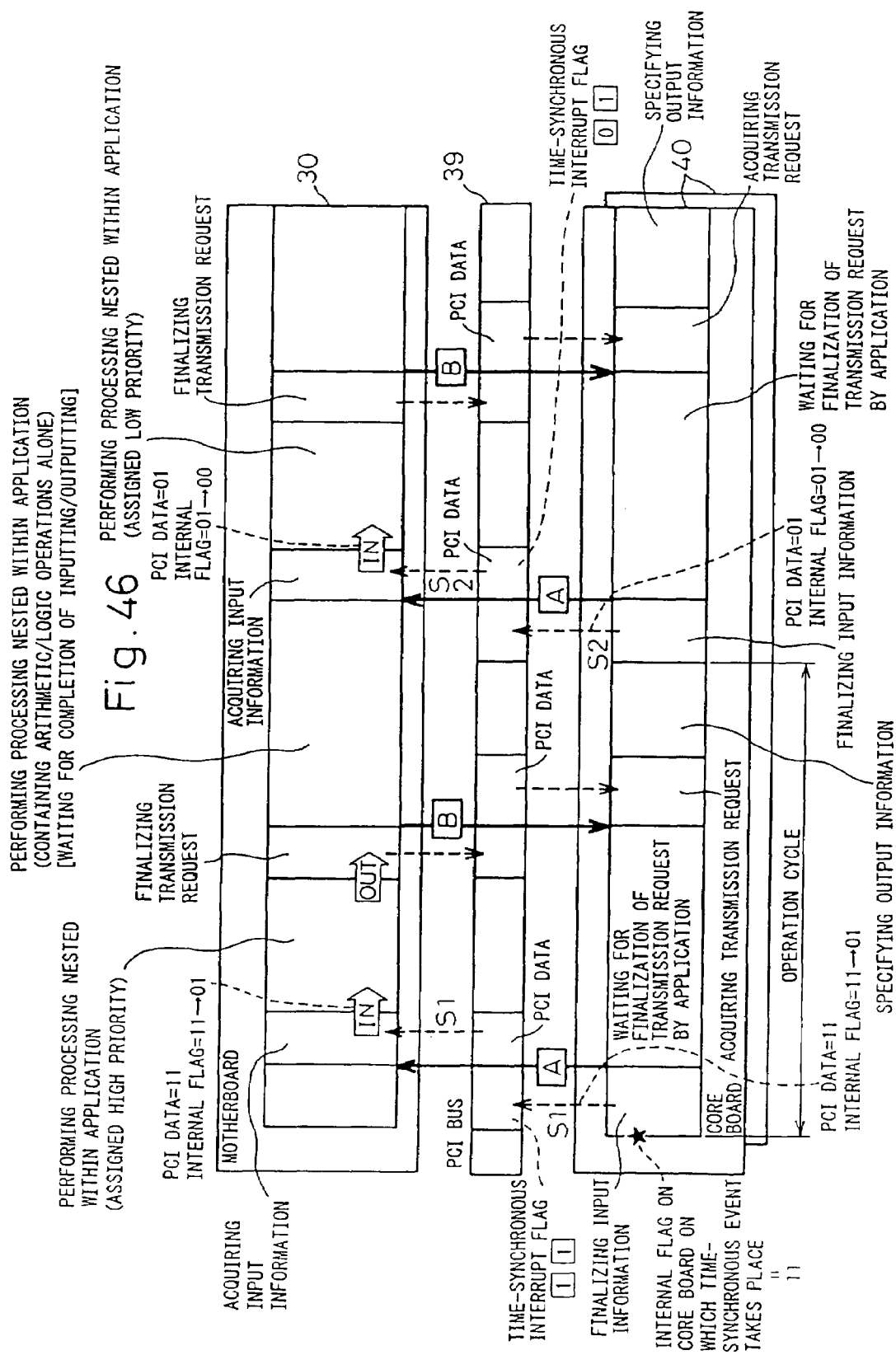

MICROCOMPUTER LOGIC DEVELOPMENT SYSTEM

CROSS-REFERENCE TO RELATED APPLICATION(S)

This application is a continuation of U.S. patent application Ser. No. 10/631,620 filed on Jul. 30, 2003 (now U.S. Pat. No. 7,283,946), which is a continuation of PCT/JP02/12563, filed on Nov. 29, 2002, which claims the priority of Japanese Patent Application No. 2001-367496, filed on Nov. 30, 2001, and Japanese Patent Application No. 2002-167711, filed on Jun. 7, 2002, the contents being incorporated herein by reference.

BACKGROUND OF THE INVENTION

1. Field of the Invention

The present invention relates to a microcomputer logic development system. More particularly, the present invention is concerned with a system for developing a logic to be implemented in a built-in microcomputer that is used while being incorporated in an electronic control unit.

2. Description of the Related Art

The control of electronically controlled equipment, for example, the control of an engine by an electronic control unit (ECU), must be adjusted year by year in order to comply with regulations, including emission regulations or to improve the performance of the ECU along with improvement in the performance of a microcomputer. At present, new logic is developed prior to the improvement in the performance of the existing ECU. This preceding logic often targets the new generation of microcomputers expected to enjoy improved performance. Moreover, a new-generation microcomputer enjoying improved performance is selected based on the performance required to implement the preceding logic.

However, an ECU in which a new-generation microcomputer enjoying improved performance is unavailable in practice. The preceding logic is therefore often developed using the logic implemented in an existing microcomputer as a base.

However, when an ECU having an existing microcomputer incorporated therein is used to develop the preceding logic, problems described below arise.

(1) The throughput of a CPU included in the microcomputer is insufficient.

(2) The storage capacity of a memory included in the microcomputer is small.

(3) The number of peripheral resources is too small.

(4) It takes much time to develop and manufacture a new-generation ECU.

Due to the above problems, development of a new-generation microcomputer is delayed. This hinders the development of new electronically controlled equipment to be controlled by an ECU in which the new-generation microcomputer is incorporated.

A built-in microcomputer that is incorporated in an existing electronic control unit and has the performance of a CPU and the capability of the peripheral equipment is selected based on the specifications optimal for an existing system to minimize the cost of the electronic control unit. Moreover, as the CPU and microcomputer peripheral resources are encased in one package, the capabilities of the CPU and peripheral resources cannot be modified independently of one another unless the microcomputer is modified. Moreover, for the development of logic to be implemented in the built-in microcomputer, a CPU whose throughput is large enough to implement the preceding logic must be provided, and the same assortment of microcomputer peripheral resources as the one to be included in a preceding system must be provided. Moreover, every time a new microcomputer is developed, an ECU must be manufactured in line with the microcomputer.

SUMMARY OF THE INVENTION

Accordingly, one embodiment of the present invention provides a microcomputer logic development system that solves the foregoing problems underlying the development of a preceding logic. Herein, the microcomputer logic development system has a CPU whose throughput is large enough to implement the preceding logic, and includes the same assortment of microcomputer peripheral resources as the one to be included in a preceding system. Moreover, the microcomputer logic development system permits short-term development of a built-in microcomputer having the preceding logic implemented therein. Furthermore, the microcomputer logic development system can be repeatedly reused.

The system for developing a preceding logic is realized by replacing a built-in microcomputer, which is incorporated in an existing electronic control unit, with an external high-performance microcomputer.

Moreover, an ECU serving as a microcomputer logic development system generally comprises a motherboard that accommodates a facility serving as a CPU that is included in a microcomputer, a core board that accommodates facilities serving as an input/output resource included in the microcomputer, and an interface board that accommodates hardware facilities. The motherboard and core board are connected to each other over a PCI (peripheral component interconnect) bus, and communicate input/output information to each other. The performance of each board is determined by the performances of components mounted on the board. Whether the performances of the boards can be efficiently drawn out as the performance of the microcomputer logic development system itself depends largely on a transmission speed at which input/output information is communicated between the motherboard and core board, and the throughputs of the motherboard and core board.

On the other hand, for example, when an electronic control unit is a high-performance engine control system, the drawbacks described below are known to arise.

(1) Abnormal input/output data greatly affects the engine control system.

(2) The number of processing steps required to induce input/output operations at strict timings increases to result in an increase in processing time.

(3) The number of arithmetic/logic operations that treat a large amount of data increases.

Accordingly, one embodiment of the present invention provides a microcomputer logic development system adaptable to a higher-performance engine control system. Specifically, the microcomputer logic development system can realize reliable communication of input/output information between a motherboard and a core board, raise a transmission speed at which the input/output information is communicated, and improve the throughput of both the motherboard and core board.

A microcomputer logic development system in accordance with one embodiment of the present invention is a system for developing logic to be implemented in a built-in microcomputer that is used while being incorporated in an electronic control unit. The microcomputer logic development system comprises a center block, a peripheral block, and an interface bus. The center block includes: a first central processing unit that deals with logic; a first memory in which data including a program that implements logic is stored; a first interface via which the center block communicates with the outside; and a first internal bus over which the first central processing unit, first memory, and first interface are interconnected. The peripheral block includes: one or more resources that simulate by software the peripheral devices of a microcomputer; a second interface via which the peripheral block communicates with the outside; and a second internal bus over which the resources and second interface are interconnected. The center block and peripheral block are interconnected over the interface bus. The center block, peripheral block, and interface bus are substituted for a built-in microcomputer in order to implement the logic.

According to one embodiment, a temporal interrupt handling application for temporal interrupt handling at regular intervals and a non-temporal interrupt handling application for non-temporal interrupt handling responsive to a predetermined event that is irrespective of time, is stored in the first memory. The first central processing unit includes a virtual interrupt controller that performs both temporal interrupt handling and non-temporal interrupt handling. Communication software that transmits or receives at least data and interrupt event information over the interface bus is installed in the first interface. A second central processing unit uses a second memory and the second interface to transfer an interrupt event and data by way of the first interface and interface bus. The resources include input facilities and output facilities.

According to one embodiment, a second memory has a common memory connected on the interface bus. The resources transmit or receive data to or from the temporal interrupt handling application and non-temporal interrupt handling application, which are stored in the first memory, via the common memory and interface bus.

According to one embodiment, the common memory has a communication synchronization counter. The communication synchronization counter is used to synchronize transmission and reception of data between the resources and the non-temporal interrupt handling application.

According to one embodiment, the timing for activating the resources is not fixed based on a predetermined sampling cycle but is determined arbitrarily. The termination of the non-temporal interrupt handling application by the center block is regarded as a next timing for activating the resources.

According to one embodiment, if the time elapsed from the timing for activating the resources, to the termination of the non-temporal interrupt handling application in the center block exceeds a predetermined verification time, the resources are forcibly activated.

According to one embodiment, an interrupt event occurring in the resources is transmitted to the center block over the interface bus in order to run the non-temporal interrupt handling application. The termination of the non-temporal interrupt handling application is regarded as the next timing for activating the resources.

According to one embodiment, the non-temporal interrupt handling application determines the priorities of interrupt events that may take place in the resources. The non-temporal interrupt handling application handles the interrupt events, which are transmitted to the center block over the interface bus, according to the priorities assigned to the interrupt events.

According to one embodiment, when no interrupt event takes place in the resources, transmission of information to the center block over the interface bus is omitted.

According to one embodiment, when a timer value acquisition request is issued during the non-temporal interrupt handling, a timer value acquired over the interface bus is corrected with a timer value by a first timer included in the center block.

According to one embodiment, the center block, peripheral block, and interface circuit block may be realized with general-purpose circuit boards. Moreover, the microcomputer logic development system in accordance with one embodiment of the present invention can be effectively adapted to a microcomputer designed to control an internal combustion engine.

According to the microcomputer logic development systems of the various embodiments of the present invention, problems underlying the development of the logic to be implemented in a microcomputer are solved. A CPU offering throughput large enough to implement a novel or new-generation logic can be provided. Moreover, the same assortment of microcomputer peripheral resources as the one to be included in a novel or new-generation system can be provided. This enables short-term development of a built-in microcomputer in which the novel or new-generation logic can be implemented. Moreover, the microcomputer logic development system in accordance with the embodiments of the present invention can be repeatedly reused for development of a logic. This contributes to reduction in the cost of development.

BRIEF DESCRIPTION OF THE DRAWINGS

The foregoing and other objects, features, and advantages of the present invention will be described in relation to examples shown in the following appended drawings:

FIG. 5A is a block diagram showing a countermeasure to be taken, in the conventional ECU, against an increase in a number of inputs;

FIG. 14A is an explanatory diagram concerning a process of causing or clearing an interrupt event that is detected on a core board included in the microcomputer logic development system in accordance with the present invention;

FIG. 14B is a flowchart describing a process for controlling an interrupt event occurring in a microcomputer logic development system in accordance with an embodiment of the present invention;

FIG. 15A and FIG. 15B are flowcharts describing an interrupt handling procedure adapted to the interrupt event control method described in conjunction with FIG. 14A and FIG. 14B in a case where priorities are assigned to interrupt events;

FIG. 17 is a flowchart describing an interrupt handling process that uses a timer mounted on a motherboard included in a microcomputer logic development system in accordance with an embodiment of present invention;

FIG. 18A shows two waveforms to present two patterns employed in a pulse transmission process that uses a comparator included in a microcomputer logic development system in accordance with an embodiment of the present invention;

FIG. 18B is a flowchart describing a procedure to be followed on a motherboard according to a pulse transmission process that uses a comparator included in a microcomputer logic development system in accordance with an embodiment of the present invention;

FIG. 19A lists combinations of pulse transmission request patterns that are realized with the use of a comparator included in a microcomputer logic development system in accordance with an embodiment of the present invention;

FIG. 19B is a data format adopted for a pulse transmission request;

FIG. 21 is an explanatory diagram concerning a process for correcting a pulse transmission that is performed in response to a pulse transmission request issued using a comparator included in a microcomputer logic development system in accordance with an embodiment of the present invention;

FIG. 22 is a timing chart describing an embodiment of a process for correcting pulse transmission that is performed in response to a pulse transmission request issued using a comparator included in a microcomputer logic development system in accordance with an embodiment of the present invention;

FIG. 23 shows corrected waveforms;

FIG. 24A and FIG. 24B are flowcharts describing a variant of a process for correcting pulse transmission that is performed in response to a pulse transmission request issued using the comparator included in the microcomputer logic development system in accordance with the present invention;

FIG. 25 shows software configurations of a motherboard and core board included in a microcomputer logic development system in accordance with an embodiment of the present invention, and a hardware configuration of an interface board included therein;

FIG. 26 is a timing chart presenting a running process of software that contains both input/output operations and arithmetic/logic operations;

FIG. 27 shows the components of the software described in FIG. 26, that is, acquisition of input information on the motherboard, pieces of processing nested within the application, and issuance of a transmission request;

FIG. 28 lists the processing that contains both input/output operations and arithmetic/logic operations in comparison with a processing that contains arithmetic/logic operations alone;

FIG. 29 is a timing chart presenting a process for executing a processing containing arithmetic/logic operations alone by utilizing an input/output completion wait time created in a process for running the software that contains both input/output operations, which involve a motherboard and core board included in a microcomputer logic development system in accordance with an embodiment of the present invention, and arithmetic/logic operations;

FIG. 33B is a flowchart describing contents of communication performed over a PCI bus included in microcomputer logic development system in accordance with an embodiment of the present invention;

FIG. 35 is a flowchart describing a procedure for verifying whether data in a PCI memory is finalized which is adapted to the PCI communication process described in conjunction with FIG. 34;

FIG. 36 is an explanatory diagram concerning a process for reducing a load on PCI communication which is adapted to a PCI communication process;

FIG. 37 is an explanatory diagram concerning a method for compressing or decompressing PCI data;

FIG. 38A and FIG. 38B are flowcharts describing synchronization between a motherboard and core board included in a microcomputer logic development system in accordance with an embodiment of the present invention;

FIG. 39 is a timing chart concerning a case where an interrupt event takes place within a period of sampling performed during synchronization between a motherboard and core board included in a microcomputer logic development system in accordance with an embodiment of the present invention;

FIG. 40 is a timing chart concerning a case where occurrence of an interrupt event is discontinued during synchronization between a motherboard and core board included in a microcomputer logic development system in accordance with an embodiment of the present invention;

FIG. 41 is a timing chart concerning a case where a time-synchronous event takes place during synchronization between a motherboard and core board included in a microcomputer logic development system in accordance with an embodiment of the present invention;

FIG. 42 is an explanatory diagram showing a data flow occurring in a case where a motherboard included in a microcomputer logic development system in accordance with an embodiment of the present invention is synchronized with a plurality of core boards;

FIG. 43 is an explanatory diagram concerning a PCI communication process employed in a case where a motherboard included in a microcomputer logic development system in accordance with an embodiment of the present invention is synchronized with a plurality of core boards;

FIG. 44 is a timing chart presenting control using a sync signal employed in synchronization between a motherboard and core board included in a microcomputer logic development system in accordance with an embodiment of the present invention;

FIG. 45A and FIG. 45B are explanatory diagrams concerning a method for dividing an application into portions because a run unit of an application installed in a microcomputer logic development system in accordance with an embodiment of present invention is large;

FIG. 46 is an explanatory diagram concerning an interrupt control process adapted to the division process described in conjunction with FIG. 25.

DETAILED DESCRIPTION OF THE INVENTION

The embodiments of the present invention will be described based on concrete examples in conjunction with the appended drawings. The examples will be described on the assumption that electronically controlled equipment to which the present invention is applied is an electronically controlled internal combustion engine (hereinafter, simply, engine).

Figure 1:
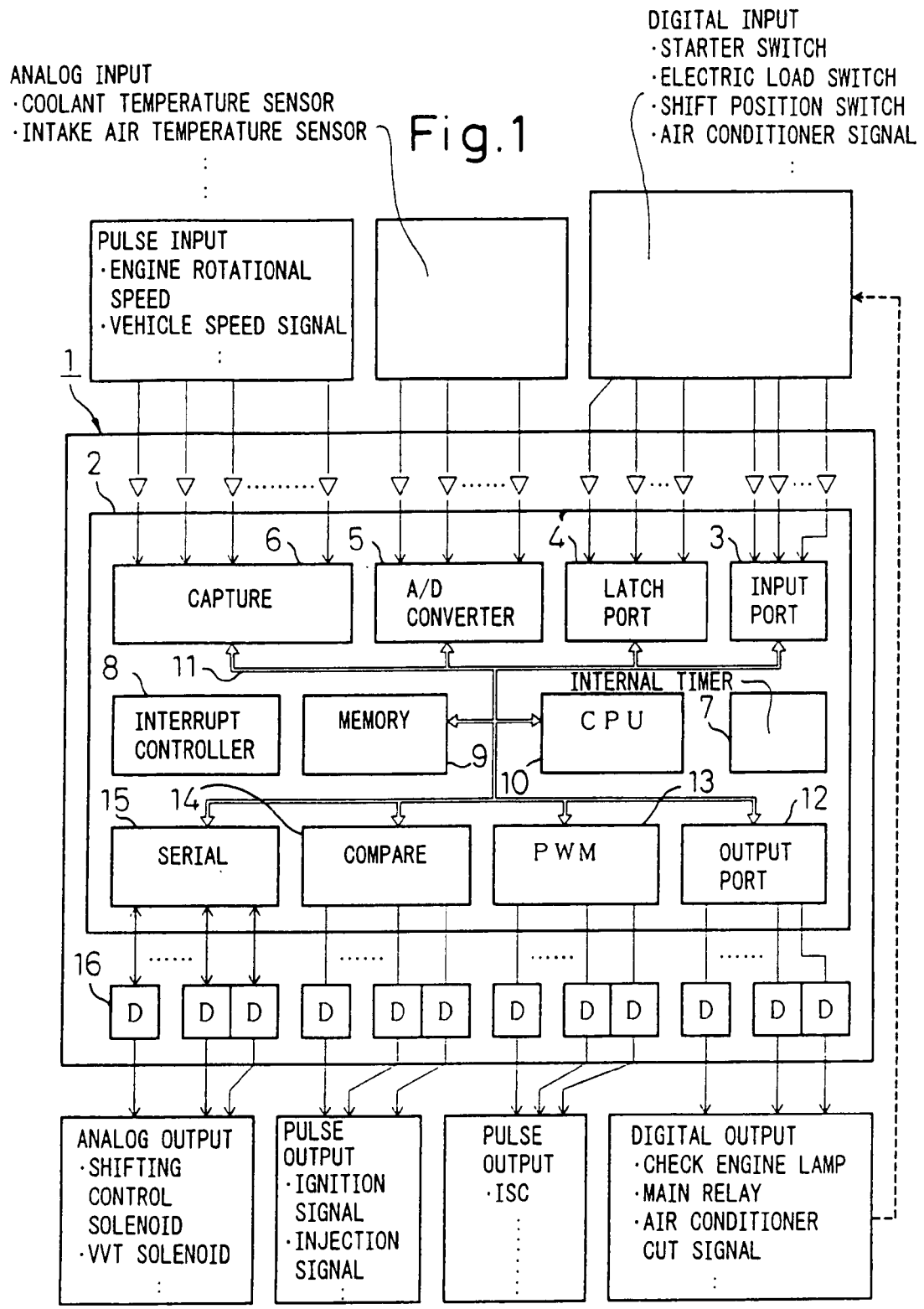
FIG. 1 shows a configuration of an electronically controlled engine control system to show the configuration of an ECU.

FIG. 1 shows a system configuration of an electronic control unit (ECU) included in a conventional electronically controlled engine control system. As far as the electronically controlled engine is concerned, the ECU 1 receives as input signals pulses of an engine speed signal and a vehicle speed signal, analog signals received from a coolant temperature sensor and an intake air temperature sensor, and digital signals received from a starting switch, an electric load switch, a shifting position switch, and an air conditioner. The ECU 1 includes a built-in microcomputer 2 that treats the input signals, and a driver 16 that is an ECU input/output circuit for amplifying and transmitting signals treated by the built-in microcomputer 2. What are transmitted from the ECU 1 include analog signals to be sent to a shift control solenoid and a variable valve timing (VVT) solenoid, pulses of an ignition signal and a fuel injection signal, pulses to be used for idle speed control (ISC), digital signals to be sent to a check engine warning lamp and a main relay, and a digital signal instructing switching off of an air conditioner.

The built-in microcomputer 2 has a memory 9 and a CPU 10 for performing arithmetic/logic operations, and peripheral resources which control, input or output functions, both of which are encased in one package. The peripheral resources include input resources and output resources. FIG. 1 shows as the input resources an input port 3 and a latch port 4 that treat a digital signal, an A/D converter 5 that treats an analog signal, and a capture area 6 that treats pulses. Shown as the output resources are an output port 12 through which a digital signal is transmitted, a pulse width modulator (PWM) 13 and a comparator 14 that transmit pulses, and a serial interface 15 through which an analog signal is transmitted or received. The peripheral resources are connected to the memory 9 and CPU 10 over an internal bus 11. In addition to the peripheral resources, an internal timer 7 and an interrupt controller 8 are included in the built-in microcomputer 2.

In the electronically controlled engine control system, the ECU 1 receives signals, which indicate the driven state of a vehicle, from various sensors and switches. An input circuit included in the ECU 1 treats the input signals and transfers them to the built-in microcomputer 2. The input peripheral resources convert the received signals into CPU values. The memory 9 and CPU 10 that constitute a computing unit detect the state of the vehicle from the input signals, and produce a transmission request signal according to the vehicle state. The output peripheral resources convert the transmission request signal into an output signal. Consequently, the output signal is transmitted from the built-in microcomputer 2. The driver 16 serving as an input/output circuit included in the ECU 1 drives actuators incorporated in the vehicle according to the output signal. The results of output control are reflected, as indicated with a dashed line, on the input signals received from the vehicle.

Figure 2:
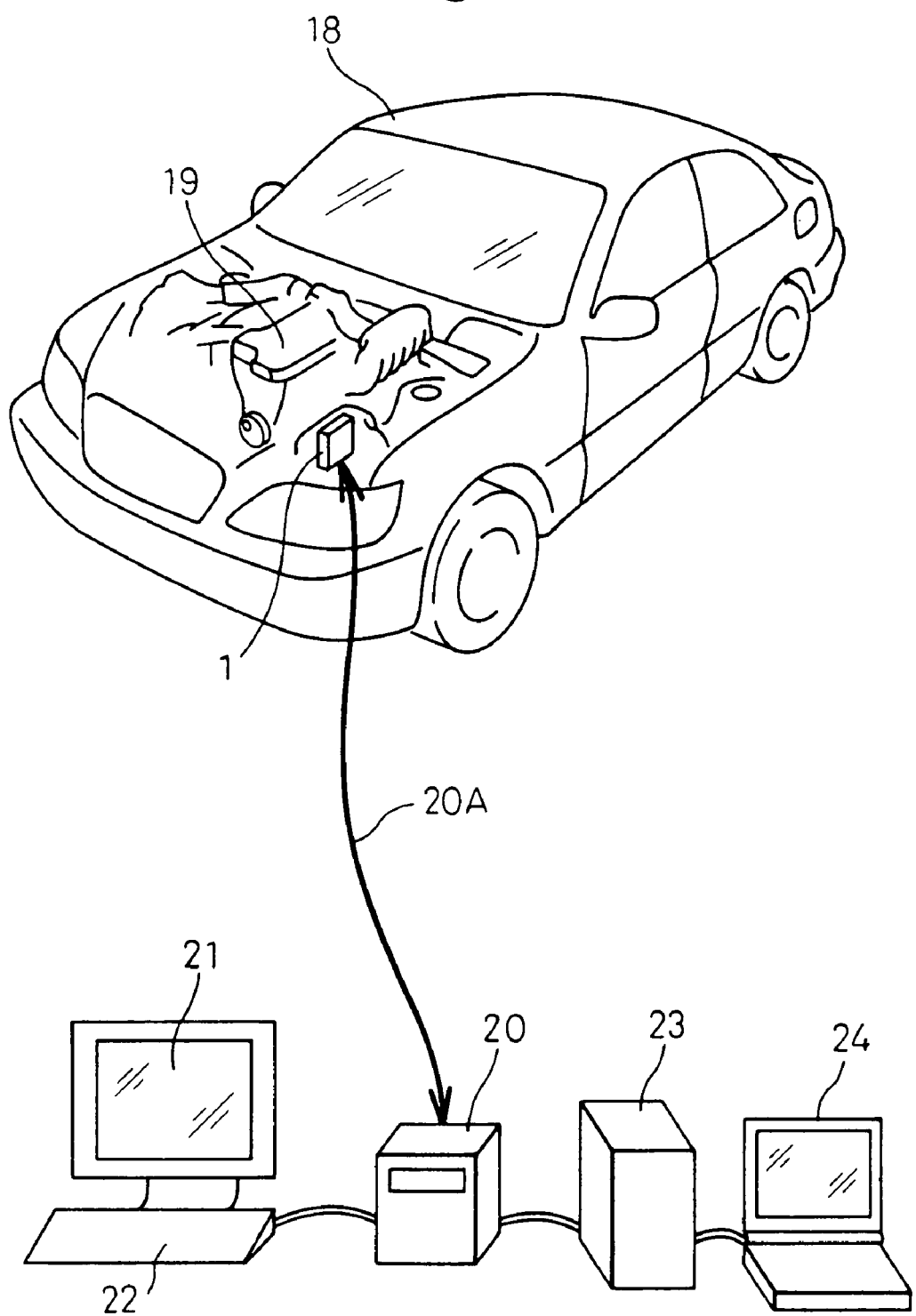
FIG. 2 is an explanatory diagram showing an overall configuration of a microcomputer logic development system in accordance with an embodiment of the present invention to be used to develop logic to be implemented in the ECU shown in FIG. 1.

FIG. 2 shows the position of the ECU 1 described in conjunction with FIG. 1 in an automobile (vehicle) 18. The ECU 1 is located in an engine compartment in which an engine 19 of the vehicle 18 is mounted. Moreover, FIG. 2 shows a microcomputer logic development system 20 in accordance with an embodiment of the present invention. The microcomputer logic development system 20 in accordance with an embodiment of the present invention is, as illustrated, directly connected to the ECU 1 over a connection cord 20A that is inserted into a connector of the ECU 1 which is disjoined from a connector formed in the vehicle 18. A display 21 is used to monitor the state of the microcomputer logic development system 20. A keyboard 22 serves as an input device for use in modifying the settings of the microcomputer logic development system 20.

Incidentally, the microcomputer logic development system 20 in accordance with an embodiment of the present invention is, as mentioned above, used while being directly connected to the vehicle 18. Alternatively, the microcomputer logic development system 20 may be connected to a vehicle driving situation generation system 23 that is operated under the control of a personal computer 24 and that can generate various vehicle driving situations on a quasi basis. In this case, even when a vehicle is unavailable, it is possible to develop the logic to be implemented in a built-in microcomputer for use in controlling an electronically controlled engine.

Figure 3:
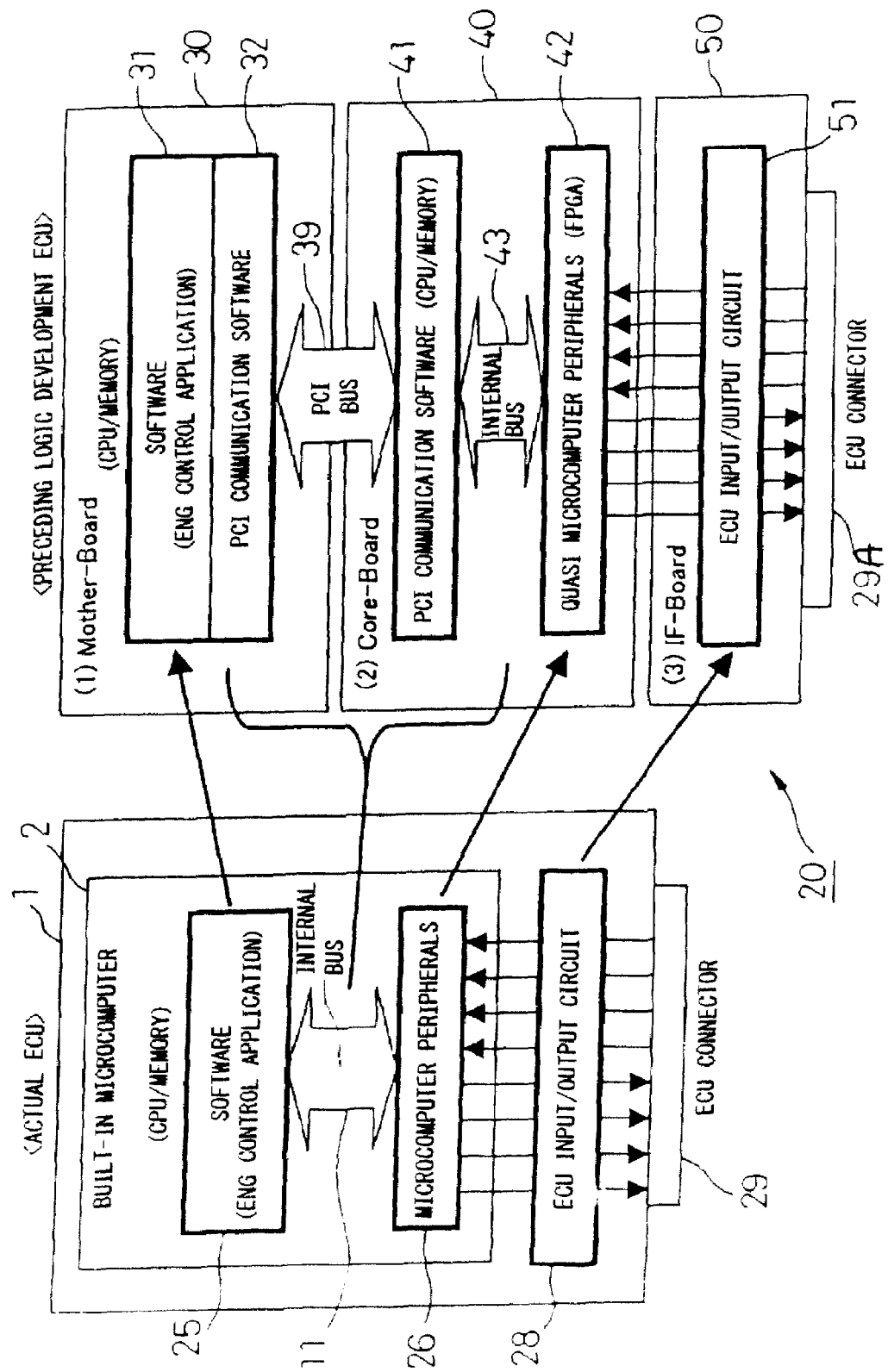
FIG. 3 is a block diagram showing a configuration of the microcomputer logic development system in accordance with an embodiment of the present invention in comparison with the configuration of a conventional ECU for controlling electronic equipment.

FIG. 3 shows a system configuration of the microcomputer logic development system 20 in accordance with an embodiment of the present invention, which can be used while being connected to the vehicle 18 as shown in FIG. 2, as opposed to the configuration of the conventional ECU 1 for controlling an electronically controlled engine (electronically controlled equipment). As mentioned above, the ECU 1 includes the built-in computer 2, and an ECU input/output circuit 28 including the driver 16. The ECU 1 is connected to electronically controlled equipment mounted in a vehicle via an ECU connector 29. Moreover, the built-in microcomputer 2 has software 25 (an engine control application, ENG in the drawing), which is stored in the memory 9 and read and used by the CPU 10, installed therein, and has microcomputer peripheral resources 26 incorporated therein. The software 25 and microcomputer peripheral resources 26 can transmit or receive data to or from each other over the internal bus 11.

On the other hand, as described in conjunction with FIG. 2, the microcomputer logic development system 20 in accordance with an embodiment of the present invention is substituted for the ECU 1. In the present example, the microcomputer logic development system 20 comprises three circuit boards, that is, a motherboard 30, a core board 40, and an interface board 50. According to one embodiment, the motherboard 30 and core board 40 correspond to the built-in microcomputer 2 included in the ECU 1, and the interface board 50 corresponds to the ECU input/output circuit 28 included in the ECU 1. The motherboard 30 and core board 40 are connected to each other over a PCI bus 39 serving as a fast bus interface.

Software (ENG control application) 31 that is stored in a memory to be described later, and read and used by the CPU, and PCI communication software 32 that performs communication over the PCI bus 39, are installed on the motherboard 30. PCI communication over the PCI bus 39 refers to communication of data, which is transmitted or received to or from resources (hereinafter, simply, quasi microcomputer peripherals) 42, over the PCI bus 39. In order to develop a new-generation ECU, the motherboard 30 is configured to provide the throughput and storage capacity large enough to permit development of the preceding logic to be implemented in the new-generation ECU.

Incidentally, the performance of an existing microcomputer for use in controlling an engine is such that the operating frequency of a CPU is 64 MHz and the storage capacity of a memory is about 1 megabyte. A general-purpose microcomputer such as the one employed in personal computers would exhibit sufficient performance, and could be reused over a long period of time.

Moreover, the core board 40 accommodates a CPU and a memory and has PCI communication software 41 which performs communication over the PCI bus 39 installed thereon. Moreover, the quasi microcomputer peripherals (e.g. FPGAs or field programmable gate arrays) 42 corresponding to the microcomputer peripherals 42 of the built-in microcomputer 2 are realized on the core board 40. The PCI communication software 41 and quasi microcomputer peripherals 26 can transmit or receive data to or from each other over an internal bus 43. The interface board 50 accommodates an ECU input/output circuit 51 corresponding to the ECU input/output circuit 28, and an ECU connector 29A. The ECU input/output circuit 51 is divided into and composed of standard circuit blocks that are independent of one another, so that the ECU input/output circuit 51 can cope with a change in the design of the input/output circuit incorporated in the ECU.

Figure 4:
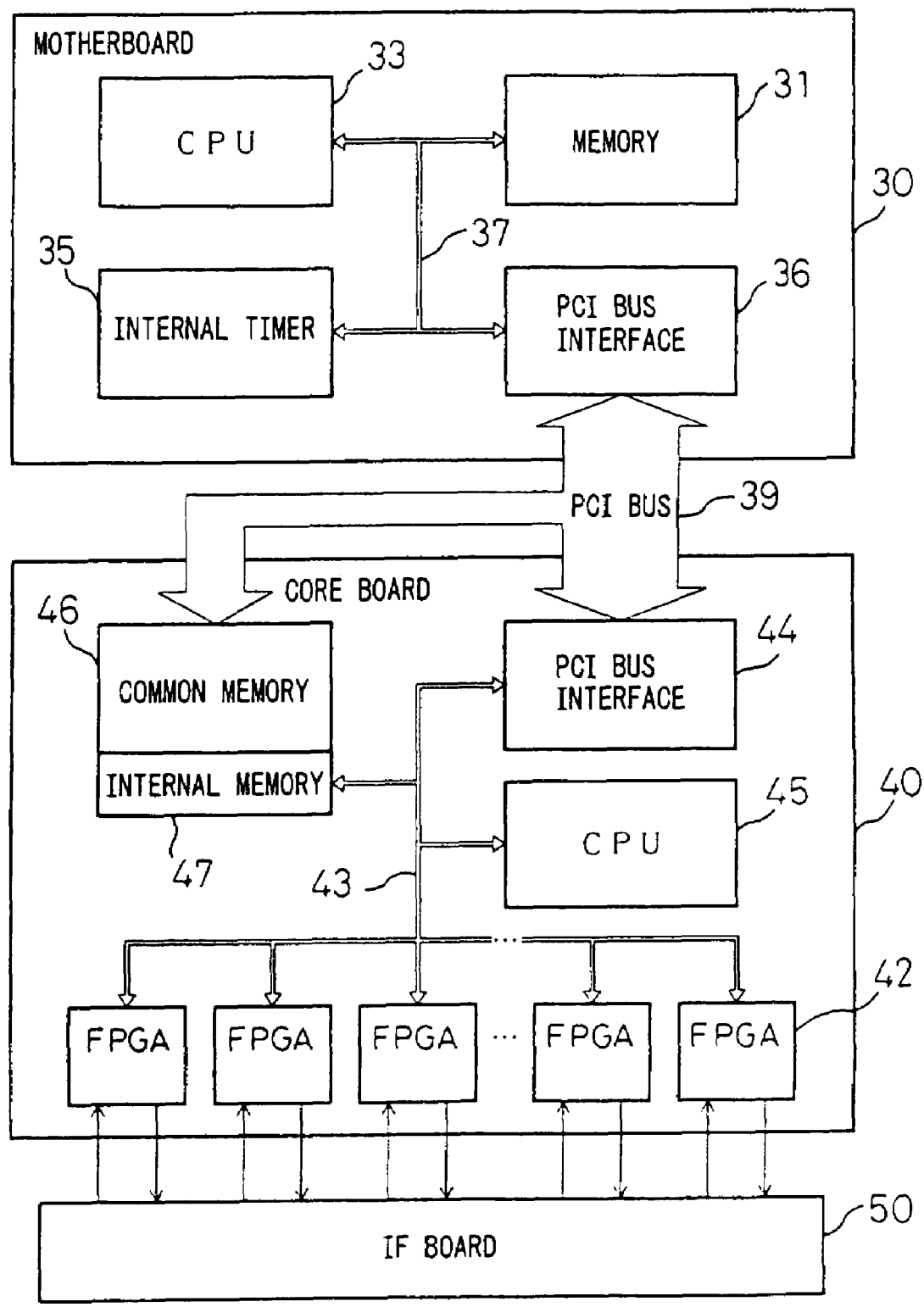
FIG. 4 is a block diagram showing an example of the internal components of a motherboard and a core board shown in FIG. 3.

FIG. 4 shows an example of the hardware configurations of the motherboard 30 and core board 40 shown in FIG. 3. The motherboard 30 accommodates a memory 31 whose storage capacity is large enough to store the software (ENG control application) described in conjunction with FIG. 3, a general-purpose high-performance CPU (whose operating frequency is, for example, 850 megahertz) 33, an internal timer 35, a PCI bus interface 36 connected on the PCI bus 39, and an internal bus 37 over which the memory, CPU, internal timer, and PCI bus interface are interconnected.

The core board 40 accommodates a PCI bus interface 44 connected on the PCI bus, a CPU 45 that is of a lower grade than the CPU 33 mounted on the motherboard 30, quasi microcomputer peripherals (e.g. FPGA) 42 that realize the capabilities equivalent to the capabilities of the peripherals of the microcomputer, an internal bus 43, a common memory 46 connected on the PCI bus, and an internal memory 47 connected on the internal bus 43. The CPU 45 mounted on the core board 40 is configured to offer the throughput (for example, a general-purpose 32-bit CPU whose operating frequency is about 16 megahertz) large enough to merely perform PC communication. The core board 40 has the capability to receive data, which is transmitted or received between the ENG control application (software) 25 installed in the conventional ECU and the microcomputer peripherals 26, over the PCI bus 39, and has the capability to transfer the data to the quasi microcomputer peripherals (e.g. FPGAs) 42.

The FPGAs connected to the interface board 50 can be realized with software and can flexibly be rearranged to cope with a change in the combination of the microcomputer peripherals incorporated in the ECU. Namely, the FPGAs can be rearranged to cope with an increase in the number of channels or addition of a resource having an unprecedented capability.

Figure 5B:
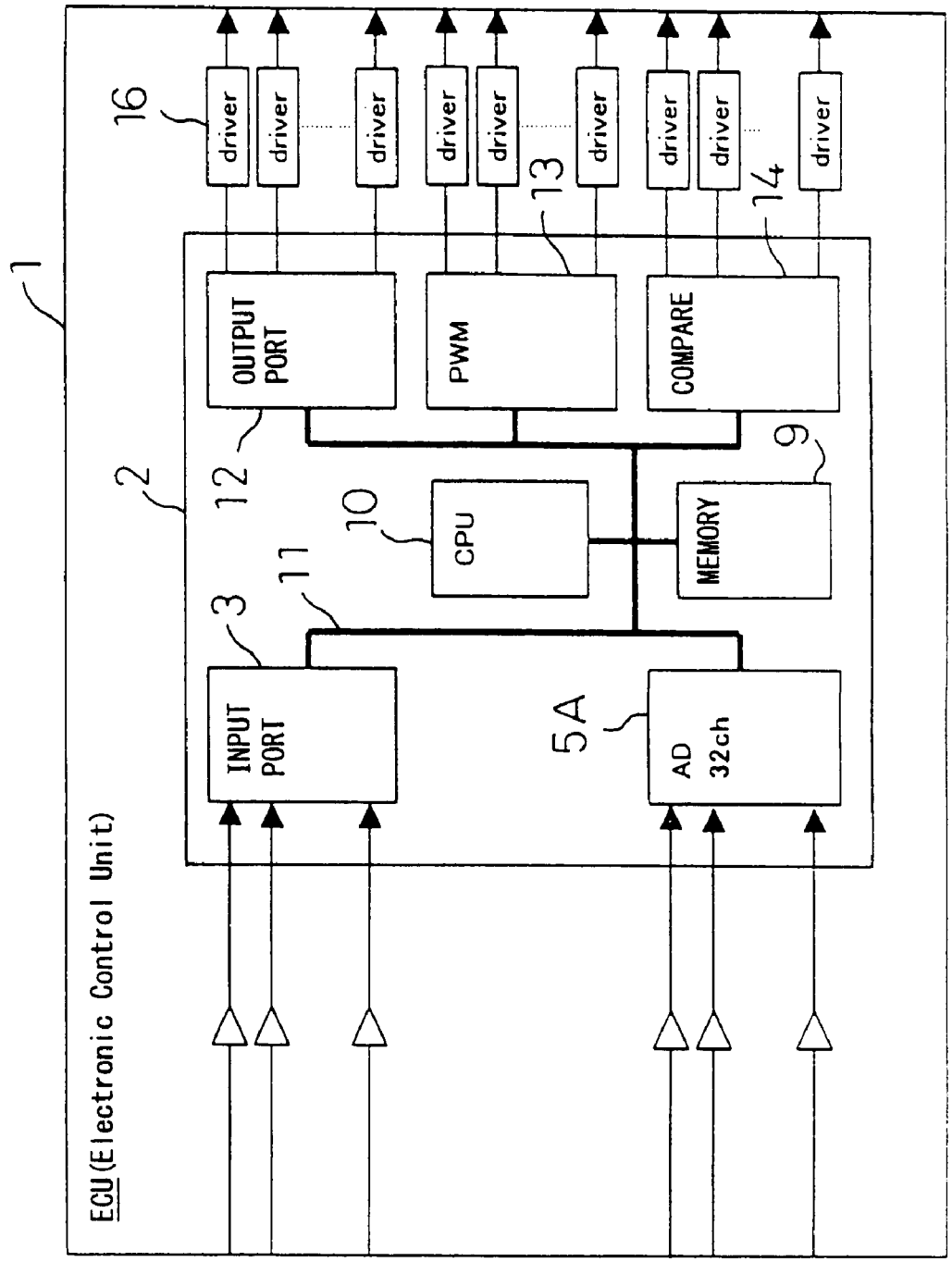
FIG. 5B is a block diagram showing an ECU serving as a microcomputer logic development system in accordance with an embodiment of the present invention in comparison with the configuration shown in FIG. 5A.

Conventionally, when the built-in microcomputer 2 is short of a resource, an external A/D converter 17 is, as shown in FIG. 5A, added to a stage preceding the built-in microcomputer 2. In the microcomputer logic development system 20 in accordance with an embodiment of the present invention, as the storage capacity of the memory 9 on the motherboard is large and the processing speed of the CPU 10 is high, an A/D converter 5A having the same number of input terminals as the required number of microcomputer resources can be readily realized as shown in FIG. 5B. Therefore, the microcomputer logic development system 20 in accordance with the present invention does not require an extension I/O facility (input/output device) that compensates for a shortage in the number of microcomputer resources.

Figure 6:
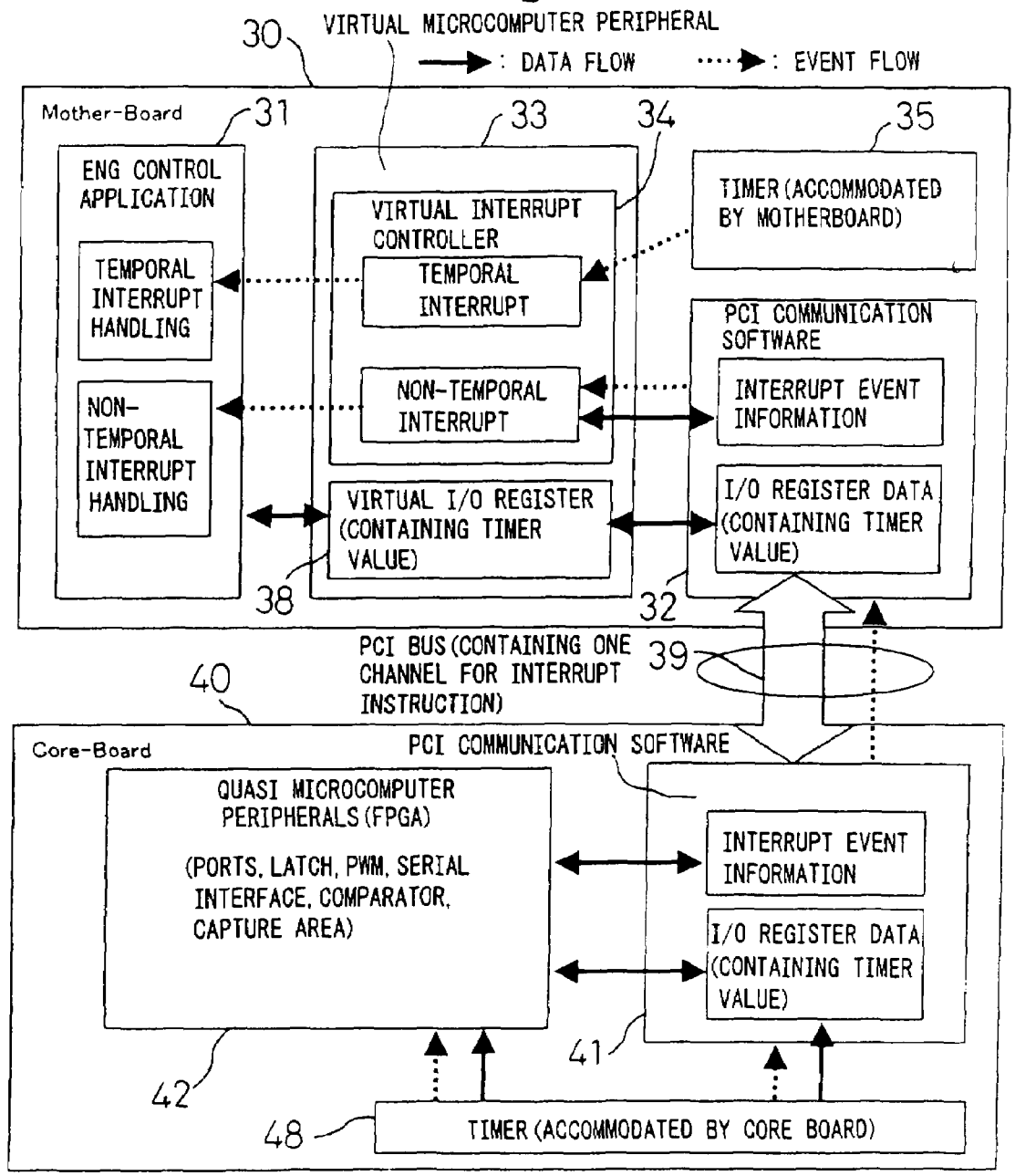
FIG. 6 shows the software configurations of a motherboard and core board included in a microcomputer logic development system in accordance with an embodiment of the present invention.

FIG. 6 shows the software configurations of the motherboard 30 and core board included in the microcomputer logic development system 20 in accordance with the present invention. When electronically controlled equipment is an electronically controlled engine, the ENG control application 31 installed on the motherboard 30 is divided into two kinds of processing, that is, temporal interrupt handling and non-temporal interrupt handling. The temporal interrupt handling does not depend on an external state but is performed at regular intervals. On the other hand, the non-temporal interrupt handling depends on an external state, that is, the driven state of an engine. The non-temporal interrupt handling is handling of an interrupt caused by, for example, an engine speed signal, a vehicle speed signal, a fuel injection timing signal, or an injection timing signal.

A phenomenon that varies depending on an external state shall be called an event. The non-temporal interrupt handling can be said to be the processing to be performed synchronously with an event whose information is detected from the external state. FIG. 6 shows the flow of the event with a dot line, and shows the flow of data with a solid line.

For the purpose of performing the temporal interrupt handling and non-temporal interrupt handling nested within the ENG control application 31 installed on the motherboard 30, the CPU 33 acts as a virtual microcomputer peripheral. The virtual microcomputer peripheral includes a virtual interrupt controller 34 that causes a temporal interrupt or a non-temporal interrupt, and a virtual I/O register 38. Moreover, the PCI communication software 32 treats, as data, interrupt event information and I/O register data. An internal timer 35 is used for temporal interrupt handling. A timer value stored in the virtual I/O register 38 and a timer value placed on the PCI bus 39 will be described later.

On the other hand, the quasi microcomputer peripherals 42 mounted on the core board 40 include, similarly to the conventional microcomputer peripherals 26, ports, a latch port, a pulse width modulator (PWM), a serial interface, a comparator, and a capture area. Moreover, the PCI communication software 41 treats as data interrupt event information and I/O register data. Furthermore, the core board 40 accommodates a timer 48 that causes an event to progress. Moreover, the PCI bus 38 includes a one-channel bus for an interrupt instruction.

Next, processes to be implemented in the microcomputer logic development system 20, in accordance with an embodiment of the present invention in which event information and data flow as shown in FIG. 6, will be described by taking concrete examples. The processes include a PCI communication process, a communication synchronization process, a failsafe process, an interrupt control process (a process of causing or clearing an interrupt event or a process of managing priorities of interrupts), a process of reducing a load imposed on PCI communication, a timer handling process, a pulse transmission process using a comparator, a pulse transmission request process, and a pulse transmission correction process.

(1) PCI Communication Process (Use of a Common Memory)

Figure 7:
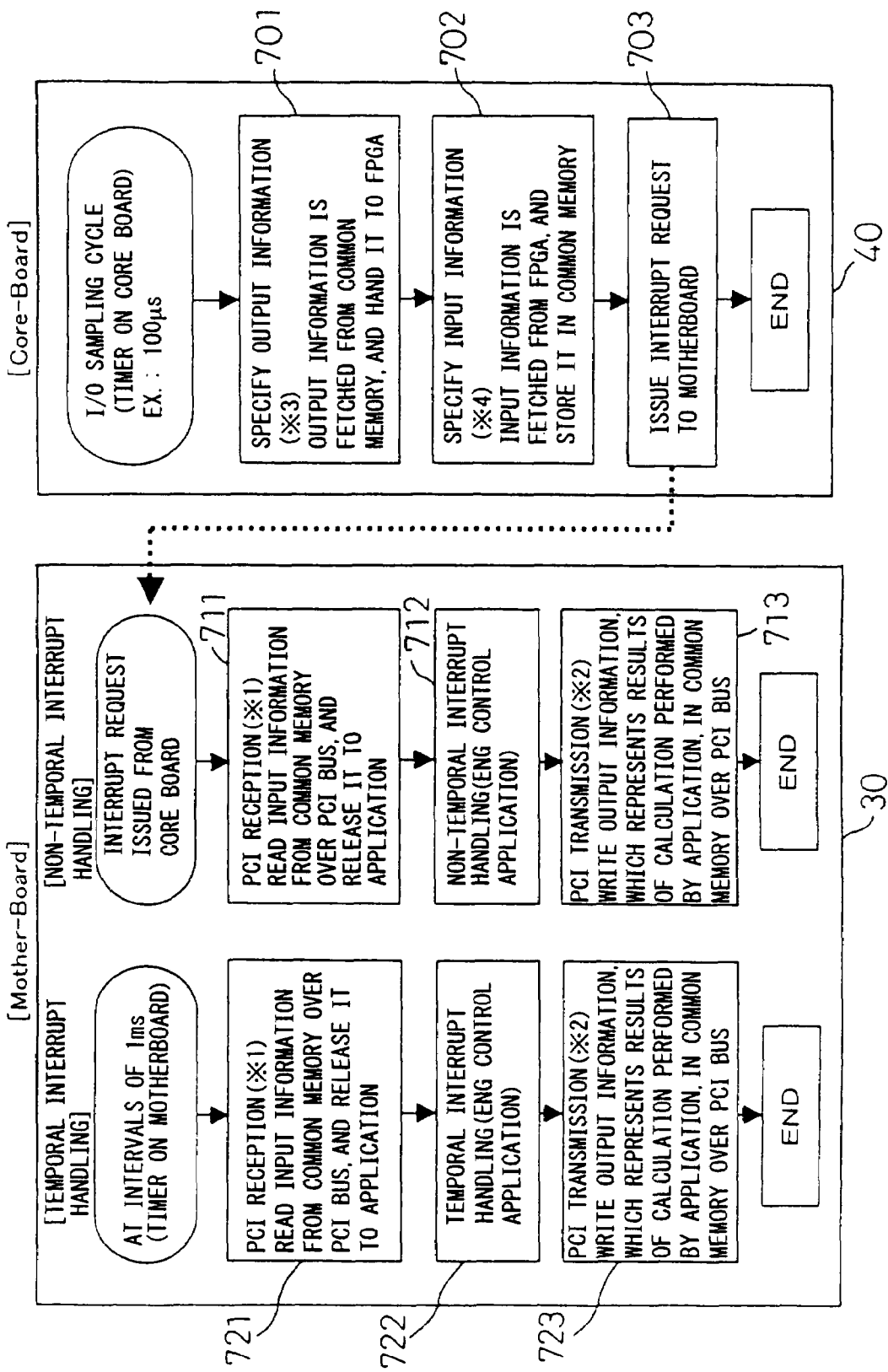
FIG. 7 is a flowchart describing an example of a communication process according to which a core board and motherboard included in a microcomputer logic development system in accordance with an embodiment of the present invention communicate with each other using a common memory.
Figure 8:
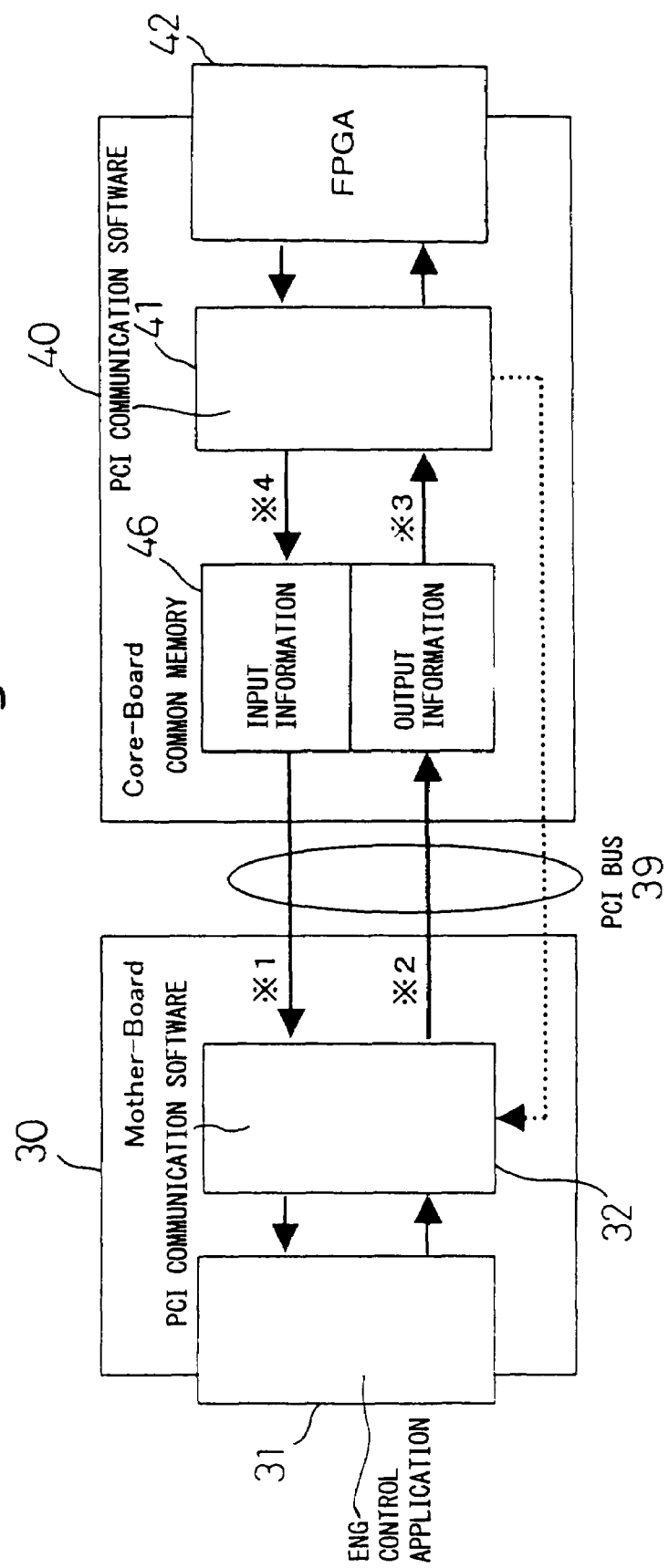
FIG. 8 is an explanatory diagram showing a configuration and capability of the common memory mounted on the core board in order to realize the communication process described in FIG. 7.

FIG. 7 presents an example of a communication process according to which the core board 40 and motherboard 30 included in the microcomputer logic development system 20 in accordance with an embodiment of the present invention communicate with each other using the common memory 46 described in conjunction with FIG. 4. FIG. 8 shows the configuration and capability of the common memory 46 that is mounted on the core board 40 in order to implement the communication process presented in FIG. 7.

When the timer 48 on the core board 40 which is described in conjunction with FIG. 6 indicates the start of an I/O sampling cycle (for example, 100 μs), output information is specified in the PCI communication software 41 at step 701. Consequently, the output information is fetched from the common memory 46 and handed to the quasi microcomputer peripherals (e.g. FPGAs) 42. At the next step 702, input information is specified in the PCI communication software 41. Consequently, the input information is fetched from the quasi microcomputer peripherals (FPGAs) 42, and stored in the common memory 46. At step 703, an interrupt request is issued from the core board 40 to the motherboard 30. The routine is then terminated.

In response to the interrupt request issued from the core board 40, the non-temporal interrupt handling is started on the motherboard 30. At step 711, the PCI communication software 32 performs PCI reception. Consequently, received information is read from the common memory 46 over the PCI bus 39, and released into the ENG control application 31. At step 712, the non-temporal interrupt handling nested within the ENG control application 31 is performed. At step 713, PCI transmission is performed. Specifically, the PCI communication software 32 writes output information, which represents the results of calculation performed during the non-temporal interrupt handling nested within the ENG control application 31, in the common memory 46 over the PCI bus 39. The routine is then terminated.

On the other hand, on the motherboard 30, the temporal interrupt handling nested within the ENG control application 31 is performed irrespective of the interrupt request issued from the core board 40. The temporal interrupt handling is performed at intervals of, for example, a cycle of 1 ms whose start is indicated by the timer 35 on the motherboard 30. During the temporal interrupt handling, the PCI communication software 32 performs PCI reception at step 721. Specifically, received information is read from the common memory 46 over the PCI bus 39, and released to the ENG control application 31. At step 722, the temporal interrupt handling nested within the ENG control application 31 is performed. At step 723, PCI transmission is performed. Specifically, the PCI communication software 32 writes output information, which represents the results of calculation performed within the temporal interrupt handling by the ENG control application 31, into the common memory 46 via the PCI bus 39. The routine is then terminated.

(2) PCI Communication Process (Communication Synchronization Process 1)

When data is transmitted or received between the motherboard 30 and core board 40 over the PCI bus 39, a value written in the common memory 46 by the motherboard 30 is read by the core board 40. The reading may be performed in a reverse direction. In this case, when the writing timing agrees with the reading timing, a data value cannot be guaranteed. According to an embodiment of the present invention, the PCI bus 39 is accessed synchronously with the communication for fear the write timing may agree with the reading timing. The communication synchronization process will be described in conjunction with FIG. 9.

When the PCI bus 39 is accessed synchronously with the communication over the PCI bus, a communication synchronization counter is included in the common memory 46. The non-temporal interrupt handling to be performed on the motherboard 30 is synchronized with the inputting/outputting to be performed on the core board 40. The communication synchronization counter is updated with the completion of the interrupt handling performed on the motherboard 30. Moreover, the core board 40 performs the inputting/outputting after checking if the communication synchronization counter has been updated. This process will be described in conjunction with FIG. 9.

When the timer 48 on the core board 40 described in conjunction with FIG. 6 indicates the start of an I/O sampling cycle (for example, 100 μs), it is verified at step 901 whether a value (syncnt) of the communication synchronization counter is equal to a value (syncnt_m) on a communication synchronization counter monitor. If the values are unequal, the routine is terminated. If the values are equal, control is passed to step 902, and output information is specified. At step 903, input information is specified. At step 904, an interrupt request is issued to the motherboard 30. At step 905, the value (syncnt_m) on the communication synchronization counter monitor is updated by one, and the routine is terminated.

In response to the interrupt request issued from the core board 40, a non-temporal interrupt handling is started on the motherboard 30. At step 911, the PCI communication software 32 performs PCI reception. The value (syncnt) of the communication synchronization counter received from the common memory 46 over the PCI bus 39 is specified as a value (t_syn) in the ENG control application 31 at step 912. At step 913, the ENG control application 31 performs PCI transmission. At step 914, PCI transmission is performed. At step 915, the value (t_syn) specified at step 912 is updated by one and specified as the value (syncnt) of the communication synchronization counter. The results of the non-temporal interrupt handling performed within the ENG control application 31 and the value (syncnt) of the communication synchronization counter are written in the common memory 46 over the PCI bus 39 by the PCI communication software 32. The routine is then terminated.

On the other hand, on the motherboard 30, the temporal interrupt handling nested within the ENG control application 31 is performed irrespective of the interrupt request issued from the core board 40. The temporal interrupt handling is performed at intervals of, for example, a cycle of 1 ms whose start is indicated by the timer 35 on the motherboard 30. Within the temporal interrupt handling, the PCI communication software 32 performs PCI reception at step 921. At this time, the latest value acquired through the non-temporal interrupt handling is used. At step 922, the temporal interrupt handling nested within the ENG control application 31 is performed. At step 923, PCI transmission is performed. Updated data alone is transmitted within the subsequent non-temporal interrupt handling. The routine is then terminated.

Figure 9:
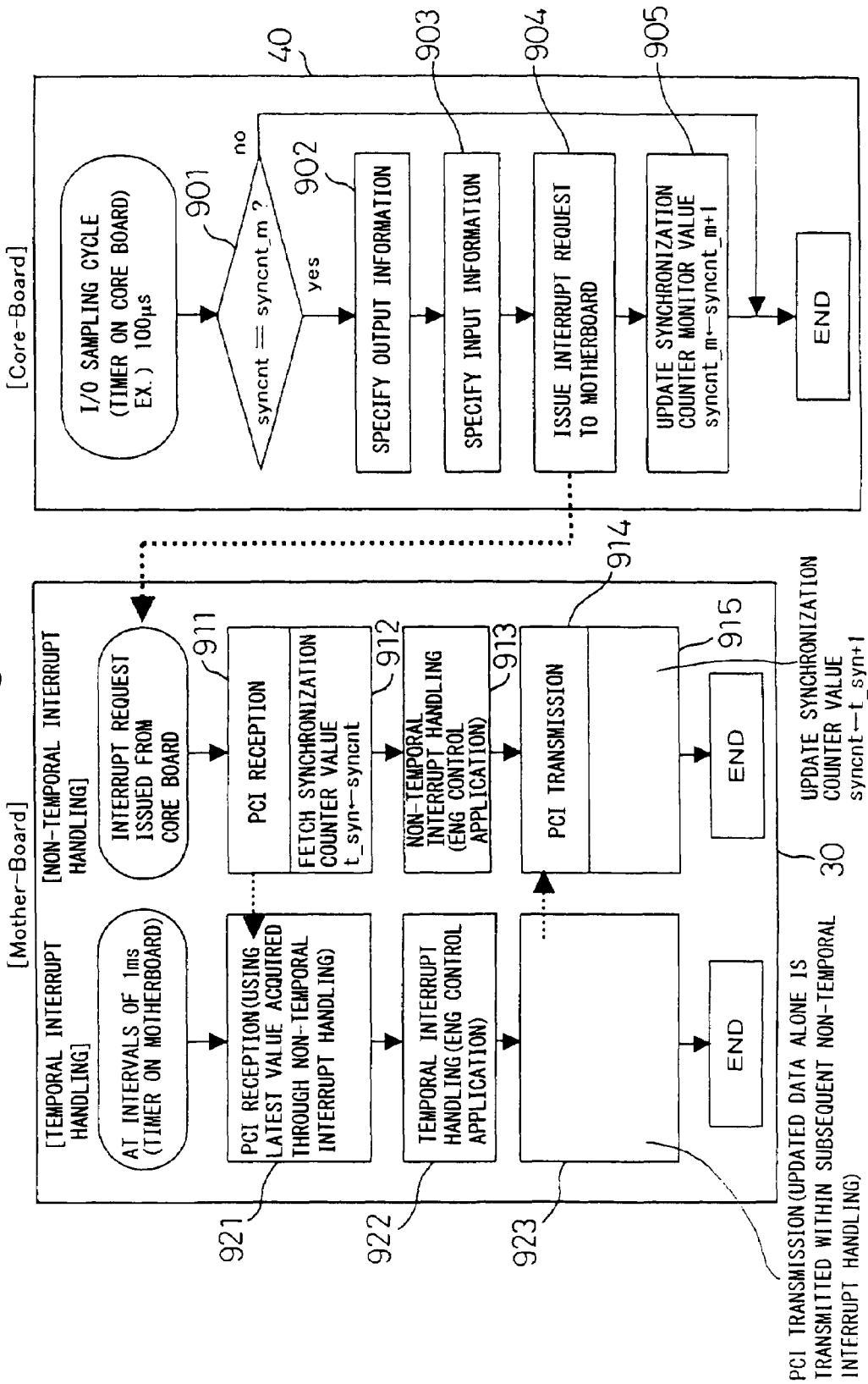
FIG. 9 is a flowchart describing an example of a synchronization process for synchronizing data communications between a motherboard and core board included in a microcomputer logic development system in accordance with an embodiment of the present invention.
Figure 10:
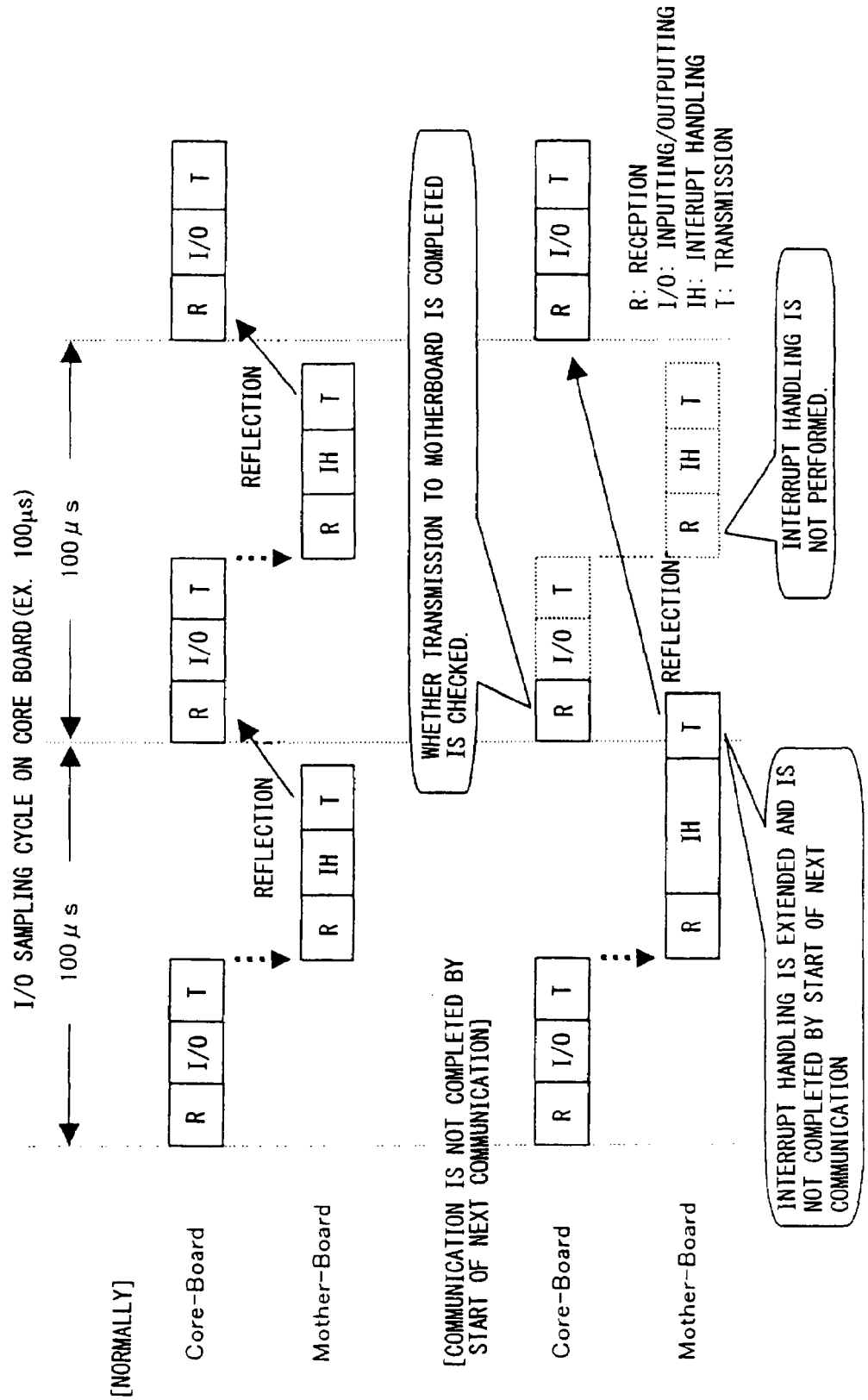
FIG. 10 is a timing chart concerning the communication synchronization process described in FIG. 9.

FIG. 10 is a timing chart time-sequentially showing a progress of communication synchronization that is performed according to the communication synchronization process described in conjunction with FIG. 9. FIG. 10 includes a timing chart concerning a normal state in which communication is completed within an I/O sampling cycle (e.g. 100 μs) on the core board 40, and a timing chart concerning an abnormal state in which communication is not completed until the next communication starts on the core board 40 after the elapse of the I/O sampling cycle (e.g. 100 μs).

(3) PCI Communication Process (Communication Synchronization Process 2)

In this example, a writing timing within transmission or reception of data between the motherboard 30 and core board 40 over the PCI bus 39 is synchronized with a reading timing. The embodiment of process (2) differs in that the timing of activating the processing to be performed on the core board 40 is not set to a fixed timing in relation to the I/O sampling cycle. Furthermore, the progress of interrupt handling performed on the motherboard 30 is checked. If the interrupt handling is completed, control is passed to the next inputting/outputting. Therefore, the timing of inputting/outputting to be performed on the core board 40 is determined arbitrarily.

The communication synchronization process will be described in conjunction with FIG. 11.

When the power supply of the core board 40 is turned on, it is verified whether the value (syncnt) of the communication synchronization counter is equal to the value (sncnt_m) on the communication synchronization counter monitor. If the values are unequal, the verification of step 1101 is repeated until the values become equal. If it is found at step 1101 that the values are equal, control is passed to step 1102. Output information is then specified. At step 1103, input information is specified. At step 1104, an interrupt request is issued to the motherboard 30. At step 1105, the value (sncnt_m) on the communication synchronization counter monitor is updated by 1, and the routine is terminated.

In response to the interrupt request issued from the core board 40, the non-temporal interrupt handling is started on the motherboard 30. At step 1111, the PCI communication software 32 performs PCI reception. The value (syncnt) of the communication synchronization counter received from the common memory 46 over the PCI bus 39 is specified as a value (t_syn) in the ENG control application at step 1112. At step 1113, the ENG control application 31 performs the non-temporal interrupt handling. At step 1114, PCI transmission is performed. At step 1115, the value (t_syn) specified at step 1112 is updated by 1 and specified as the value (syncnt) of the communication synchronization counter. The PCI communication software 32 writes the results of the non-temporal interrupt handling performed within the ENG control application 31 and the value (syncnt) of the communication synchronization counter in the common memory 46 over the PCI bus 39. The routine is terminated.

On the other hand, on the motherboard 30, the temporal interrupt handling nested within the ENG control application 31 is performed irrespective of the interrupt request issued from the core board 40. The temporal interrupt handling is performed at intervals of, for example, a cycle of 1 ms whose start is indicated by the timer 35 on the motherboard 30. Within the temporal interrupt handling, the PCI communication software 32 performs PCI reception. At this time, the latest value acquired through the non-temporal interrupt handling is employed. At step 1122, the temporal interrupt handling nested within the ENG control application 31 is performed. At step 1123, PCI transmission is performed. Updated data alone is transmitted within the next non-temporal interrupt handling. The routine is then terminated.

Figure 11:
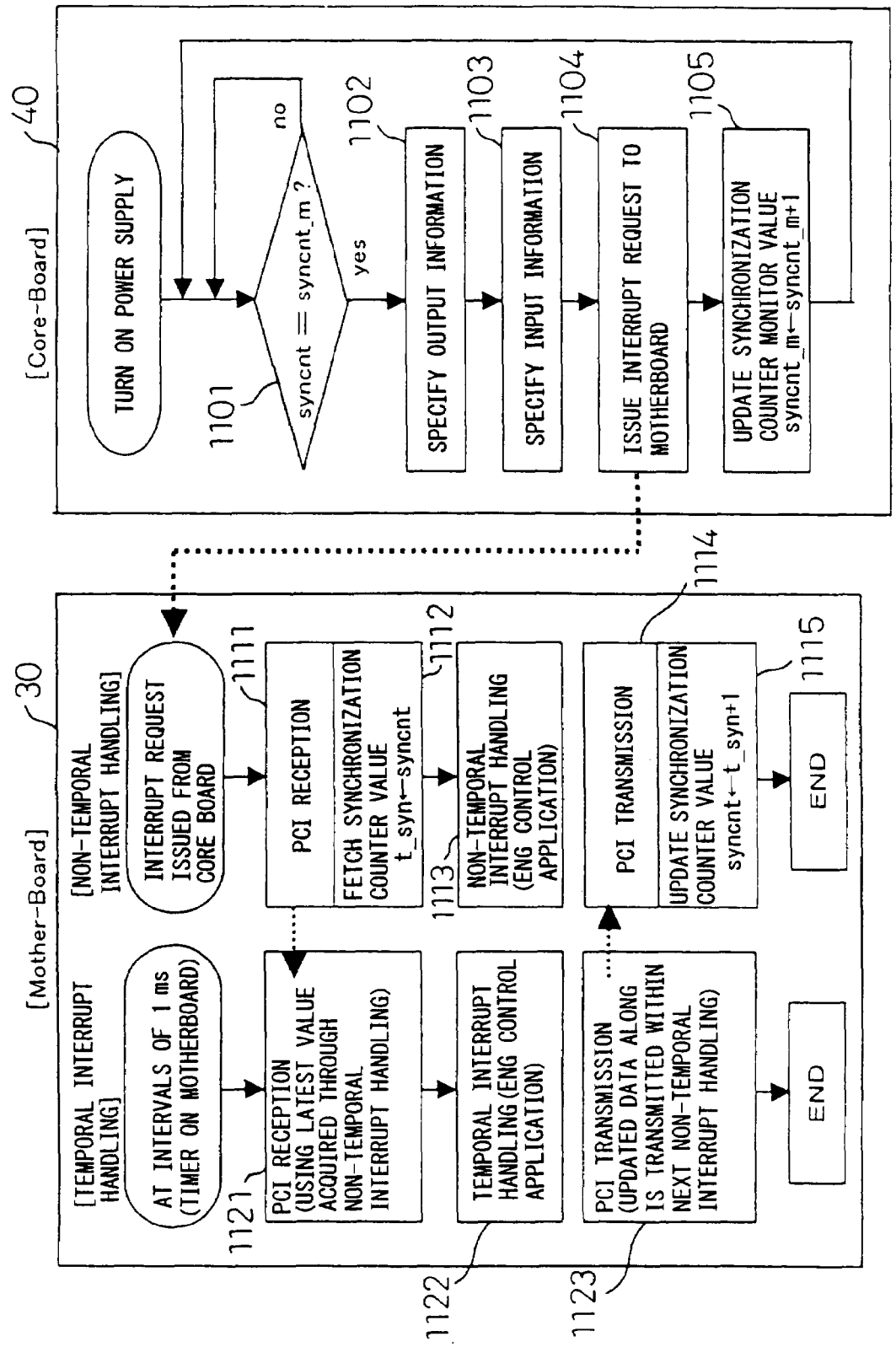
FIG. 11 is a flowchart describing another example of a synchronization process for synchronizing data communications between a motherboard and core board included in a microcomputer logic development system in accordance with an embodiment of the present invention.
Figure 12:
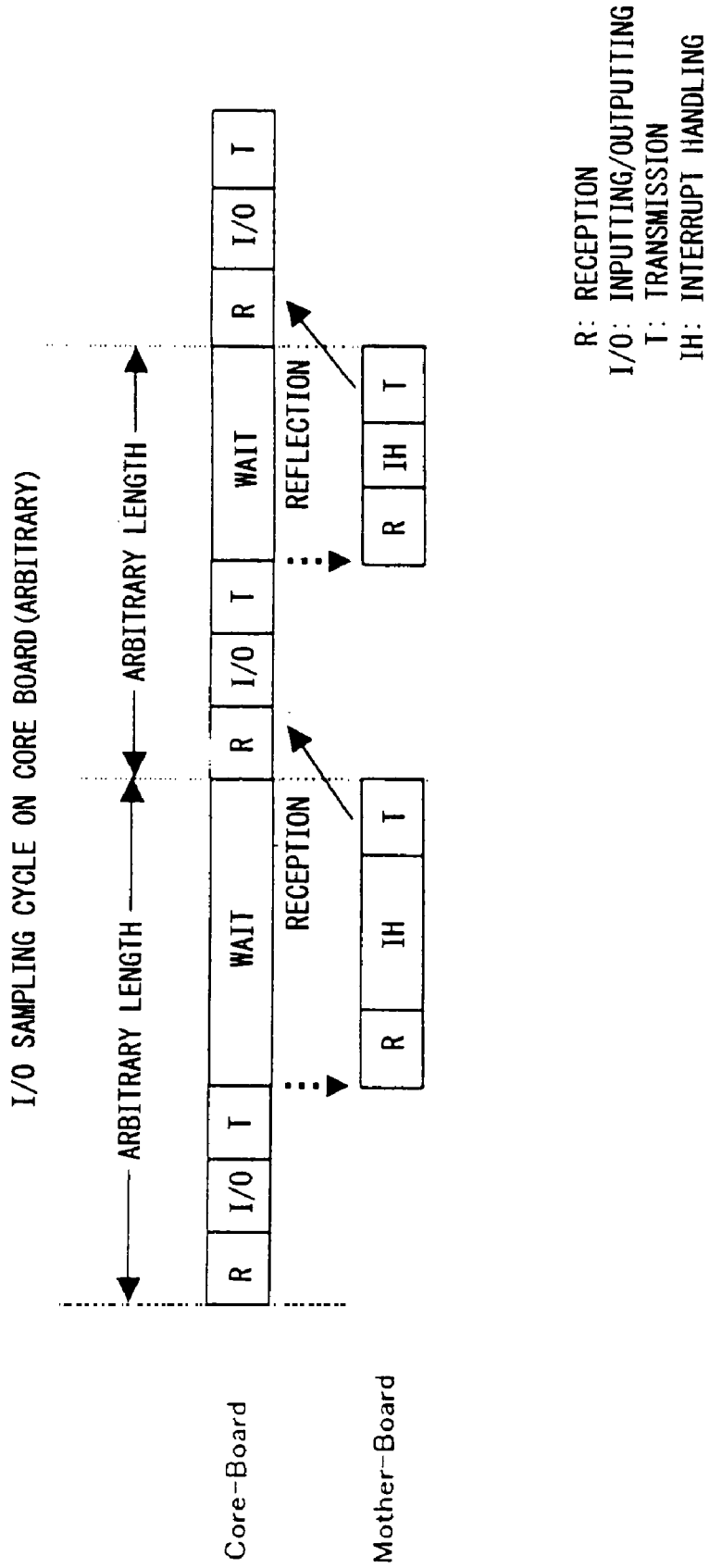
FIG. 12 is a timing chart concerning the communication synchronization process described in FIG. 11.

FIG. 12 is a timing chart time-sequentially showing the progress of communication synchronization performed according to the process described in conjunction with FIG. 11. As is apparent from FIG. 12, the I/O sampling cycle for I/O sampling performed on the core board 40 can have any length depending on a wait time which corresponds to the time required to achieve interrupt handling on the motherboard 30.

(4) PCI Communication Process (Failsafe Operation)

Interrupt handling to be performed on the motherboard 30 that is connected to the core board 40 over the PCI bus 39 and inputting/outputting to be performed on the core board 40 are arbitrated in order to prevent concurrency by utilizing the synchronization counter as mentioned above. If the synchronization counter fails or breaks due to a fault, the inputting/outputting on the core board 40 enters a wait state for waiting the completion of an interrupt handling on the motherboard 30. Otherwise, the interrupt handling on the motherboard 30 enters a wait state to wait for an interrupt derived from the inputting/outputting performed on the core board 40. This may bring about a deadlock.

According to an embodiment of the present invention, a failsafe logic is implemented in order to avoid the deadlock. The failsafe logic will be described. According to the failsafe logic employed in this example, a deadlock verification time is defined. If a wait time for waiting the completion of interrupt handling on the motherboard 30 exceeds a predetermined verification time, the situation is regarded as a deadlock. When deadlock is detected, communication is forcibly restarted. This processing will be described in conjunction with FIG. 13.

When the timer 48 on the core board 40 described in conjunction with FIG. 6 indicates the start of an I/O sampling cycle (for example, 100 μs), it is verified at step 130 whether the value (waitcnt) of a wait counter exceeds the verification time. If the value (waitcnt) of the wait counter falls below the verification time, control is passed to step 1303. If the value exceeds the verification time, the value (syncnt) of the communication synchronization counter and the value (yncnt_m) on the communication synchronization counter monitor are cleared at step 1302. Control is then passed to step 1303.

At step 1303, it is verified whether the value (syncnt) of the communication synchronization counter is equal to the value (syncnt_m) on the communication counter monitor. If it is verified at step 1301 that the value (waitcnt) of the wait counter falls below the verification time, the value (syncnt) of the communication synchronization counter is unequal to the value (syncnt_m) on the communication synchronization counter monitor. At step 1309, the value (waitcnt) of the wait counter is updated by 1 and the routine is terminated. On the other hand, if the value (syncnt) of the communication synchronization counter and the value (syncnt_m) on the communication counter monitor are cleared at step 1302, both the values are equal. Control is therefore passed from step 1303 to step 1304.

At step 1304, output information is specified. At step 1305, input information is specified. At step 1306, the value (waitcnt) of the wait counter is cleared. At step 1307, an interrupt request is issued to the motherboard 30. At step 1308, the value (syncnt_m) on the communication synchronization counter monitor is updated by 1 and the routine is terminated. The interrupt handling to be performed on the motherboard 30 is identical to the one described in conjunction with FIG. 9 or FIG. 11. The description of the interrupt handling will therefore be omitted.

(5) Interrupt Control Process (a Process of Causing or Clearing an Interrupt Event)

In transmission or reception of data between the motherboard 30 and core board 40 over the PCI bus 39, an interrupt event detected on the core board 40 is transmitted to the motherboard 30 over the PCI bus 39. Interrupt control by the ENG control application 31 on the motherboard 30 is thus realized. An interrupt event is caused on the core board 40 and cleared on the motherboard 30. Thus, an action is configured to be performed on both the circuit boards. In order to avoid collision of data items, PCI communication data described below is used in this example. Transmission or reception of data between the motherboard 30 and core board 40 is achieved with an action performed on one of the circuit boards.

FIG. 14A shows interrupt event information items (event D to event A) sent from the core board 40 to the motherboard 30, and interrupt event clear requests (clear request D to clear request A) sent from the motherboard 30 to the core board 40. Based on interrupt event information items and interrupt event clear requests, the processing to be described by FIG. 14B is carried out.

When the timer 48 on the core board 40 described in conjunction with FIG. 6 indicates the start of an I/O sampling cycle (for example, 100 μs), output information is specified at step 140. Specifically, interrupt clear information is read, and specified event information is cleared. When the specifying output of the information is completed, input information is specified at step 1402. Namely, interrupt event information is acquired from the quasi microcomputer peripherals (e.g. FPGAs) 42, and the event information is specified. At step 1403, an interrupt request is issued to the motherboard 30, and the routine is terminated.

In response to an interrupt request issued from the core board 40, a non-temporal interrupt handling is started on the motherboard 30. At step 1411, the PCI communication software performs PCI reception. In the PCI reception, interrupt event clear information [I] is cleared, interrupt event information is read over the PCI bus 39, and an interrupt routine is activated for a specified interrupt event. Herein, [I] signifies the internal memory 31. Namely, available data is stored in the internal memory 31, and a PCI communication block updates the common memory 46 over the PCI bus 39.

When step 1411 is completed, step 1412 is executed. At step 1412, non-temporal interrupt handling (ENG control application) is executed. In the non-temporal interrupt handling, any of the interrupt routines (interrupt routines A to D) is selected and activated. Clear information [I] is specified relative to an event for which an interrupt routine is activated. At step 1413, PCI transmission is performed. In the PCI transmission, interrupt clear information is written over the PCI bus 39. The routine is then terminated.

(6) Interrupt Control Process (Interrupt Priority Management Process)

In the conventional ECU 1, the priorities of interrupt events are determined, and handling priorities based on which events are handled are managed. In the microcomputer logic development system 20 in accordance with an embodiment of the present invention, activation is performed in the order of descending priorities of interrupts. Thus, interrupt handling similar to the one performed in the actual ECU 1 is realized. For example, the descending priorities of interrupts specified in event information are determined in the order of event B, event A, event D, and event C, and the processing to be described in FIG. 15A and FIG. 15B is carried out.

FIG. 15A describes an interrupt request routine performed on the motherboard 30. Step 1501 is identical to step 1411 described in FIG. 14, and step 1503 is identical to step 1413. Herein, a process of searching interrupt event information items in the order of the priorities of the interrupts, and activating interrupt routines, which is implemented in step 1502 of the interrupt request routine, will be described in conjunction with FIG. 15B.

When the descending priorities of interrupt events are determined in the order of interrupt event B, interrupt event A, interrupt event D, and interrupt event C, if a non-temporal interrupt handling is executed at step 1502, interrupt B which is assigned the highest priority is searched at step 1511 in order to verify whether interrupt B has taken place. If the result of the search demonstrates that interrupt B has not taken place, control is passed to step 1514. If interrupt B has taken place, control is passed to step 1512, and an interrupt B clear request is specified. At step 1513, an interrupt B routine is executed. After the routine is terminated, control is passed to step 1514.

At step 1514, a search is carried out to judge whether or not interrupt A which is assigned the second highest priority has taken place. If the result of the search demonstrates that interrupt A has not taken place, control is passed to step 1517. If interrupt A has taken place, control is passed to step 1515, and an interrupt A clear request is specified. At step 1516, an interrupt A routine is executed. After the routine is terminated, control is passed to step 1517.

At step 1517, a search is carried out to judge whether or not interrupt D which is assigned the third highest priority has taken place. If the result of the search demonstrates that interrupt D has not taken place, control is passed to step 1520. If interrupt D has taken place, control is passed to step 1518, and an interrupt D clear request is specified. At step 1519, an interrupt D routine is executed. After the routine is terminated, control is passed to step 1520.

At step 1520, a search is carried out to judge whether or not interrupt C which is assigned the lowest priority has taken place. If the result of the search demonstrates that interrupt C has not taken place, the interrupt routine is terminated. If interrupt C has taken place, control is passed to step 1521, and an interrupt C clear request is specified. At step 1522, an interrupt C routine is executed. After the routine is completed, the interrupt routine is terminated.

(7) Process of Reducing a Load on PCI Communication

The processing of the ENG control application 31 can be dealt with by improving the performance of a CPU board adopted as the motherboard 30. However, processing relevant to PCI communication is restricted by a PCI protocol. It is therefore desirable to minimize a load to be imposed on the PCI communication. If no interrupt event takes place, associated interrupt handling does not occur. It is therefore unnecessary to transmit input information to the motherboard 30. Moreover, since a new transmission request is not made, the necessity of transmitting the transmission request to the core board 40 is obviated. Namely, PCI communication is not needed.

Figure 16:
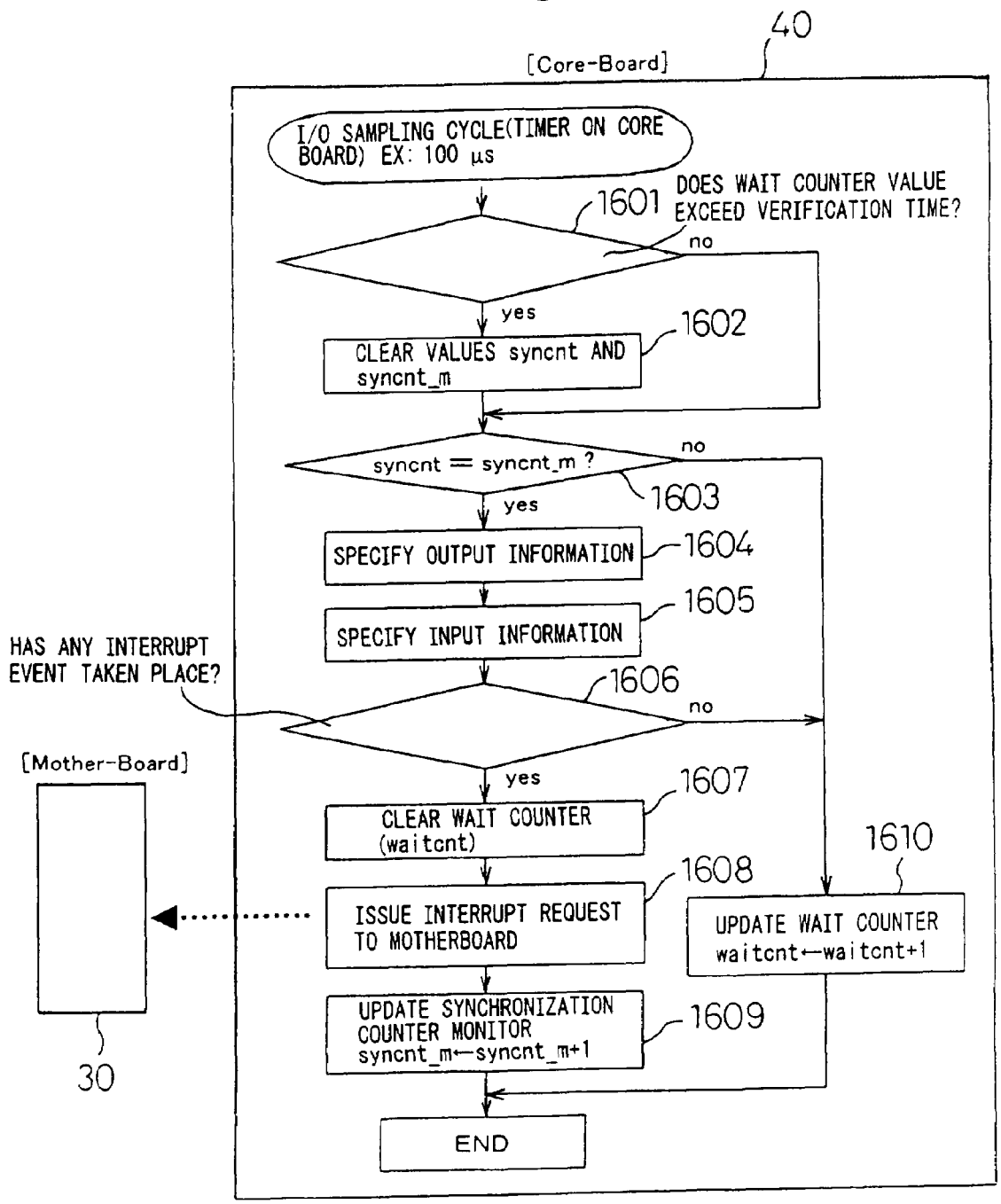
FIG. 16 is a flowchart describing a load reduction process to be adapted to communication performed over a PCI bus included in a microcomputer logic development system in accordance with an embodiment of the present invention.

According to the present invention, when no interrupt event information is found, PCI communication is omitted in order to reduce a load on the PCI communication. Since temporal interrupt handling does not depend on interrupt event information, even if a state in which no interrupt event information is found persists, PCI communication is performed at regular intervals due to the wait counter. This will be described in conjunction with FIG. 16.

When the timer 48 on the core board 40, described in conjunction with FIG. 6, indicates the start of an I/O sampling cycle (for example, 100 μs), it is verified at step 1600 whether the value (waitcnt) of the wait counter exceeds a verification time. If the value (waitcnt) of the wait counter falls below the verification time, control is passed to step 1602. If the value (waitcnt) of the wait counter exceeds the verification time, the value (syncnt) of the communication synchronization counter and the value (syncnt_m) on the communication synchronization counter monitor are cleared at step 1602. Control is then passed to step 1603.

At step 1603, it is verified whether the value (syncnt) of the communication synchronization counter is equal to the value on the communication synchronization counter monitor. If it is found at step 1601 that the value (waitcnt) of the wait counter falls below the verification time, the value (syncnt) of the communication synchronization counter and the value (syncnt_m) on the communication synchronization counter monitor are unequal to each other. At step 1610, the value (waitcnt) of the wait counter is updated by 1, and the routine is terminated. On the other hand, if the value (syncnt) of the communication synchronization counter and the value (syncnt_m) on the communication synchronization counter monitor are cleared at step 1602, the values are equal to each other. Control is therefore passed from step 1603 to step 1604.

At step 1604, output information is specified. At step 1605, input information is specified. At step 1606, it is verified whether an interrupt event has taken place. If no interrupt event has taken place, the value (waitcnt) of the wait counter is updated by 1 at step 1610. The routine is then terminated. On the other hand, if some interrupt event has taken place, control is passed to step 1607. At step 1607, the value (waitcnt) of the wait counter is cleared. At the next step 1608, an interrupt request is issued to the motherboard 30. At the next step 1609, the value (syncnt_m) on the communication synchronization counter monitor is updated by 1, and the routine is terminated. Interrupt handling to be performed on the motherboard 30 is identical to the one described in conjunction with FIG. 9 or FIG. 11. The description of the interrupt handling will be omitted.

(8) Timer Interruption Process

The ENG control application 31 acquires a timer value while performing an operation, and thus calculates a pulse transmission request using the comparator. When acquisition of a timer value is requested, an accurate timer value should be referenced. On the other hand, according to the present invention, timer value information is available on the core board 40. On the motherboard 30 side, the timer value is acquired over the PCI bus 39. However, an interval between PCI communications is, as described in relation to the previous example, 100 μs, and is longer than a time resolution of 1 μs offered by the timer. Measures are therefore be taken in order to acquire an accurate timer value on the motherboard 30.

According to the present invention, the internal timer 35 on the motherboard 30 is used to correct a delay time that has elapsed since the timing of acquiring the timer value from the core board 40 through PCI communication until the issuance of a timer value acquisition request. Thus, an accurate timer value can be acquired on the motherboard 30 side. This process will be described in conjunction with FIG. 17.

On the motherboard 30, the non-temporal interrupt handling is started in response to an interrupt request issued from the core board 40. At step 1701, the PCI communication software 32 performs PCI reception. During the PCI reception, a timer value (T) is acquired from the core board 40, and an internal timer value (T0) is latched. When step 1701 is completed, step 1702 is executed. At step 1702, the non-temporal interrupt handling (ENG control application) is executed. During the interrupt handling, a timer value acquisition request routine is activated.

Within the timer value acquisition request routine, an internal timer value (T1) is acquired at step 1711. At step 1712, a delay time (Td1) that has elapsed since the timing of acquiring the timer value from the core board 40 is calculated. As the timing (T) of acquiring the timer value from the core board 40 is equal to the internal timer value (T0) at that time, the following expression is established:

$$Td1 = T1 - T0$$

After the delay time (Td1) that has elapsed to date is calculated, the timer value (T) acquired from the core board 40 is corrected according to the expression below in order to thus work out a corrected timer value (T').

$$T' = T + Td1$$

At step 1714, the corrected timer value (T') is returned, and the routine is terminated.

After the step 1702 is completed as mentioned above, PCI transmission is performed at step 1703.

(9) Pulse Transmission Process Using the Comparator

The ENG control application 31 may use the comparator to issue a pulse transmission request, for example, an ignition request or a fuel injection request. The actual ECU 1 has two facilities, that is, a general output port facility and a comparative transmission facility, implemented in a comparison output terminal. The two facilities are switched in order to transmit pulses. When the general output port facility is selected in order to transmit pulses immediately, the output mode is referred to as an immediate output. In contrast, when the comparative transmission facility is selected in order to determine a transmission time instant and a transmission level for the purpose of setting transmission, the output mode is referred to as a timed output.

FIG. 18A is an explanatory diagram concerning the timed output mode (pattern 1) and the immediate output mode (pattern 2) for pulse transmission using the comparator.

In pattern 1, software is used to set transmission of the leading edge of a pulse at a time instant that precedes by a predetermined time the start of the pulse transmission in the timed output mode. Termination of the pulse transmission is set in the timed output mode during handling of an equal comparison interrupt that takes place with the start of pulse transmission, that is, the start of comparative transmission. On the other hand, in pattern 2, when pulse transmission is started, the leading edge of a pulse is transmitted in the immediate output mode. Immediately after the leading edge of a pulse is transmitted, transmission of the trailing edge of a pulse is set in the timed output mode.

FIG. 18B describes non-temporal interrupt handling (steps 1801 to 1803) performed on the motherboard 30 and temporal interrupt handling (steps 1811 to 1813). Accordingly to this embodiment, consecutive requests cannot be issued to the core board 40 during a period corresponding to a run unit (between step 1801 and step 1803 or between step 1811 and step 1813). In the case of pattern 2, a request for transmission in the immediate output mode (start of the pulse transmission) and a request for setting in the timed output mode (setting of the termination of the pulse transmission) are produced consecutively. Pulse transmission is configured to be performed on the assumption of the case.

(10) Pulse Transmission Request Process

An embodiment of the present invention can cope with various patterns of requesting pulse transmission using the comparator.

FIG. 19A shows a pattern for requesting pulse transmission during a single run unit. In pattern 1, pulse transmission is requested in the timed output mode and a comparison interrupt event is configured to take place. In pattern 2, the immediate output mode is changed to the timed output mode and the comparison interrupt event is configured to also take place. In pattern 3, pulse transmission is requested in the immediate output mode.

FIG. 19B shows a data format for a pulse transmission request having fields thereof associated with channels on which data items to be compared are transmitted. The data format includes a transmission setting time instant (timed output) field Tout, a timed-output transmission request field TMREQ, a timed-output transmission level field TMLVL, an immediate-output transmission request field IMMREQ, an immediate-output transmission level field IMMLVL, and a correction required-or-not field ADJ.

Figure 20A:
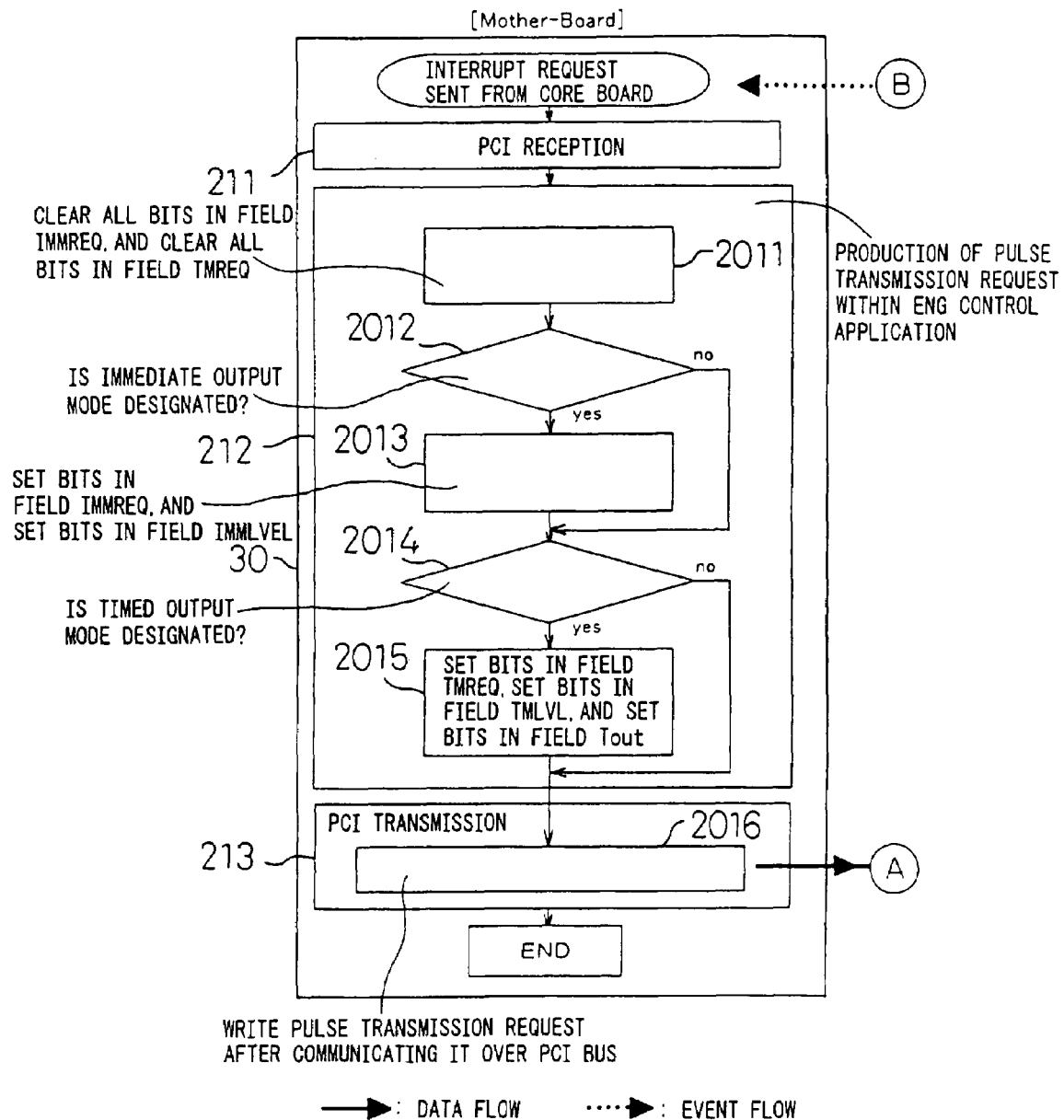
FIG. 20A and FIG. 20B are flowcharts describing details of a pulse transmission request transmission process using the patterns described in conjunction with FIG. 19A and FIG. 19B.
Figure 20B:
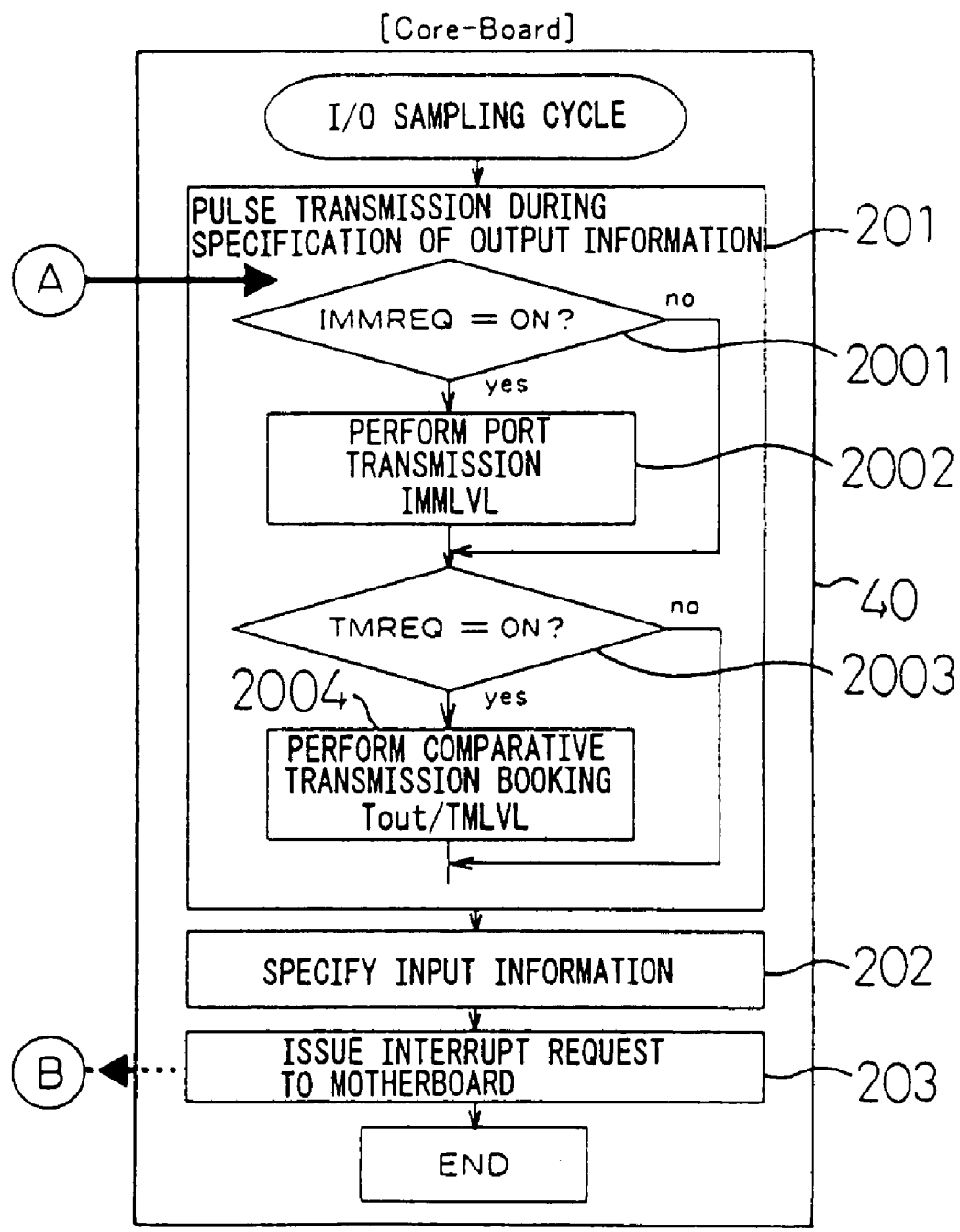

According to one embodiment of the present invention, processing to be described in FIG. 20A or FIG. 20B is performed relative to each data that is compared and transmitted on each channel. When the timer 48 on the core board 40 described in conjunction with FIG. 6 indicates the start of an I/O sampling cycle (for example, 100 μs), pulse transmission is performed as part of specifying output information at step 201. During the pulse transmission, it is verified at step 2001 whether an immediate-output transmission request field IMMREQ is placed in an on state. If the immediate-output transmission request field is in the on state, port transmission (IMMLVL) is performed at step 2002 and control is passed to step 2003. On the other hand, if it is verified at step 2001 that the immediate-output transmission request field IMMREQ is not placed in the on state, step 2002 is skipped and control is passed to step 2003.

At step 2003, it is verified whether a timed-output transmission request field TMREQ is placed in the on state. If the timed-output transmission request field is in the on state, comparative transmission setting (Tout/TMLVL) is performed at step 2004. On the other hand, if it is verified at step 2003 that the timed-output transmission request field TMREQ is not placed in the on state, step 2004 is skipped. At step 202, input information is specified. At step 203, an interrupt request is issued to the motherboard 30 and the routine is terminated.

In response to the interrupt request issued from the core board 40, the non-temporal interrupt handling is started on the motherboard 30. At step 211, the PCI communication software 32 performs PCI reception. At step 212, a pulse transmission request is produced within the ENG control application 31. The immediate-output transmission request field IMMREQ in the pulse transmission request has all the bits thereof cleared, and the timed-output transmission request field TMREQ therein has all the bits thereof cleared. At step 2012, it is verified whether the immediate output mode is designated. If the immediate output mode is designated, the immediate-output transmission request field IMMREQ has the bits thereof set and the immediate-output transmission level field IMMLVL has the bits thereof set at step 2013. Control is then passed to step 2014. If it is verified at step 2012 that the immediate output mode is not designated, step 2013 is skipped and control is passed to step 2014. At step 2014, it is verified whether the timed output mode is designated. If the timed output mode is designated, the timed-output transmission request field TMREQ has the bits thereof set at step 2014. Moreover, the timed-output transmission level field TMLVLL has the bits thereof set and the transmission setting time instant field Tout has the bits thereof set. Control is then passed from step 212 to step 213. If it is verified at step 2014 that the timed output mode is not designated, step 2015 is skipped and control is passed to step 2016. At step 2016, PCI transmission is performed. The pulse transmission request is written after communicated over the PCI bus 39 at step 2016.

(11) Pulse Transmission Correction Process

If pulse transmission is requested using the comparator so that the leading edge of a pulse will be transmitted in immediate output mode and the trailing edge thereof will be transmitted in timed output mode (pattern 2 in FIG. 18A), the leading edge of a pulse transmitted in accordance with the present invention lags behind the leading edge of a pulse transmitted in the actual ECU by a difference Td2 as shown in FIG. 21. The difference Td2 occurs because the actual ECU immediately raises a pulse in response to an immediate-output transmission request. However, according to one embodiment of the present invention, it is impossible to immediately raise a pulse in response to the immediate-output transmission request. According to one embodiment of the present invention, as shown in FIG. 20A, an immediate-output transmission request is issued from the motherboard 30 to the core board 40 over the PCI bus 39. Thereafter, a pulse is raised at the sampling timing at which sampling is performed on the core board 40. Therefore, delay of the actual transmission occurs by a delay time Td2 relative to issuance of a transmission request.

Both a pulse transmitted in the actual ECU and a pulse transmitted according to the present invention are output at a set time instant in response to a timed-output transmission request. Therefore, both the pulses drop at the same timing. When the pulse widths of the pulses have this difference, because an ignition timing that is significant in controlling an engine is equivalent to the timing of transmitting a pulse, no problem occurs. However, because a fuel injection quantity is determined with the pulse width of a transmitted pulse, the fuel injection quantity becomes different. This may pose a critical problem.

In order to correct the difference Td2, the processing to be described below is performed on the assumption that a request is made to transmit the leading edge of a pulse in the immediate output mode and to transmit the trailing edge thereof in the timed output mode (i.e. the verification of step 2012 in FIG. 20A is made in the affirmative, the verification of step 2014 is made in the affirmative, and both the immediate-output transmission request IMMREQ and timed-output transmission request TMREQ are specified). (a) The time instant at which an immediate-output transmission request is specified, that is, an immediate-output transmission request (A) issued as shown in FIG. 20A is latched (Treq). (b) A difference (Td2) of the time instant (Tnow), at which transmission is executed, that is, transmission is executed in response to the immediate-output transmission request shown in FIG. 20A, from the time instant (Treq) at which the immediate-output transmission request is issued is added to the timed-output transmission setting time instant. The delay time Td2 is expressed as follows:

Delay time $Td2 = Tnow - Treq$

As mentioned above, the difference Td2 between the leading edge of a pulse transmitted in the actual ECU as shown in FIG. 21 and the leading edge of a pulse transmitted according to an embodiment of the present invention is corrected as shown in FIG. 23. Consequently, both the pulses share the same pulse width. The pulse transmitted according to an embodiment of the present invention can therefore be used to initiate injection of fuel to an engine.

However, the foregoing correction may or may not be needed depending on the kind of output signal. For example, as far as the control of an engine is concerned, since the timing (ignition timing) of the trailing edge of a pulse of an ignition signal is significant, correction is unnecessary. In contrast, as an injection quantity is determined with the pulse width of a transmitted pulse of a fuel injection signal, the pulse width has a significant meaning. The aforesaid correction is therefore indispensable.

FIG. 23 shows a procedure of performing correction after it is verified based on the kind of signal whether correction is needed at the trailing edge of a pulse.

On the core board 40, when the timer 48 on the core board 40 described in conjunction with FIG. 6 indicates the start of an I/O sampling cycle, pulse transmission is performed as part of the specification of the output information. During the pulse transmission, it is verified at step 2301 whether correction is needed, whether the immediate-output transmission request field IMMREQ is placed in the on state, and whether the timed-output transmission request field TMREQ is placed in the on state. If all the results of this verification are affirmative, control is passed to step 2302, and the aforesaid correction is performed. On the other hand, if all the results of verification are not affirmative, the correction is not performed and control is passed to step 2303.

At step 2303, it is verified whether the immediate-output transmission request field IMMREQ is placed in the on state. If the immediate-output transmission request field is in the on state, immediate-output transmission is performed at step 2304. Control is then passed to step 2305. If it is verified at step 2303 that the immediate-output transmission request field IMMREQ is not in the on state, step 2304 is skipped and control is passed to step 2305.

At step 2305, it is verified whether the timed-output transmission request field TMREQ is placed in the on state. If the timed-output transmission request field is in the on state, comparative transmission setting is performed at step 2306. If it is verified at step 2305 that the timed-output transmission request field TMREQ is not in the on state, step 2306 is skipped. At step 232, input information is specified. At step 233, an interrupt request is issued to the motherboard 30, and the routine is terminated.

On the motherboard 30, the non-temporal interrupt handling is started in response to the interrupt request issued from the core board 40. At step 241, the PCI communication software 32 performs PCI reception. At step 242, a pulse transmission request is produced within the ENG control application 31. The immediate-output transmission request field IMMREQ in the pulse transmission request has all the bits thereof cleared at step 2401, and the timed-output transmission request field TMREQ has all the bits thereof cleared. At step 2402, it is verified whether the immediate output mode is designated. If the immediate output mode is designated, the immediate-output transmission request field IMMREQ has the bits thereof set at step 2403. Moreover, the immediate-output transmission level field IMMLVL has the bits thereof set, and the current time instant (Treq) is latched. Thereafter, control is passed to step 2404. If it is verified at step 2402 that the immediate output mode is not designated, step 2403 is skipped and control is passed to step 2404. At step 2404, it is verified whether the timed output mode is designated. If it is verified that the timed output mode is designated, the timed-output transmission request field TMREQ has the bits thereof set at step 2405. Moreover, the timed-output transmission level field TMLVLL has the bits thereof set and the transmission setting time instant field Tout has the bits set. Control is then passed from step 242 to step 243. If it is verified at step 2404 that the timed output mode is not designated, step 2405 is skipped and control is passed to step 243. At step 213, PCI transmission is performed. At step 2406, a pulse transmission request is written in a memory on the core board 40 after being communicated over the PCI bus 39.

In the foregoing examples, an electronically controlled engine has been described as an electronically controlled equipment for which a logic is developed using the microcomputer logic development system in accordance with embodiments of the present invention. Embodiments of the present invention can be effectively applied to development of the logic to be implemented in a built-in microcomputer to be incorporated in any other electronically controlled equipment. Furthermore, the microcomputer logic development system in accordance with embodiments of the present invention can be effectively adapted to, in addition to development of the logic to be implemented in a new-generation microcomputer, development of the logic to be implemented in a novel microcomputer. Furthermore, the microcomputer logic development system in accordance with embodiments of the present invention can be repeatedly reused for development of the logic to be implemented in different microcomputers by modifying a program to be stored in a memory on a motherboard, or increasing or decreasing the number of quasi microcomputer peripherals to be mounted on a core board according to a particular use.

FIG. 25 shows the software configuration (part of hardware is also shown) of the ECU 1 simulated by the microcomputer logic development system 20 in accordance with an embodiment of the present invention. The ECU 1 includes a motherboard 30 that realizes a feature equivalent to a microcomputer, a core board 40 that realizes features equivalent to microcomputer resources, and an interface board 50 that realizes features equivalent to the hardware of the ECU 1. The hardware of the ECU 1 signifies electric circuits other than the microcomputer.

An I/O driver (including a motherboard-side I/O driver 30D and a core board-side I/O driver 40D) that has a capability equivalent to the capability of a bus and via which the motherboard 30 or core board 40 is connected to the microcomputer resources is mounted on each of the motherboard 30 and core board 40. The motherboard 30 and core board 40 are connected to each other over a PCI bus 39 and a plurality of signal lines A and B. The signal line A is a one-channel interrupt signal line contained in the PCI bus 39. An interrupt request is issued from the core board 40 to the motherboard 30 over the signal line A. Over the signal line B, a sync signal is transmitted from the motherboard 30 to the core board 40.

The interface board 50 equivalent to the hardware of the ECU 1 accommodates a port allocation change board 52 and first to third standard circuits 53. Moreover, reference numeral 54 denotes an equivalent of the connector of the ECU 1. The interface board 50 and core board 40 are connected to each other over a harness 49 equivalent to a microcomputer port.

When electronically controlled equipment is an electronically controlled engine, two large software blocks, that is, an engine control application 31, and an I/O driver 30D via which I/O information is communicated between the application 31 and field-programmable gate arrays (FPGAs) 42 are installed on the motherboard 30. The engine control application 31 is divided into a block that contains arithmetic/logic operations alone and a block that contains both I/O operations and arithmetic/logic operations. The block that contains both I/O operations and arithmetic/logic operations substantially corresponds to software installed in an actual ECU. The block that contains arithmetic/logic operations alone implements a reviewed logic and is separated from the block that also contains I/O operations. The I/O drivers fall into the motherboard-side I/O driver 30D and core board-side I/O driver 40D. The I/O drivers synchronize the motherboard 30 and core board 40 by utilizing the signal line A linking the motherboard 30 and core board 40, and communicate I/O information over the PCI bus 39.

The block containing arithmetic/logic operations alone and nested within the engine control application 31 is for time-synchronous interrupt handling (temporal interrupt handling). The block containing both I/O operations and arithmetic/logic operations is subdivided into two pieces of processing, that is, time-synchronous interrupt handling and non-time-synchronous interrupt handling (non-temporal interrupt handling). The time-synchronous interrupt handling does not depend on an external state but is performed at regular intervals. On the other hand, the non-time-synchronous interrupt handling depends on the external state, that is, the driven state of an engine. The non-time-synchronous interrupt handling includes pieces of interrupt handling that handle, for example, an engine speed signal, a vehicle speed signal, a fuel injection timing signal, and an ignition timing signal respectively.

Herein, a phenomenon that varies depending on the external state shall be called an event. The non-time-synchronous interrupt handling can be said to be interrupt handling synchronous with an event whose information is detected from the external state.

As the time-synchronous interrupt handling and non-time-synchronous interrupt handling are performed within the engine control application 31 installed on the motherboard 30, the CPU 33 described in conjunction with FIG. 4 serves as a virtual microcomputer peripheral. The virtual microcomputer peripheral includes a virtual interrupt controller that causes a temporal interrupt and a non-temporal interrupt, and a virtual I/O register. The motherboard-side I/O driver serving as PCI communication software treats, as a data interrupt event information and I/O register data.

On the other hand, the quasi microcomputer peripherals 42 mounted on the core board 40 include, similarly to the conventional microcomputer peripherals 26 shown in FIG. 3, ports, a latch, a pulse width modulator (PWM), a serial interface, a comparator, and a capture area. Moreover, the core board-side I/O driver serving as PCI communication software treats, as data, interrupt event information and I/O register data. Furthermore, the core board 40 has a timer that initiates routing of an event.

Next, processes to be implemented in the microcomputer logic development system 20 in accordance with an embodiment of the present invention in which event information and data flow will be described in relation to concrete examples below. Herein, the processes include (1) a process of reflecting I/O information on application software, (2) a PCI communication process, (3) an inter-board communication synchronization process, and (4) a process of reducing an I/O cycle by dividing an application run unit.

In relation to the examples to be described below, the flow of an event is indicated with a solid-line arrow, and a data flow is indicated with an outline arrow.

(1) Process of Reflecting I/O Information on Application Software (1-1) Process of Running Software that Contains Both I/O Operations and Arithmetic/Logic Operations FIG. 26 is a timing chart concerning a process of running software that contains both I/O operations and arithmetic/logic operations. The software containing both I/O operations and arithmetic/logic operations perform transmission of data to a microcomputer through a port and reading of the port. FIG. 26 presents pieces of processing to be performed on the motherboard 30, PCI bus 39, and core board 40 along with the elapse of time. Incidentally, a plurality of core boards 40 may be used as illustrated. A case where the plurality of core boards is used will be described later. The present example will be described on the assumption that one core board 40 is used. Moreover, one operation cycle starts with input information finalization to be performed on the core board 40 and ends with output information specification. Since this operation cycle is repeated, a description will be made of the one operation cycle.

During one operation cycle, first, input information to sent to the mother board 30 is finalized on the core board 40, and placed on the PCI bus 39. When the input information is placed on the PCI bus 39, an interrupt request signal is transmitted to the motherboard 30 over the signal line A described in conjunction with FIG. 25. In response to the interrupt request signal received over the signal line A, the input information from the PCI bus 39 is acquired on the motherboard 30. This processing is pre-application processing. The input information is acquired from the core board 40 over the PCI bus 39 and reflected on the pieces of processing nested within the subsequent application.

The processing nested within the application (engine control software) installed on the motherboard 30 contains both I/O operations and arithmetic/logic operations. I/O information is gathered at the start or end of the run unit of the application, and communicated at a time over the PCI bus 39. Thus, the efficiency in data communication is improved. Herein, the run unit of the application refers to the entire processing to be activated relative to an interrupt event.

When the application is terminated, post-application processing is performed. The post-application processing is such that transmission requests resulting from the run of the application are gathered and transmitted to the core board over the PCI bus 39. When output information to be sent to the core board 40 is finalized on the motherboard 30, the output information is placed on the PCI bus 39. When the output information is placed on the PCI bus 39, a sync signal is transmitted to the core board 40 over the signal line B described in conjunction with FIG. 25. Consequently, it is notified that the output information has been placed on the PCI bus 39. On the core board 40, the output information is fetched from the PCI bus 39 according to the sync signal sent over the PCI bus 39. After the output information is fetched into the core board 40 over the PCI bus 39, the settings of the output facilities on the core board 40 are determined based on the output information.

In other words, in this example, input information is finalized on the core board 40 during pre-processing performed before the run unit of the application, and output information is finalized during post-processing. Consequently, I/O information is reflected on the application software. In the present example, a transmission request is finalized within one operation cycle, and a sync signal is transmitted from the motherboard 30 to the core board 40 over the signal line B. Thereafter, the motherboard 30 enters an I/O completion wait state until inputting/outputting is completed on the core board 40, and the motherboard 30 does not operate. The motherboard 30 does not restart operating until an interrupt request signal is transmitted from the core board 40 to the motherboard 30 over the signal line A during the next operation cycle.

FIG. 27 details acquisition of input information, the pieces of processing nested within the application, and transmission request finalization which are performed on the motherboard 30 shown in FIG. 26. Input information acquired over the PCI bus during input information acquisition (pre-processing performed by the I/O driver) contains input data such as an interrupt flag, a port level, a captured value, received data, and A/C-converted value. The interrupt flag is transmitted to the interrupt controller. The interrupt controller references the interrupt flag and activates the associated processing nested within the application. On the other hand, the input data is stored in a virtual register (RAM) 38.

The application has an application layer, an interface layer (APF layer) for providing the interface with the application, an ECU circuit-dependent layer (ECU layer), and a microcomputer-dependent layer (CPU layer). Necessary operations are performed within respective layers. When an output should be stored in the virtual register 38, the data resulting from the operations is stored in the virtual register 38, and the output is thus specified. Moreover, when input information is needed for operations, the input information is read from the virtual register 38.

When the application is terminated, a transmission request is finalized (post-processing performed by the I/O driver). During the post-processing by the I/O driver, an interrupt indicated with an interrupt flag returned to the interrupt controller is cleared, and a transmission request is acquired from the virtual register.

During the post-processing of the I/O driver, output information including a port level, an output of a comparator, an output of the pulse-width modulator, transmission data, communication activation data, and A/D activation data is transmitted to the core board over the PCI bus.

(1-2) Process of Running Software that Contains Arithmetic/Logic Operations Alone As mentioned above, the application installed on the motherboard 30 includes the processing that contains both I/O operations and arithmetic/logic operations, and the processing that contains arithmetic/logic operations alone. FIG. 28 lists the details of the pieces of processing. The processing containing both I/O operations and arithmetic/logic operations is subdivided into time-synchronous interrupt handling 1 and non-time-synchronous interrupt handling. The processing containing arithmetic/logic operations alone is time-synchronous interrupt handling 2. The time-synchronous interrupt handling 1 nested within the processing containing both I/O operations and arithmetic/logic operations is executed at regular intervals and does not depend on an external state. Moreover, the time-synchronous interrupt handling 1 includes I/O operations. The non-time-synchronous interrupt handling nested within the processing that contains both I/O operations and arithmetic/logic operations is executed synchronously with an event whose information is detected from an external state such as reception of an engine speed signal or a vehicle speed signal, the injection timing, or the ignition timing. The non-time-synchronous interrupt handling includes I/O operations. On the other hand, the time-synchronous interrupt handling 2 that is the processing containing arithmetic/logic operations alone is executed at regular intervals but does not depend on the external state. Moreover, the time-synchronous interrupt handling 2 does not include I/O operations.

FIG. 29 is a timing chart showing a process of running software that includes the processing containing both I/O operations and arithmetic/logic operations and the processing containing arithmetic/logic operations alone. The timing chart is identical to the one of FIG. 26 except that the processing containing arithmetic/logic operations alone is added. The processing containing both I/O operations and arithmetic/logic operations has been described in conjunction with FIG. 26. The description of the processing will therefore be omitted. The processing containing arithmetic/logic operations alone is activated at regular intervals irrespective of the operation of the core board 40.

As mentioned above, while I/O operations are performed on the core board 40, the processing containing both I/O operations and arithmetic/logic operations waits until the I/O operations are completed. In the present example, the processing containing arithmetic/logic operations alone is executed by utilizing a period during which the motherboard 30 waits for the completion of the I/O operations. Owing to the processing, the CPU on the motherboard 30 can be utilized effectively.

Figure 30:
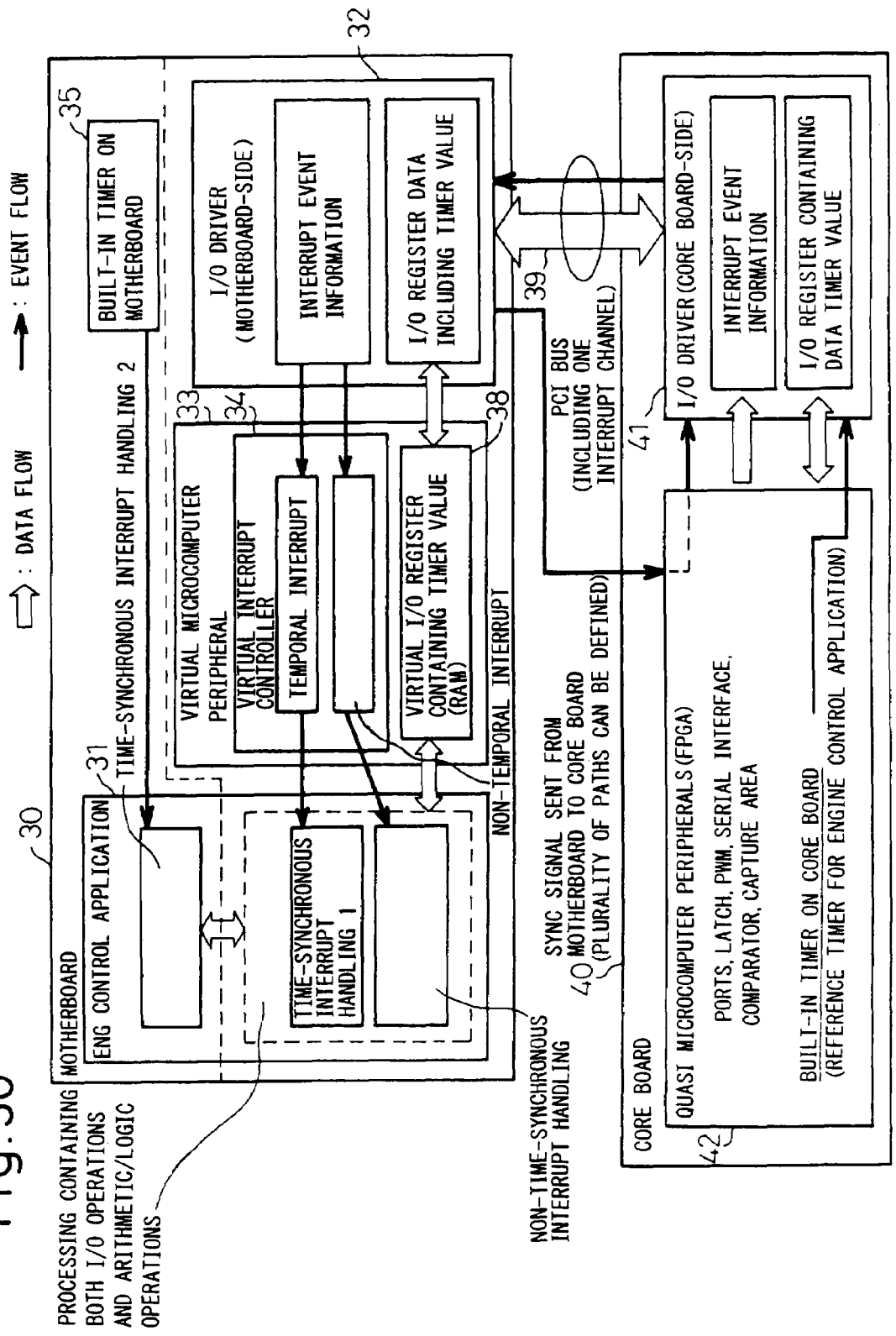
FIG. 30 is an explanatory diagram showing overall software configurations of a motherboard and core board included in a microcomputer logic development system in accordance with an embodiment of the present invention.

FIG. 30 shows the overall configuration of software that includes the processing containing both I/O operations and arithmetic/logic operations and the processing containing arithmetic/logic operations alone. The engine (ENG) control application 31 is divided into two blocks, that is, a processing block that contains both I/O operations and arithmetic/logic operations and a processing block that contains arithmetic/logic operations alone. The block containing both I/O operations and arithmetic/logic operations is activated while being synchronized with the operation of the core board 40 because the block transfers or receives I/O information to or from the core board 40. The block is subdivided into time-synchronous interrupt handling 1 and non-time-synchronous interrupt handling 2. Interrupt events are specified in interrupt flag information to be sent from the core board 40 and integrated into an interrupt signal to be sent from the core board 40. The processing block containing both I/O operations and arithmetic/logic operations is activated with the interrupt signal sent from the core board 40. The processing block containing arithmetic/logic operations alone is activated by the internal motherboard system.

For the purpose of performing pieces 1 and 2 of respectively the time-synchronous interrupt handling and the non-time-synchronous interrupt handling within the ENG control application 31 installed on the motherboard 30, the CPU 33 acts as a virtual microcomputer peripheral. The virtual microcomputer peripheral 33 includes a virtual interrupt controller 34 that generates a temporal interrupt and a non-temporal interrupt, and a virtual I/O register 38. The motherboard-side I/O driver 32 that is PCI communication software treats as data interrupt event information and I/O register data containing a timer value. An internal timer 35 is used for the time-synchronous interrupt handling 2. A timer value in the virtual I/O register 38 and a timer value on the PCI bus 39 will be described later.

On the other hand, quasi microcomputer peripherals 42 on the core board 40 include, similarly to the conventional microcomputer peripherals 26, ports, a latch, a pulse-width modulator (PWM), a serial interface, a comparator, and a capture area. Moreover, the core board-side I/O driver 41 that is PCI communication software treats as data interrupt event information and I/O register data including a timer value. Furthermore, the quasi microcomputer peripherals 42 include a built-in timer that causes an event to occur. Moreover, the PCI bus 39 includes a one-channel bus (signal line A shown in FIG. 25) over which an interrupt is directed.

Now, a description will be made of an example in which when the ENG control application 31 includes the processing that contains both I/O operations and arithmetic/logic operations and the processing that contains arithmetic/logic operations alone, the processing containing both I/O operations and arithmetic/logic operations is given priority in order to suppress a delay in the I/O operations performed on the core board 40.

Figure 31:
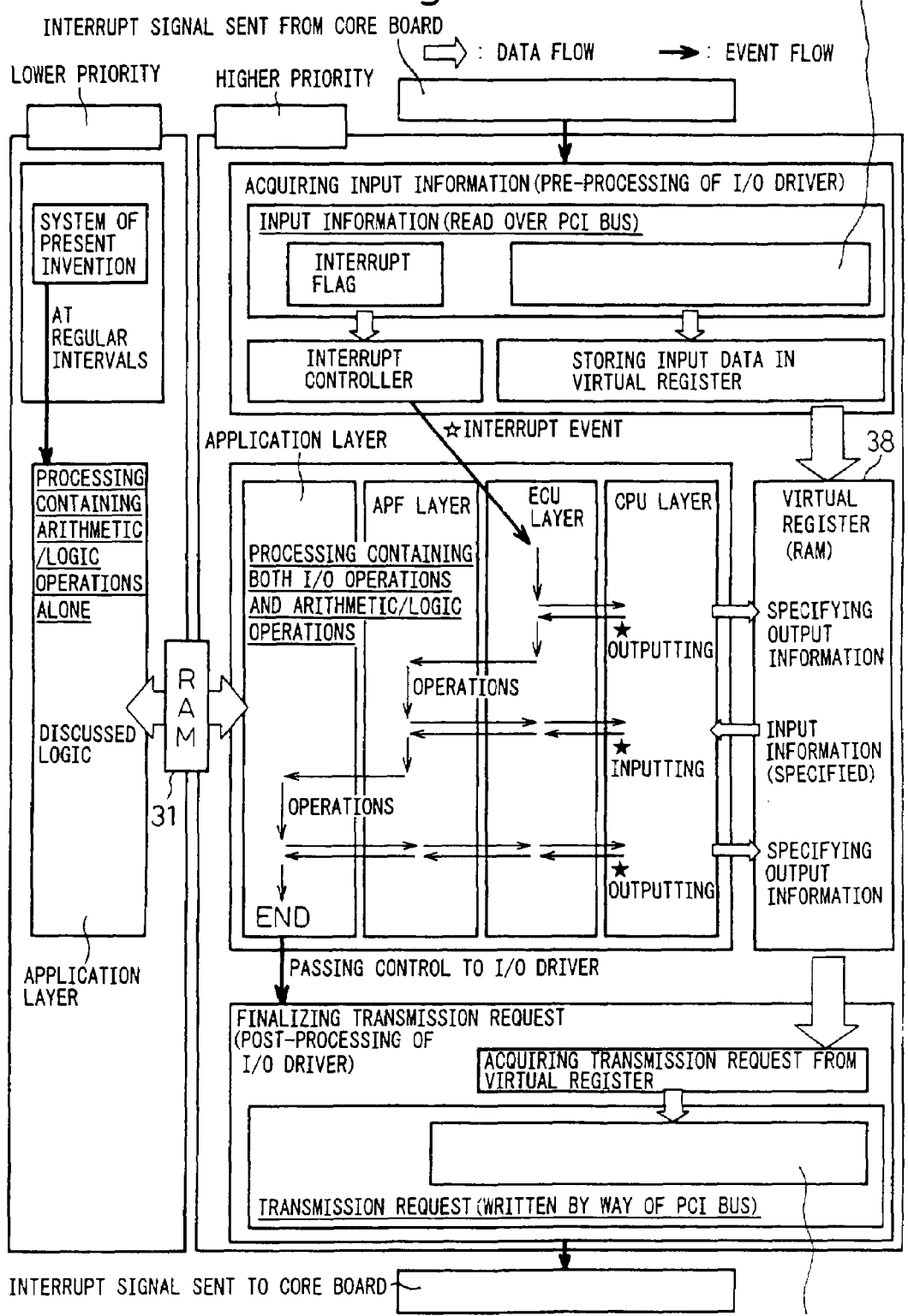
FIG. 31 is an explanatory diagram concerning priorities assigned to a block that performs processing containing both input/output operations and arithmetic/logic operations and that is realized on a motherboard included in a microcomputer logic development system in accordance with an embodiment of the present invention, and a block that performs processing containing arithmetic/logic operations alone.

FIG. 31 shows the software configuration including a block that contains both I/O operations and arithmetic/logic operations and a block that contains arithmetic/logic operations alone. The configuration of the block containing both I/O operations and arithmetic/logic operations is identical to the one described in conjunction with FIG. 27. The processing containing both I/O operations and arithmetic/logic operations is performed using a RAM (memory described in conjunction with FIG. 4) 31. The processing containing both I/O operations and arithmetic/logic operations is assigned a high priority because it transmits or receives data to or from the core board 40. The processing containing arithmetic/logic operations alone does not transmit or receive data to or from the core board 40 and is therefore assigned a low priority. The processing containing arithmetic/logic operations alone has an application layer (discussed logic) alone, and is activated at regular intervals within the system in accordance with the present invention. The processing containing arithmetic/logic operations alone transmits or receives the results of operations to or from the RAM 31. The regular interval is much longer than the aforesaid operation cycle and is, for example, 4 ms. FIG. 31 shows the processing containing both I/O operations and arithmetic/logic operations and being assigned the high priority in parallel with the processing containing arithmetic/logic operations alone and being assigned the low priority. The processing containing both I/O operations and arithmetic/logic operations and the processing containing arithmetic/logic operations alone are not performed concurrently. This will be described below.

Figure 32:
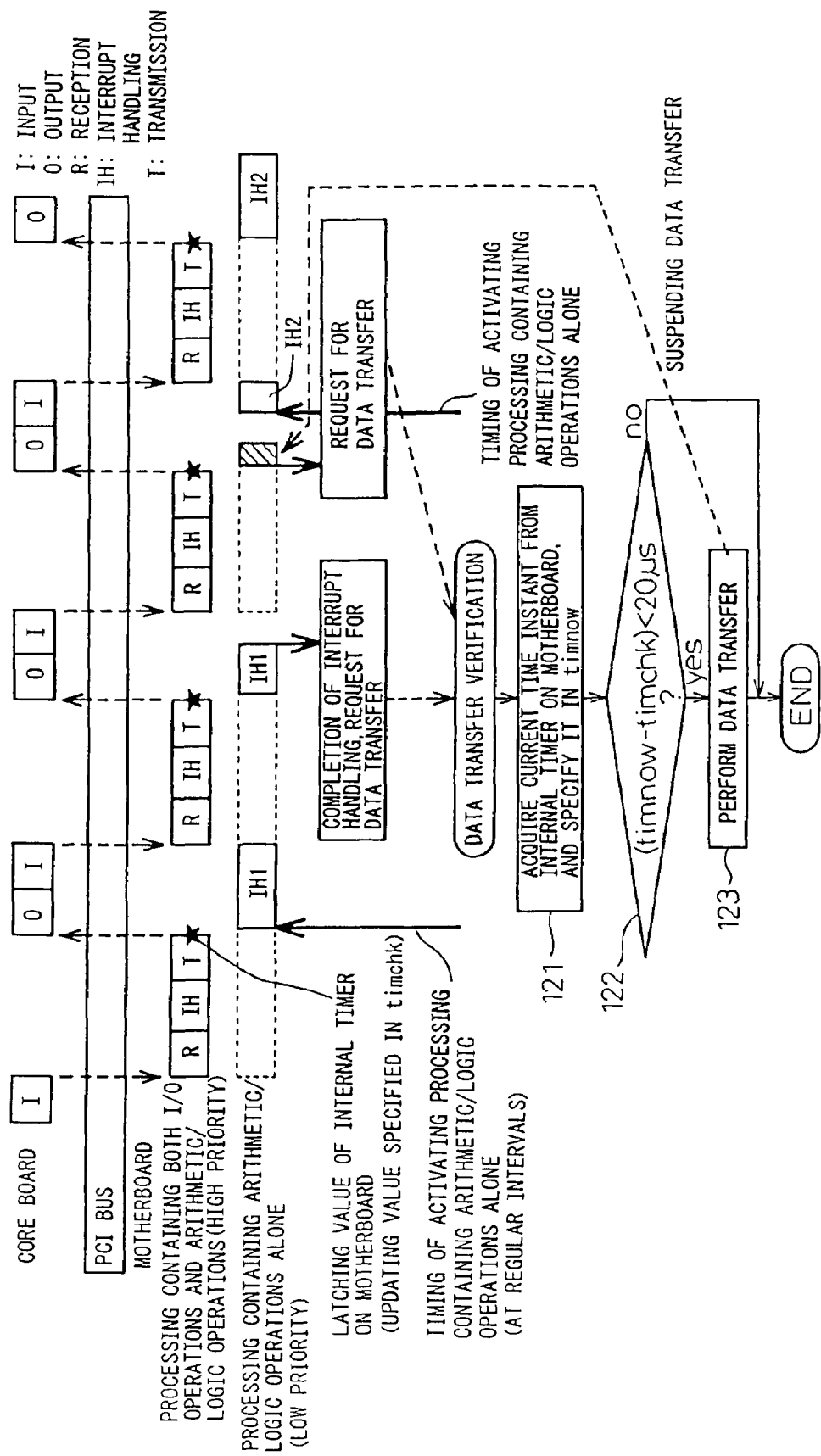
FIG. 32 is a timing chart concerning a communication process according to which a motherboard and core board communicate with each other on basis of the priorities described in conjunction with FIG. 31.

(1-3) Process of Transmitting Data Between Software Containing Both I/O Operations and Arithmetic/Logic Operations and Software Containing Arithmetic/Logic Operations Alone FIG. 32 is a timing chart showing along with the elapse of time the progress of data transfer between each of the core board 40, PCI bus 39, and motherboard 30 and each of the processing containing both I/O operations and arithmetic/logic operations and the processing containing operations alone. FIG. 32 shows how the concurrence of a plurality of data items is attained. Herein, data to be transferred is input/output data of the processing block containing arithmetic/logic operations alone, and is therefore transmitted or received before or after the run of the processing block containing arithmetic/logic operations alone. Incidentally, Input in FIG. 32 signifies input information shown in FIG. 26, Reception signifies acquisition of input information, and Interrupt Handling signifies the processing nested within the application and containing both I/O operations and arithmetic/logic operations. Interrupt Handling 1 or Interrupt Handling 2 signifies the processing nested within the application and containing arithmetic/logic operations alone. Transmission signifies finalization of a transmission request, and Output signifies acquisition of the transmission request. Interrupt Handling 1 or Interrupt Handling 2 signifying the processing nested within the application and containing arithmetic/logic operations alone is started at the activating timing that comes at regular intervals.

The processing block containing both I/O operations and arithmetic/logic operations is assigned a high priority and the processing block containing arithmetic/logic operations alone is assigned a low priority. In this state, an interrupt is handled. While the processing block containing arithmetic/logic operations alone is transferring data (copying data), an interrupt with which the processing block containing both the I/O operations and arithmetic/logic operations is activated may take place. When the interrupt takes place, data is updated in the course of transfer of the data by the processing block containing arithmetic/logic operations alone. The concurrence of data items cannot be attained. The interrupt must therefore be excluded. However, when interrupt inhibition is used to exclude an interrupt, an interrupt request issued from the core board 40 during interrupt inhibition (a request for activation of the processing block containing both the I/O operations and arithmetic/logic operations) may be invalidated. The interrupt inhibition cannot therefore be used.

In the present example, every after transmission performed by the processing block containing both I/O operations and arithmetic/logic operations is completed, the value (timchk) of the internal timer of the motherboard is latched and updated. When the processing block containing arithmetic/logic operations alone completes operations indicated with Interrupt Handling 1, data transfer is requested. Consequently, a data transfer verification routine is executed. At step 121, the value of the internal timer of the motherboard 30 is specified in timnow and acquired as a current time instant. At step 122, it is verified whether a difference calculated by subtracting the value timchk of the internal timer latched at the completion of Transmission performed by the processing block containing both I/O operations and arithmetic/logic operations from the current time instant timnow falls below 20 μs. If the difference is equal to or larger than 20 μs, data transfer is not carried out but the routine is terminated. If the difference falls below 20 μs, data transfer is carried out and the routine is terminated.

FIG. 32 is concerned with a case where the difference is equal to or larger than 20 μs. In this case, when the next transmission to be performed by the processing block containing both I/O operations and arithmetic/logic operations is completed, data transfer is requested again. The difference calculated at step 122 by subtracting the value timchk of the internal timer latched at the completion of the transmission performed by the processing block containing both I/O operations and arithmetic/logic operations from the current time instant timnow falls below 20 μs. Data transfer of step 123 is therefore carried out. The data transfer is performed as indicated with a hatched area in FIG. 32 during a period during which the motherboard having entered the next operation cycle waits for completion of I/O operations. The run of an application indicated with Interrupt Handling 2 to be performed by the processing block containing arithmetic/logic operations alone is started at the timing of activating the processing block containing arithmetic/logic operations alone after the completion of the data transfer.

As mentioned above, when the time, having elapsed from the termination of the transmission performed by the processing block containing both I/O operations and arithmetic/logic operations to the completion of immediately succeeding arithmetic/logic operations performed by the processing block containing arithmetic/logic operations alone, exceeds 20 µs, data transfer is not performed. This is because a reception to be performed next by the processing block containing both I/O operations and arithmetic/logic operations is started in the course of data transfer.

Next, a description will be made of a PCI communication process implemented in the microcomputer logic development system 20 in accordance an embodiment of with the present invention in which both event information and data flow.

Figure 33A:
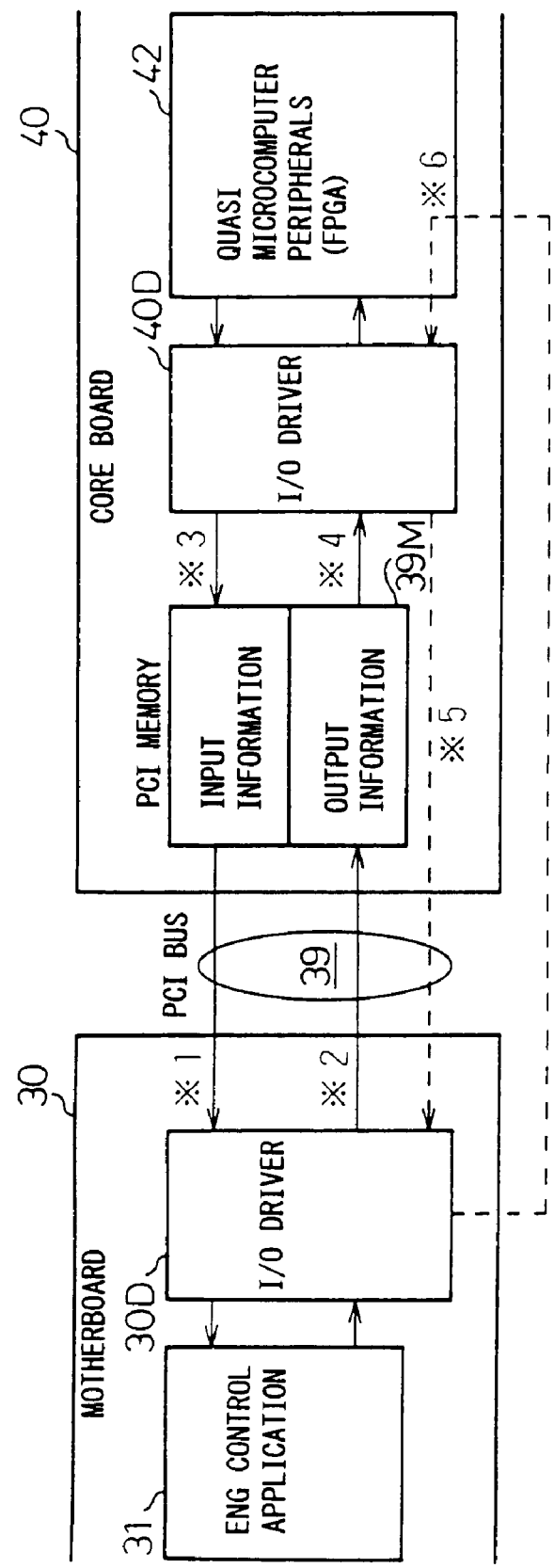
FIG. 33A shows a configuration for preventing destruction of PCI data.

(2) PCI Communication Process (2-1) Process of Preventing Destruction of PCI Data In the present example, as shown in FIG. 33A, a PCI memory 39M is included in the I/O driver 40D on the core board 40 in order to prevent destruction of PCI data. Data is read or written from or in a memory on the motherboard 30 over the PCI bus 39. In order to prevent collision of data items, the PCI memory 39M is divided into a memory area in which data (transmission request) to be transferred from the motherboard 30 to the core board 40 is stored and a memory area in which data (input information) to be transmitted from the core board 40 to the motherboard 30 is stored.

FIG. 33B describes the processing of the ENG control application 31 installed on the motherboard 30 and inputting/outputting to be performed on the core board 40 during each I/O sampling cycle (a standard time indicated by a core board timer). Incidentally, operations *1 to *6 in FIG. 33B correspond to operations *1 to *6 in FIG. 33A.

On the core board 40, input information is specified at step 131 during each I/O sampling cycle. The input information is acquired from the FPGAs 42, and stored in the PCI memory 39M. At step 132, an interrupt request is transmitted to the motherboard 30. At the next step 133, a transmission request to be sent from the motherboard 30 is waited. When the transmission request is received, output information is specified at step 134. The output information is acquired from the PCI memory 39M, and passed to the FPGAs 42. The routine is then terminated.

If an interrupt request is transmitted to the motherboard 30 at step 132 during inputting/outputting performed on the core board, the processing block containing both I/O operations and arithmetic/logic operations is started on the motherboard. PCI reception is performed at step 135. During the PCI reception, input information is read from the PCI memory 39M over the PCI bus 39, and released to the ENG control application 31. At step 136, time-synchronous interrupt handling 1 or non-time-synchronous interrupt handling is executed by running software installed in an actual ECU. At step 137, PCI transmission is performed. PCI transmission is such that output information resulting from calculation performed by the ENG control application 31 is written in the PCI memory 39M over the PCI bus 39. When writing of the output information in the PCI memory at step 137 is completed, a transmission request is issued to the core board 40 at step 138. The routine is then terminated.

On the motherboard, the processing block containing arithmetic/logic operations alone is activated at intervals of a predetermined time, for example, 4 ms indicated by a motherboard timer irrespective of the state of the core board. Time-synchronous interrupt handling 2 (discussed logic) is executed.

Figure 34:
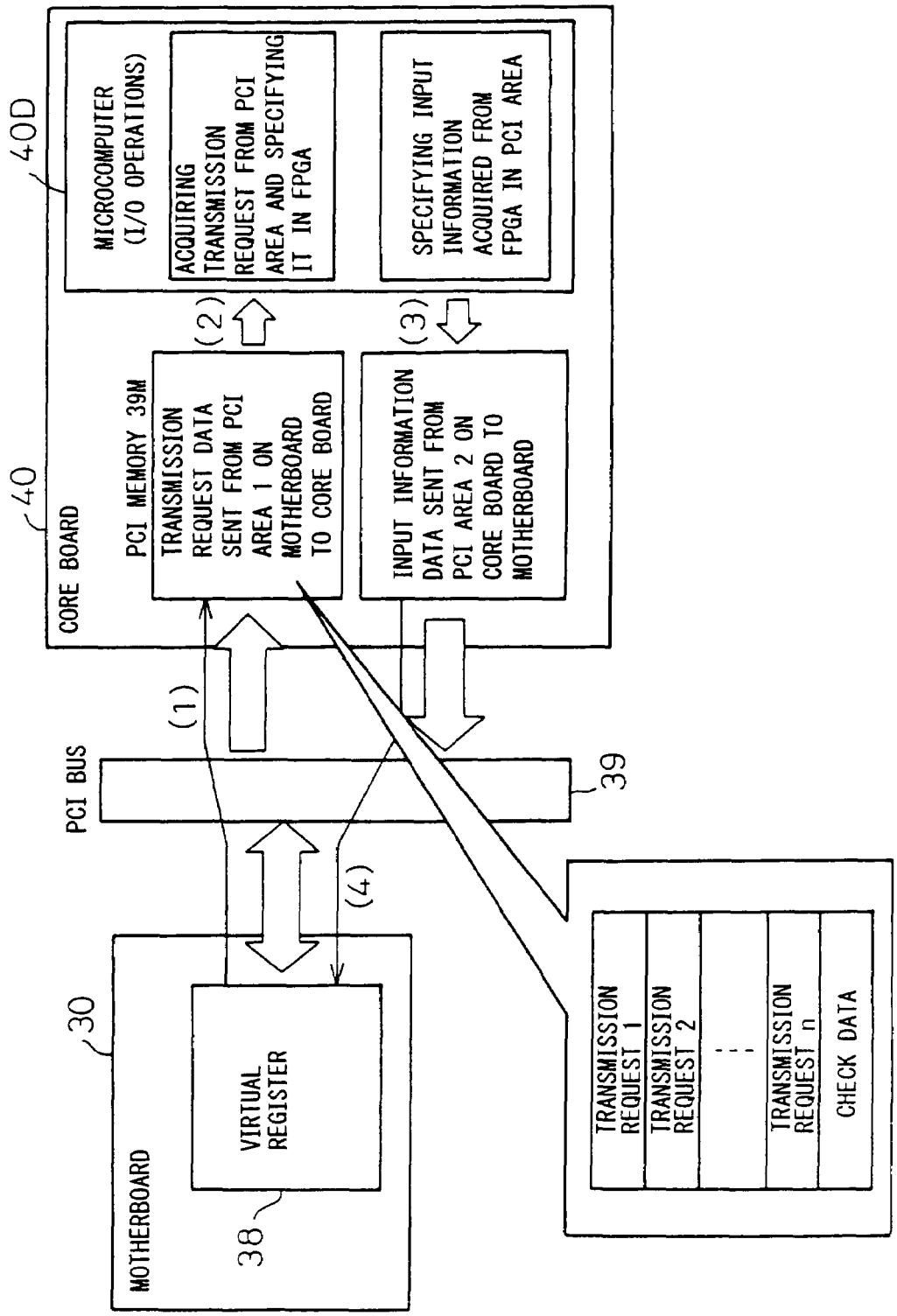
FIG. 34 is an explanatory diagram concerning a method for preventing destruction of PCI data which is adapted to a PCI communication process.

Now, a process of preventing destruction of PCI data will be described in conjunction with FIG. 34 and FIG. 35. In order to prevent destruction of PCI data, according to the present example, check data is, as shown in FIG. 34, appended to the end of transmission request data containing transmission requests 1 to n. Assuming that the transmission request data is, as indicated with line (1) in FIG. 34, read from the virtual register 38 on the motherboard 30 and written in an PCI area 1 in the PCI memory 39M on the core board 40 over the PCI bus 39, it is detected whether the check data is present. It is thus verified whether the data in the PCI memory 39 is fully finalized.

In the present example, after the data in the PCI memory 39M is fully finalized, the transmission requests are read from the PCI area as indicated with an arrow (2). The transmission requests are fetched into the microcomputer (I/O driver) 40D and specified in the FPGAs that are not shown. Consequently, the transmission requests will not be read before data is finalized. This obviates the possibility that a transmission request may assume an uncertain value.

FIG. 35 shows an example of a process of checking if data is finalized in the PCI memory 39M. While interrupt handling is being performed on the motherboard, transmission requests are produced at step 155 within the application. At step 156, the transmission requests are transmitted from the motherboard 30 over the PCI bus 39 and written in the PCI memory 39M. After all the transmission requests are written in the PCI memory 39M, the check data value is reversed at step 157. The resultant value is transmitted from the motherboard 30 over the PCI bus 39 and written in the PCI memory 39M on the core board 40.

On the core board 40, at step 151, the check data in the PCI memory 39M is checked to see if the value has been reversed. If the check data value is not reversed, step 151 is repeated until the check data value is found to have been reversed. If it is confirmed at step 151 that the check data value has been reversed, it is verified at step 152 that the transmission request data written in the PCI memory 39M over the PCI bus 39 has been finalized. Control is then passed to step 153. At step 153, the transmission requests are read from the PCI memory 39M. At step 154, the transmission requests are specified in the FPGAs and the routine is terminated. This process thus helps prevent destruction of PCI data.

(2-2) Process of Reducing a Load on PCI Communication

Referring back to the example shown in FIG. 26, if the data length of input information sent from the core board 40 to the motherboard 30 is large, a data length to be transmitted over the PCI bus 39 increases. This imposes a large load on the PCI communication and results in an increase in communication time. In this example, as shown in FIG. 36, input information to be sent from the core board 40 to the motherboard 30 is not transmitted as is. Changed values alone are sampled from the input information and placed as PCI data on the PCI bus 39. Thus, the data length to be communicated over the PCI bus 39 is reduced and the load on PCI communication is reduced. Moreover, a transmission request to be sent from the motherboard 30 to the core board 40 in order to request transmission of input information is not transmitted as is. Changed values alone are sampled from the transmission request, and placed as PCI data on the PCI bus 39. The data length to be communicated over the PCI bus 39 can be further reduced, and the load on the PCI communication can be further reduced.

In this case, the motherboard 30 and core board 40 are provided with an I/O information table that lists fully specified input information items or I/O information items to be transmitted as transmission requests. I/O information sampled and transmitted is restored to fully specified I/O information on the motherboard 30 or core board 40. Thus, only the data length to be communicated over the PCI bus 39 is reduced. This will be described in conjunction with FIG. 37.

FIG. 37 shows PCI communication from the motherboard 30 to the core board 40. The motherboard 30 and core board 40 are provided with a table listing fully specified I/O information items (listing all information items to be involved in an I/O operation). Each of data items recorded in the I/O information table is assigned an identification (ID) number. For brevity's sake, a description will be made on the assumption that the ID numbers assigned to I/O information items range from 1 to 8.

For example, a discussion will be made on a case where data items having ID numbers of 3 and 6 and contained in I/O information on the motherboard have changed, but the other data items have not changed. In this case, the data items having the ID numbers of 3 and 6 are sampled (compressed) from the I/O information, and placed as PCI data on the PCI bus 39. At this time, information signifying that the number of data items is 2 and that the ID numbers of the data items are 3 and 6, is transmitted as a header to the core board 40 over the PCI bus 39.

On the core board 40, the header appended to the data sent from the motherboard 30 over the PCI bus 39 is interpreted in order to record the data at a predetermined position in the fully-specified I/O information table (decompression). Owing to this process, a minimum number of data items is transmitted to thus reduce the load on the communication over the PCI bus 39.

(3) Process of Synchronizing Inter-Board Communication

Next, a description will be made of a process of synchronizing inter-board communication that can effectively suppress a time loss owing to the utilization of an interrupt signal line over which an interrupt signal is transmitted from the core board 40 to the motherboard 30 and a sync signal line over which a sync signal is transmitted from the motherboard 30 to the core board 40.

Figure 38A:
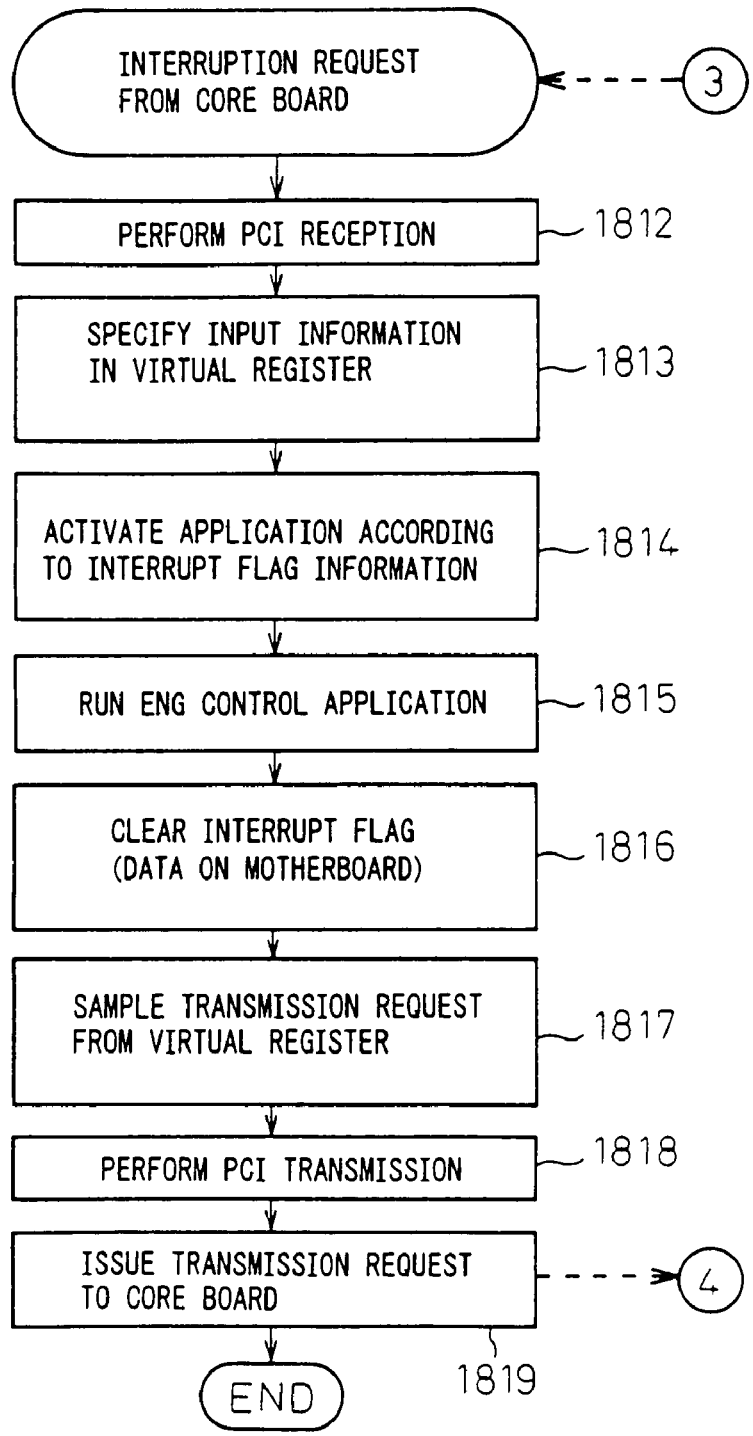

(3-1) Process of Synchronizing the Operation of the Motherboard with the Operation of the Core Board FIG. 38A and FIG. 38B describe a main routine to be executed on the core board 40 and a routine (processing containing both I/O operations and arithmetic/logic operations) that is executed on the motherboard 30 in response to an interrupt request issued from the core board 40.

Within the main routine executed on the core board 40, first, a reference time instant required by the engine control application is acquired as a timer value time at step 1801. At the next step 1802, a time interval between the previous time instant timeo and the current time instant time is calculated, and it is verified whether the time interval is larger than 1 ms. If the time interval is equal to or smaller than 1 ms, control is passed to step 1805. If the time interval exceeds 1 ms, a time-synchronous interrupt flag is set at step 1803. A time instant calculated by adding 1 ms to the previous time instant timeo is adopted as a new previous time instant timeo, and control is passed to step 1805. This processing is intended to not generate an accumulated error in the previous time instant timeo.

At step 1805, it is verified whether the time interval between the previous time instant timeo and the current time instant time falls below 0.9 ms. If the time interval is equal to or larger than 0.9 ms, control is returned to step 1801. If the time interval falls below 0.9 ms, control is passed to step 1806. This processing is intended to attain the time-synchronous timing. Communication between the motherboard 30 and core board 40 is inhibited during 0.1 ms preceding the time-synchronous timing. Other interrupt factors occurring during the inhibition period are transmitted to the motherboard at the succeeding time-synchronous timing.

At step 1806, input information is placed on the PCI bus 39. Thereafter, interrupt flag information and latch data are cleared unconditionally. This processing is intended to not miss data at the time of starting handshaking for communication. At step 1807, it is verified whether all interrupt flags are set to 0s (when an interrupt takes place, the flag is set to 1). If the interrupt flags are all set to 0s (no interrupt takes place), interrupt handling is not performed at all on the motherboard 30. The motherboard 30 and core board 40 need not communicate with each other. Control is therefore returned to step 1801. If it is verified at step 1807 that at least one interrupt takes place, control is passed to step 1808. At step 1808, an interrupt request is issued to the motherboard 30.

After an interrupt request is issued to the motherboard 30 at step 1808, it is verified at step 1809 whether a transmission request is issued from the motherboard 30. If no transmission request is issued, a wait state is established until a transmission request is issued from the motherboard 30. When a transmission request is received, control is passed to step 1810. At step 1810, it is checked if data stored in the PCI memory 39M over the PCI bus 39 has been finalized. The finalization is needed because a delay time arises after PCI data is specified on the motherboard 30 until the data is finalized. At the next step 1811, output information is specified in the FPGAs and control is returned to step 1801. The routine is repeated.

On the motherboard 30, the processing containing both I/O operations and arithmetic/logic operations is started in response to an interrupt request issued from the core board 40. At step 1812, input information is received over the PCI bus 39. At step 1813, the input information is specified in the virtual register 38. At step 1814, the application is activated based on the interrupt flag information. At step 1815, the ENG control application 31 is run. When the ENG control application 31 is terminated, the interrupt flag is cleared at step 1816. At step 1817, a transmission request is sampled from the virtual register 38. PCI transmission is performed at step 1818. At step 1819, a transmission request is issued to the core board 40. The routine is then terminated.

In the foregoing process, a signal indicating the time-synchronous timing is produced on the core board 30 and appended to the interrupt flag information. Moreover, if a plurality of flags is set at the same sampling timing, associated interrupts are arbitrated on the motherboard 30 according to the priorities assigned to the interrupts. FIG. 38 does not describe the routine that is the processing containing arithmetic/logic operations alone and being performed on the motherboard 30 because the routine has nothing to do with the state of the core board 40.

FIG. 39 is a timing chart showing the processing, described in FIG. 38, to be performed when an interrupt event takes place during a sampling period. An interrupt event occurring during a sampling period (capture interrupt, equal comparison interrupt, reception interrupt, etc.) is reflected on processing to be performed during the next sampling period. Moreover, interrupt event information is reflected on the interrupt flag and transmitted as input information from the core board 40 to the motherboard 30. On the motherboard 30, processing associated with each event is activated based on interrupt flag information. Incidentally, the sampling period or cycle varies depending on an amount of I/O information to be treated during the period or a throughput the motherboard 30 can offer.

FIG. 40 is a timing chart showing the processing described in FIG. 38 to be performed when occurrence of an interrupt event is discontinued. An interrupt event does not always take place during each sampling period. An interval between occurrences of an interrupt event may extend. Except for an interrupt event, the pieces of processing nested within the application on the motherboard 30 are not carried out. Communication of I/O information is not needed. Moreover, when no interrupt event takes place, no processing is performed in order to reduce a load on the communication.

FIG. 41 is a timing chart showing the processing described in FIG. 38 to be performed when a time-synchronous event takes place. Once communication is started, the next processing cannot be performed over approximately 100 μs. In the meantime, a time-synchronous event may take place. In this case, there is a possibility that the time-synchronous timing may change. In order to keep the timing of a time-synchronous event, the period of 100 μs long preceding occurrence of a time-synchronous interrupt event is defined as a communication start inhibition period. An interrupt event occurring during the period is reflected on immediately succeeding transmission of time-synchronous event information.

(3-2) Process of Distributing Inputting/Outputting to a Plurality of Core Boards FIG. 42 shows a data flow occurring when the motherboard 30 and a plurality of core boards 40 included in the microcomputer logic development system 20 in accordance with an embodiment of the present invention are synchronized with one another. The employment of the plurality of core boards 40 leads to improved extensibility of I/O data. Moreover, a processing time can be shortened. Moreover, when the plurality of core boards 40 performs I/O operations to achieve parallel processing, a load derived from inputting/outputting can be distributed among the core boards. In this example, the N core boards 40-1 to 40-N are connected in parallel with the motherboard 30 over the PCI bus 39. Moreover, in this example, PCI data to be transferred to the N-th core board 40-N contains data with whether interrupt handling is completed on the motherboard 30 can be checked.

(3-3) Process of Performing PCI Communication Among a Plurality of Core Boards

FIG. 43 is an explanatory diagram concerning a PCI communication process to be implemented in a scenario where a plurality of core boards 40 is used and synchronized with the motherboard 30 included in the microcomputer logic development system 20 in accordance with an embodiment of the present invention.

In the PCI communication process to be implemented in the scenario where one core board 40 is synchronized with the motherboard as described in FIG. 26, after the application is terminated on the motherboard 30, a transmission request is finalized and then written in a memory on the core board 40 over the PCI bus 39. I/O operations are thus performed. In contrast, according to the PCI communication process to be implemented in the case where N core boards 40-1 to 40-N are used as shown in FIG. 43, after the application is terminated on the motherboard 30, transmission requests to be issued to the first to N-th core boards 40-1 to 40-N are finalized on the motherboard 30. The transmission requests are then written in memories on the N core boards 40 over the PCI bus 39. I/O operations are then performed. Interrupt handling performed on the motherboard 30 be completed when a transmission request to be issued to the N-th core board 40-N is finalized. This is because when the transmission request to be issued to the N-th core board 40-N is finalized, the transmission requests to be issued to all the core boards are thought to have been finalized.

After the completion of interrupt handling performed on the motherboard 30 is confirmed because of the finalization of a transmission request to be issued to the N-th core board 40-N, a signal directing the start of inputting/outputting on each core board is issued. I/O operations are performed on the plurality of core boards 40-1 to 40-N, whereby parallel processing is achieved. When the I/O operations are terminated, a processing completion signal is issued from each core board. The AND of the processing completion signals issued from the first core board 40-1 to the N-th core board 40-N is calculated by hardware. When it is confirmed that the inputting/outputting is completed on all the core boards, an interrupt signal is issued to the motherboard 30.

(3-4) Process of Synchronizing a Plurality of Core Boards

FIG. 44 is a timing chart showing the control of a sync signal used to synchronize the motherboard 30 and core boards 40 included in the microcomputer logic development system 20 in accordance with an embodiment of the present invention. In this example, three core boards, first to third core boards, are employed.

When outputting is completed on the first to third core boards, a processing completion signal is activated (driven high) on each core board at the completion of outputting. When all the processing completion signals on all the core boards are activated, an entire-processing completion signal is activated. When the entire-processing completion signal is activated, the next inputting is performed on each core board. When inputting is started on each core board, the processing completion signals on the first to third core boards and the entire-processing completion signal are reset and driven low.

On the other hand, when inputting is completed on the first to third core boards, the processing completion signals on the core boards are activated (driven high) at the completion of inputting. When all the processing completion signals on all the core boards are activated, the entire-processing completion signal is activated. When the entire-processing completion signal is activated, it is checked if an interrupt event integration signal is produced on each core board. If no interrupt event takes place, inputting is restarted. This action is then repeated. When inputting is started on each core board, the processing completion signals on the first to third core boards and the entire-processing completion signal are reset and driven low.

Moreover, when an interrupt event takes place on any of the first to third core boards, an interrupt event integration signal (the OR of the processing completion signals on the core boards) is activated. When all the processing completion signals on the core boards are activated, it is checked if the interrupt event integration signal is active on each core board. If the interrupt event integration signal is active, an assumption is made that an interrupt event has taken place. An interrupt request is then issued to the motherboard 30.

Figure 45A:
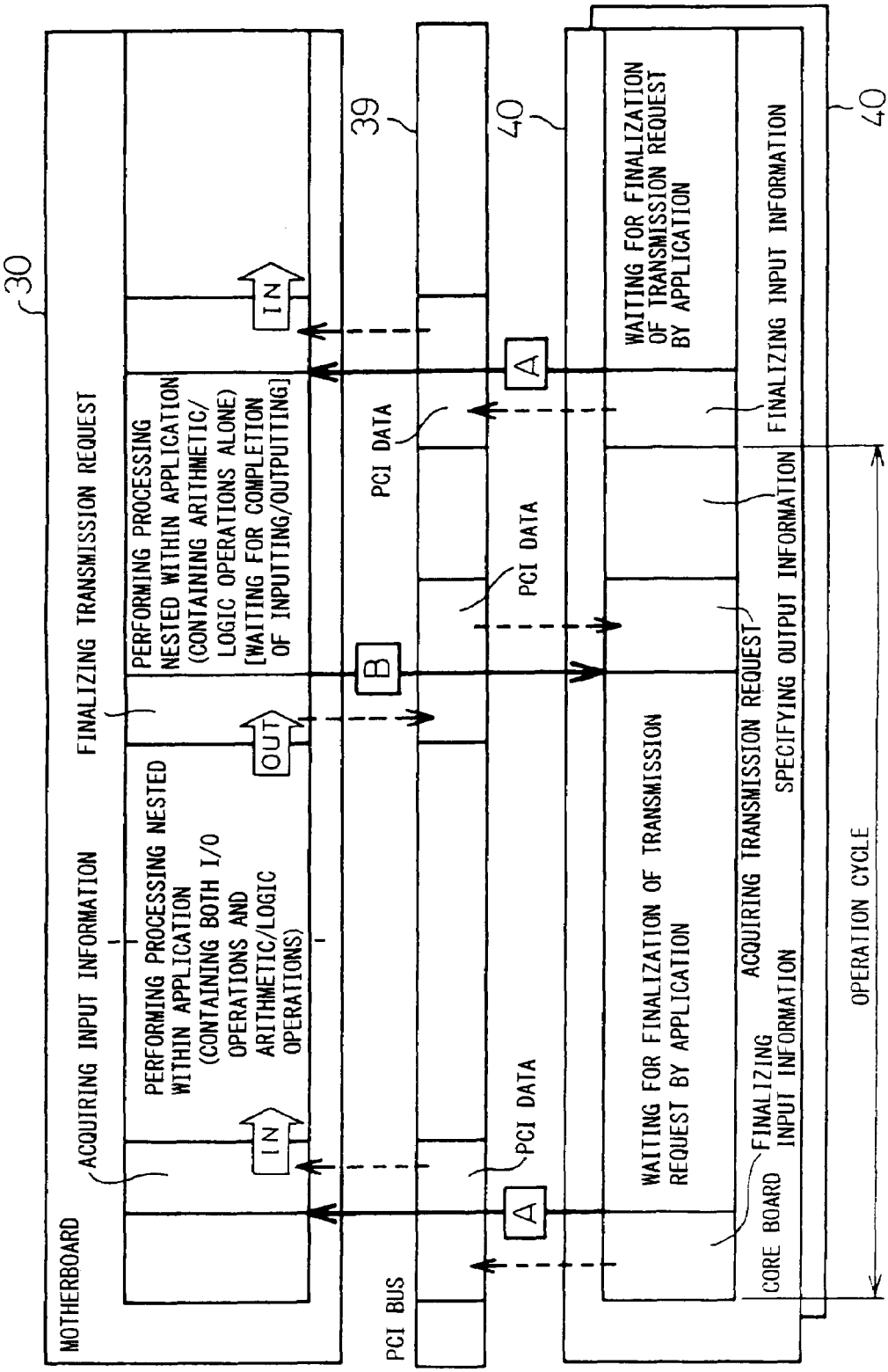

(4) Process of Shortening an Inputting/Outputting Cycle by Dividing the Run Unit of the Application (4-1) Process of Shortening an Operation Cycle by Dividing the Run Unit of the Application When the run unit of the application is large, the run unit shown in FIG. 45A is divided in order to shorten an operation cycle. At this time, when the run unit of the application is merely divided, a processing time required for I/O operations is not shortened. When the pieces of processing nested within the application are, as shown in FIG. 45B, divided into the processing assigned a high priority and the processing assigned a low priority, I/O operations assigned a high priority are performed earlier on the core board 40. Namely, important I/O operations relating to actual processing can be carried out earlier. Consequently, an operation cycle can be shortened. The time required until I/O information is reflected is shortened, and a response time is shortened.

(4-2) Process of Controlling an Interrupt with which the Application is Divided

In the engine control ECU 1, the processing containing both I/O operations and arithmetic/logic operations is divided into two portions, that is, time-synchronous interrupt handling and non-time-synchronous interrupt handling. Large-scale processing contained in the non-time-synchronous interrupt processing is crankshaft-synchronous interrupt handling that is performed based on an engine speed signal. The large-scale time-synchronous interrupt handling and crankshaft-synchronous interrupt handling are performed while being divided into portions assigned a plurality of priorities.

An interrupt flag associated with an interrupt event whose handling is divided will be described. Namely, as far as the time-synchronous interrupt handling or crankshaft-synchronous interrupt handling that is divided into portions is concerned, a plurality of interrupt flags is associated with one interrupt event. For example, a time-synchronous interrupt flag is 2 bits long and composed of a high-priority flag and a low-priority flag. A crankshaft-synchronous interrupt flag is also 2 bits long and composed of a high-priority flag and a low-priority flag.

This example will be described in conjunction with FIG. 46 in which the run unit of the application shown in FIG. 45B is divided but an operation cycle is identical to the one shown in FIG. 45B.

Referring to FIG. 46, when input information is finalized on the core board 40, if a time-synchronous event takes place, a flag of two bits long is set to "11" on the core board 40. The flag is transmitted as a time-synchronous interrupt flag "11", which is contained in input information, to the motherboard 30 over the PCI bus 39 as indicated with a dashed line S1. After the flag is transmitted to the motherboard 30, the internal data on the core board 40 changes. Namely, although PCI data remains "11," the internal flag changes from "11" to "01" with the high-priority flag bit cleared.

On the motherboard 30, based on the input information acquired over the PCI bus 30, high-priority interrupt handling (processing nested within the application) is activated as indicated with an arrow In. The flag associated with the activated interrupt handling is cleared. The internal data on the mother board 30 changes. Namely, although the PCI data remains "11," the internal flag changes from "11" to "01" with the high-priority flag bit cleared. Actions to be performed during a subsequent operation cycle are identical to those to be performed during an operation cycle shown in FIG. 45B.

When input information is finalized next on the core board 40, the input information is transmitted to the motherboard 30 as indicated with a dashed line S2. Thereafter, the internal data on the core board 40 is changed. Namely, the PCI data becomes "01" and the internal flag changes from "01" to "00" with the high-priority flag bit cleared. Thus, issuance of time-synchronous interrupt requests is completed. No time-synchronous interrupt request is issued until an event takes place next.

On the motherboard 30, based on the input information acquired over the PCI bus 30, interrupt handling is activated relative to interrupts in the order of descending priorities as indicated with an arrow In. The activated flag is cleared. The internal data on the mother board changes. Namely, the PCI data becomes "01" and the internal flag changes from "01" to "00" with the high-priority flag bit cleared.

As mentioned above, even when the high-priority interrupt flag bit is cleared, the low-priority flag bit is set to 1. An interrupt request is therefore issued from the core board 40 to the motherboard 30 at the next handling timing. Thereafter, when low-priority time-synchronous interrupt handling is executed, the low-priority flag bit is cleared. Consequently, the time-synchronous interrupt flag has all the bits cleared. No time-synchronous interrupt request is issued any longer at the next handling timing.

Figure 47A:
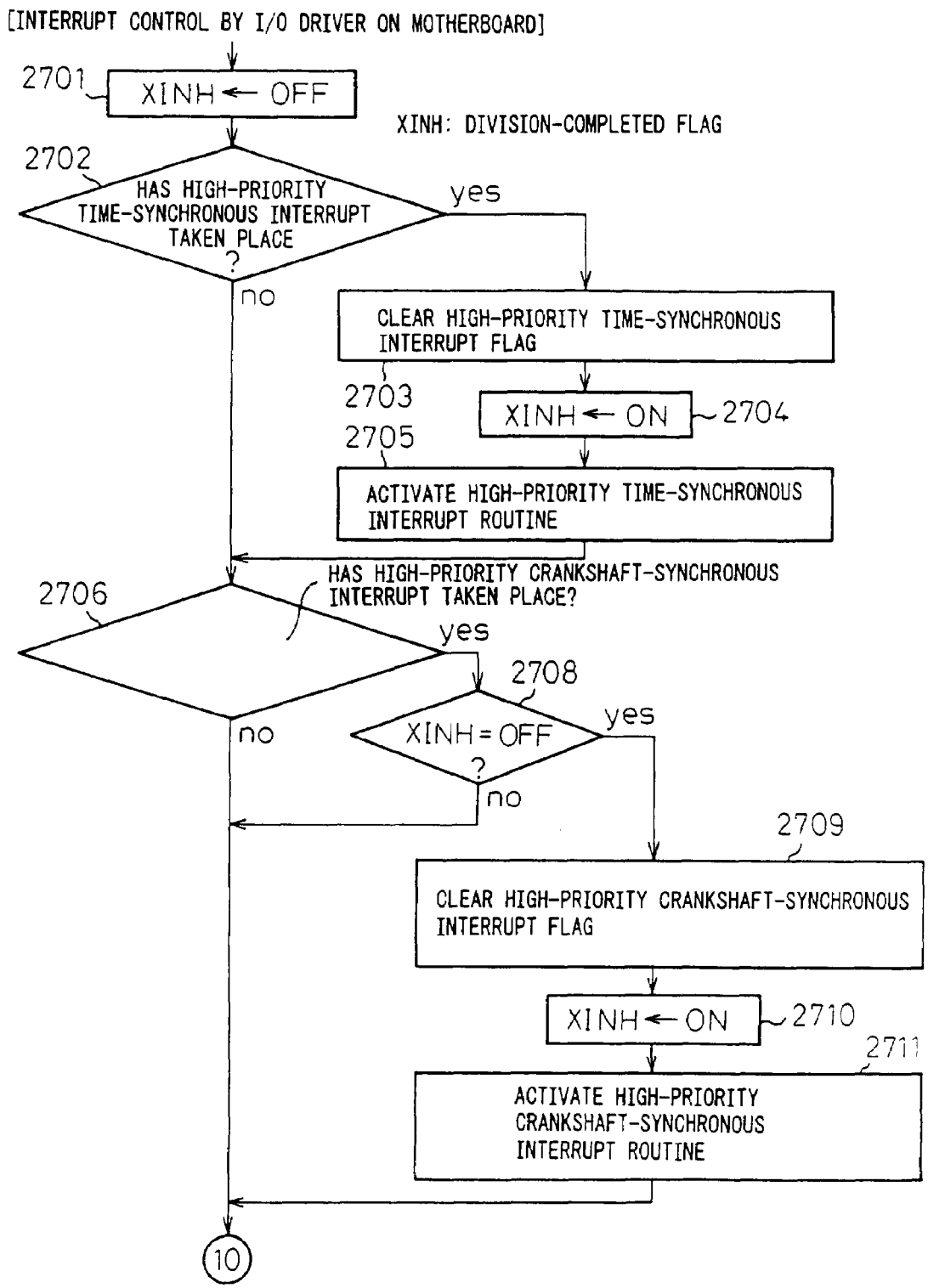
FIG. 47A and FIG. 47B are flowcharts describing actions of an interrupt controller included in a microcomputer logic development system in accordance with an embodiment of the present invention.
Figure 47B:
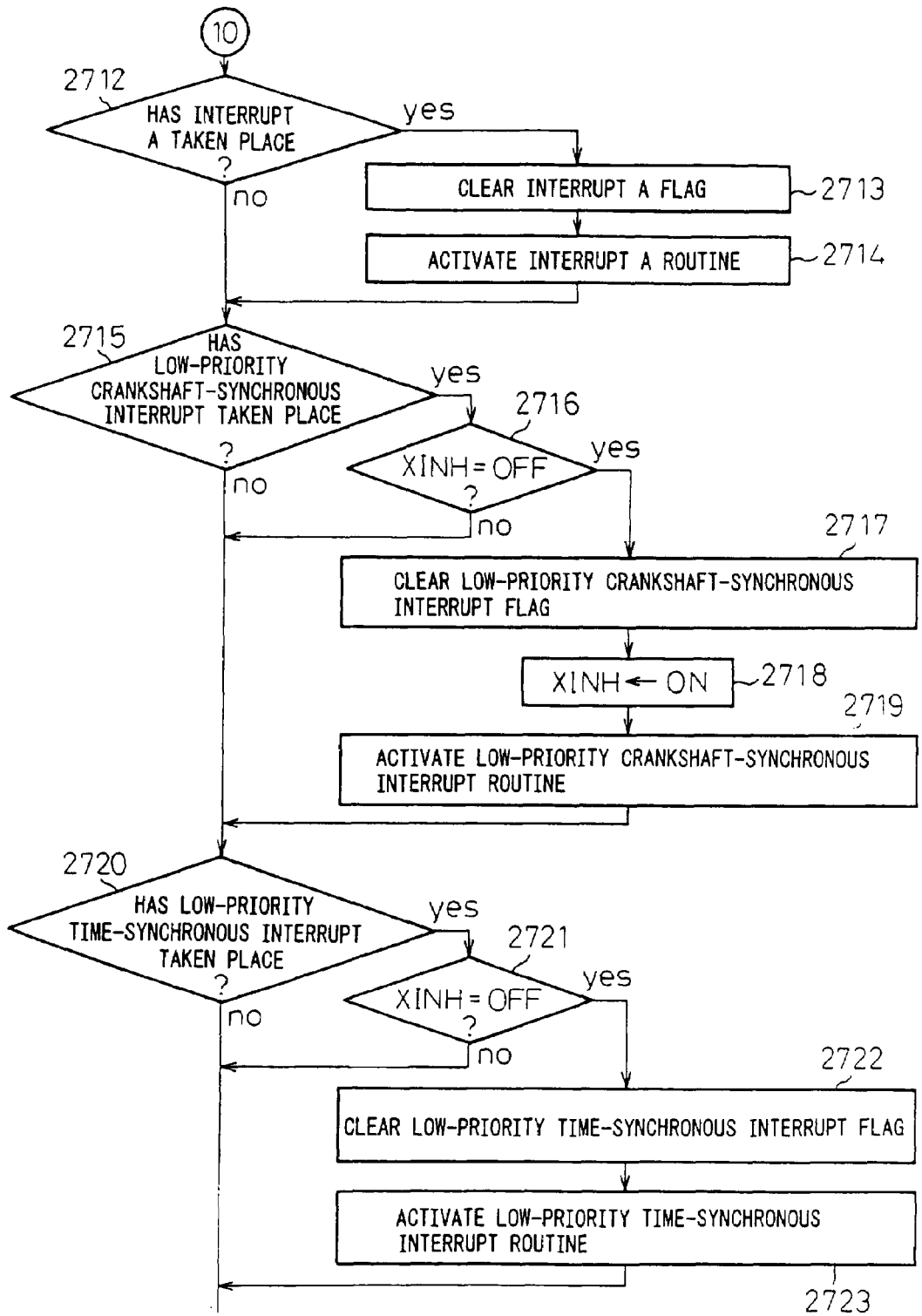
Figure 13:
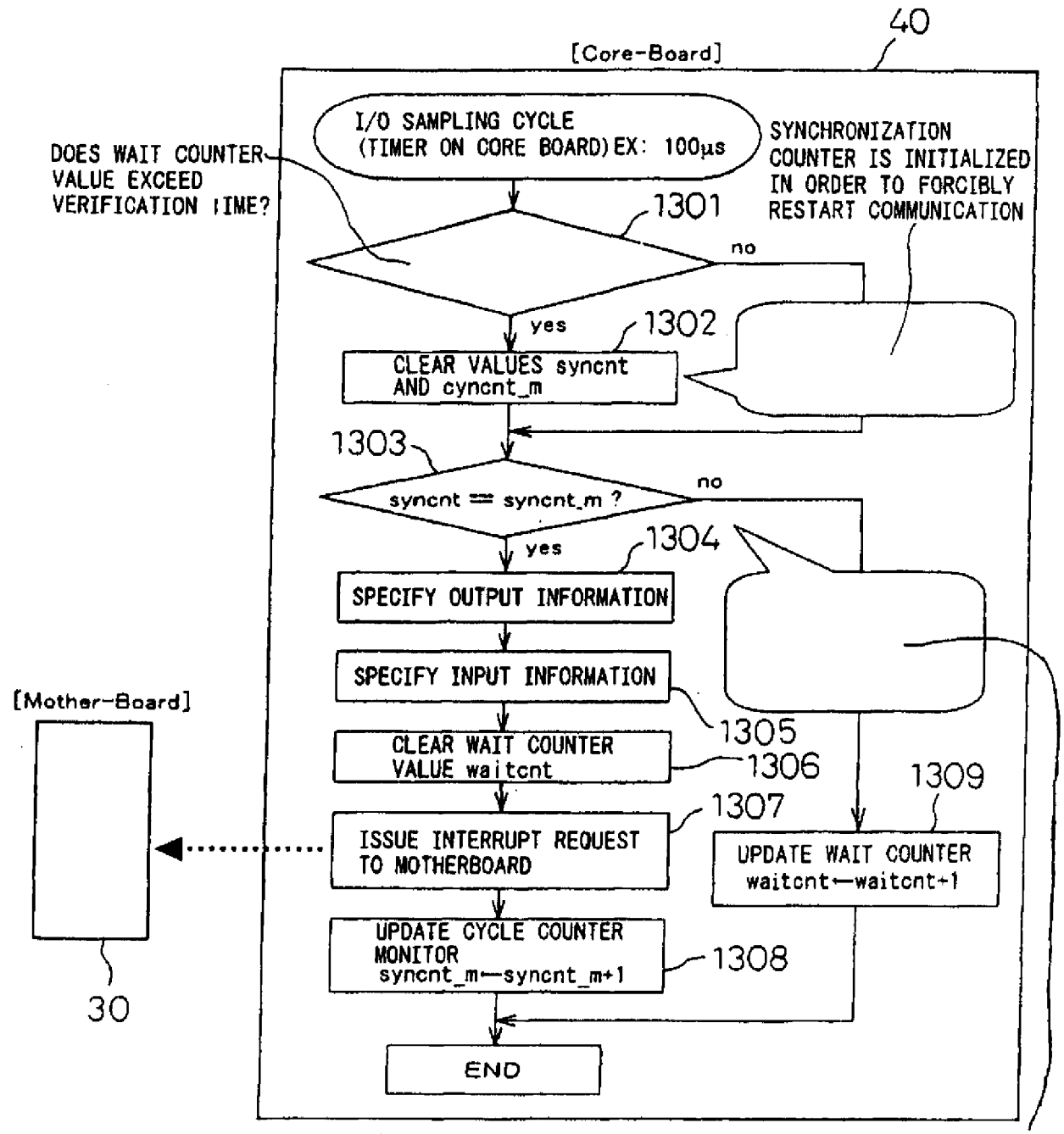

Next, time-synchronous interrupt handling is divided into high-priority time-synchronous interrupt handling and low-priority time-synchronous interrupt handling, and crankshaft-synchronous interrupt handling is divided into high-priority crankshaft-synchronous interrupt handling and low-priority crankshaft-synchronous interrupt handling. Furthermore, certain interrupt handling A is not divided but defined as a division exception. Descending priorities are assigned to the high-priority time-synchronous interrupt handling, high-priority crankshaft-synchronous interrupt handling, low-priority crankshaft-synchronous interrupt handling, and low-priority time-synchronous interrupt handling in that order. The flowcharts of FIG. 47A and FIG. 47B describe an example of an interrupt control procedure to be followed by the I/O driver 30D on the motherboard 30.

At step 2701, a division-completed flag XINH is set to an off state indicating that interrupt handling has not been divided. At step 2702, it is verified whether a high-priority time-synchronous interrupt has taken place. If the interrupt has taken place, the processing from step 2703 to step 2705 is carried out. At step 2703, the high-priority time-synchronous interrupt flag is cleared. At step 2704, the division completed flag XINH is set to an on state indicating that interrupt handling has been divided. At step 2705, the high-priority time-synchronous interrupt routine is activated and control is passed to step 2706. On the other hand, if it is verified at step 2702 that the high-priority time-synchronous interrupt has not taken place, the processing from step 2703 to step 2705 is skipped and control is passed to step 2706.

At step 2706, it is verified whether a high-priority crankshaft-synchronous interrupt has taken place. If the interrupt has taken place, control is passed to step 2708. It is then verified whether the division-completed flag XINH is set to the off state. When the high-priority time-synchronous interrupt routine is activated, the division-completed flag XINH is set to the on state at step 2704. The processing from step 2706 to 2711 is skipped and control is passed to step 2712. If it is verified at step 2706 that the high-priority crankshaft-synchronous interrupt has not taken place, control is passed to step 2712.

At step 2712, it is verified whether an interrupt handling A has taken place. If the interrupt has not taken place, control is passed to step 2715. If the interrupt has taken place, control is passed to step 2713. At step 2713, the interrupt handling A flag is cleared. At step 2714, the interrupt handling A routine is activated and control is passed to step 2715. As mentioned above, the interrupt handling A is a division exception. Therefore, even if the high-priority time-synchronous interrupt routine has been activated, the interrupt handling A routine is activated.

At step 2715, it is verified whether a low-priority crankshaft-synchronous interrupt has taken place. Even if the interrupt has taken place, it is verified at step 2716 that the division-completed flag XINH is set to the on state. Control is therefore passed to step 2720. The processing from step 2715 to step 2719 is skipped. Moreover, if it is verified at step 2715 that the low-priority crankshaft-synchronous interrupt has not taken place, control is passed to step 2720.

At step 2720, it is verified whether a low-priority time-synchronous interrupt has taken place. Even when the interrupt has taken place, it is verified at step 2721 that the division-completed flag XINH is set to the on state. The processing from step 2722 to step 2723 is skipped and the routine is terminated. Moreover, even when it is verified at step 2720 that the low-priority time-synchronous interrupt has not taken place, the routine is terminated.

As mentioned above, the high-priority crankshaft-synchronous interrupt handling, low-priority crankshaft-synchronous interrupt handling, and low-priority time-synchronous interrupt handling are not executed when interrupt handling assigned a higher priority has been activated.

The high-priority crankshaft-synchronous interrupt handling is activated in a case where after the division-completed flag XINH is set to the off state at step 2701, it is verified at step 2702 that the high-priority time-synchronous interrupt has not taken place (the interrupt flag is not set from the beginning or cleared at step 2704). In this case, control is passed from step 2706 to step 2708. Since the verification of step 2708 is in the affirmative, the processing from step 2709 to step 2711 is carried out. At step 2709, the high-priority crankshaft-synchronous interrupt flag is cleared. At step 2710, the division-completed flag XINH is set to the on state. At step 2711, the high-priority crankshaft-synchronous interrupt routine is activated and control is passed to step 2712. Thus, after the high-priority crankshaft-synchronous interrupt routine is activated, the low-priority crankshaft-synchronous interrupt handling and low-priority time-synchronous interrupt handling are not carried out until control is passed to step 2701 again.

The low-priority crankshaft-synchronous interrupt handling is activated in a case where, after the division-completed flag XINH is set to the off state at step 2701, it is verified at step 2702 that the high-priority time-synchronous interrupt has not taken place and it is verified at step 2706 that the high-priority crankshaft-synchronous interrupt has not taken place. In this case, control is passed from step 2715 to step 2716. As the verification is made in the affirmative at step 2716, the processing from step 2717 to step 2719 is carried out. At step 2717, the low-priority crankshaft-synchronous interrupt flag is cleared. At step 2718, the division-completed flag XINH is set to the on state. At step 2719, the low-priority crankshaft-synchronous interrupt routine is activated and control is passed to step 2720. After the low-priority crankshaft-synchronous interrupt routine is activated, the low-priority time-synchronous interrupt handling is not executed until control is passed to step 2701 again.

The low-priority time-synchronous interrupt handling is activated in a case where, after the division-completed flag XINH is set to the off state at step 2701, it is verified at step 2702 that the high-priority time-synchronous interrupt has not taken place and it is verified at step 2715 that the low-priority crankshaft-synchronous interrupt has not taken place. In this case, control is passed from step 2720 to step 2721. As verification is made in the affirmative at step 2721, the processing of step 2722 and step 2723 is carried out. At step 2722, the low-priority time-synchronous interrupt flag is cleared. At step 2723, the low-priority time-synchronous interrupt routine is activated. This routine is then terminated.

In the foregoing examples, an electronically controlled engine has been described as electronically controlled equipment for which the microcomputer logic development system in accordance with embodiments of the present invention is used for development. The present invention can be effectively applied to development of a built-in microcomputer to be incorporated in any other electronically controlled equipment. Furthermore, the microcomputer logic development system in accordance with embodiments of the present invention can be applied not only for development of a new-generation microcomputer but also to development of a novel microcomputer. Furthermore, the microcomputer logic development system in accordance with the present invention can be repeatedly reused for development of different microcomputers by modifying a program to be stored in a memory on a motherboard or increasing or decreasing the number of quasi microcomputer peripherals to be mounted on a core board according to a particular use.

A microcomputer logic development system in accordance with embodiments of the present invention can solve problems underlying development of a logic, and offer the throughput required to deal with novel or new-generation logic. Moreover, the microcomputer logic development system can offer the same assortment of microcomputer peripheral resources as the one to be included in a new-generation system. Consequently, the microcomputer logic development system makes it possible to develop a built-in microcomputer, in which novel logic or new-generation logic can be implemented, in a short period of time. Moreover, the microcomputer logic development system in accordance with embodiments of the present invention can be repeated reused for development of microcomputers. This contributes to reduction in the cost of development.

Furthermore, the microcomputer logic development system in accordance with embodiments of the present invention solves the problems underlying development of logic. Consequently, reliable communication of I/O information between a motherboard and a core board can be realized, and the speed of I/O information communication can be raised. Moreover, the throughputs of the motherboard and core board can be improved. Thus, the microcomputer logic development system in accordance with embodiment of the present invention is provided as a development system capable of coping with a higher-performance engine control system. Moreover, the microcomputer logic development system in accordance with embodiments of the present invention can be repeatedly reused for development of microcomputers. This contributes to a reduction in the cost of development.

What is claimed is:

1. A system for developing logic to be implemented in a built-in microcomputer that is used while being incorporated in an electric control unit, comprising:
    a center block including at least a first central processing unit that processes the logic, a first memory in which data including a program in which the logic is implemented is stored, a first interface via which said center block communicates with the outside, and a first internal bus over which said first central processing unit, said first memory, and said first interface are interconnected;
    a peripheral block including simulated microcomputer peripheral devices, a second interface via which said peripheral block communicates, and a second internal bus over which said simulated microcomputer peripheral devices and said second interface are interconnected; and
    an internal bus over which said center block and peripheral block are interconnected, wherein;
    said center block, said peripheral block, and said interface bus are substituted for said built-in microcomputer in order to implement the logic, wherein said peripheral block further includes a second central processing unit, wherein a control application composed of a temporal interrupt handling application that is run at regular intervals and a non-temporal interrupt handling application that is run irrespective of time with every occurrence of a predetermined event is stored in said first memory; wherein said first central processing unit has a virtual interrupt controller facility that performs at least temporal interrupt handling and non-temporal interrupt handling; wherein communication software that transmits or receives at least data and interrupt event information over said interface bus is installed in said first interface; wherein said second central processing unit communicates with said first interface using a second memory and a second interface to transfer an interrupt event and data over said interface bus, and said simulated microcomputer peripheral devices include input facilities and output facilities, wherein said input facilities include an input port, a latch port, an A/D converter, and a capture area, and said output facilities include an output port, a pulse transmitter, a comparator, and a serial interface, wherein said control application is configured to issue a pulse transmission request using said comparator in response to an interrupt request issued from said peripheral block; to transmit the pulse transmission request in at least one of immediate output mode in which a general output port facility included in an output terminal of said comparator is selected in order to immediately transmit the pulse transmission request, to select a timed output mode in which a comparative transmission facility is included in the output terminal of said comparator, and to determine a transmission time instant and a transmission level in order to set transmission, wherein said simulated microcomputer peripheral devices included in said peripheral block are capable of handling any combination of pulse transmission requests transmitted from said control application in said immediate output mode or said timed output mode, and wherein a delay time elapsing from the issuance of the pulse transmission request from said control application in said immediate output mode or said timed output mode to an actual transmission thereof to said peripheral block over said interface bus is corrected, and wherein the delay time is derived from said interface bus.

2. A system according to claim 1, wherein said second central processing unit has a throughput lower than that of said first central processing unit and which performs communication over said interface bus, and said peripheral block further includes a second memory in which data to be communicated is stored.

3. A system according to claim 1 or 2, further comprising an interface circuit block including input/output circuits, wherein:

said microcomputer logic development system is capable of being substituted for said electronic control unit with said interface circuit block connected to said peripheral block.

4. A system according to claim 3, wherein said center block, peripheral block and interface circuit block are formed with general-purpose circuit boards.

5. A system according to claim 2, wherein said second memory includes a common memory connected on said interface bus, and an internal memory connected to said second internal bus.

6. A system according to claim 1, wherein said center block includes a first timer.

7. A system according to claim 6, wherein said peripheral block includes a second timer used to manage time.

8. A system according to claim 1, further comprising a second simulated peripheral device added to said simulated peripheral devices included in said peripheral block.

9. A system according to claim 1, wherein:

said second memory includes a common memory connected on said interface bus; and said simulated microcomputer peripheral devices transmit or receive data to or from said temporal interrupt handling application and said non-temporal interrupt handling application, which are stored in said first memory, by way of said common memory and said interface bus.

10. A system according to claim 9, wherein:

said common memory includes a communication synchronization counter; and transmission and reception of data between said quasi microcomputer peripheral devices and said non-temporal interrupt handling application are synchronized based on said communication synchronization counter.

11. A system according to claim 1, wherein:

correction of the delay time is performed only on a type of signal for which the delay time is set to be corrected.

12. A system according to claim 1, wherein said microcomputer is used to control an internal combustion engine.

13. A system for developing logic to be implemented in a built-in microcomputer that is used while being incorporated in an electronic control unit, said system comprising:

a center block that includes a fast computing facility, a memory, and a communication facility;

a peripheral block that includes simulated microcomputer peripheral devices, a computing facility, and a communication facility, and that is connected to said center block over a PCI bus;

and an interface circuit block that includes circuits equivalent to hardware of an electronic control unit and that is connected to said peripheral block, wherein:

when said center block executes an application, at the start or end of a run unit of the application corresponding to a process that is nested within the application and that contains both arithmetic/logic operations and input/output operations relative to said memory, input/output information treated during input/output operations is gathered and communicated at one time to said peripheral block over said PCI bus, wherein said center block includes a first block to execute the process that is nested with the application and that contains both arithmetic/logic operations and input/output operations, and a second block to execute a process that is nested within the application and that contains arithmetic/logic operations alone, and wherein said center block is configured to give priority to the process nested within the application and executed by said first block over the process nested within the application and executed by said second block.

14. A system according to claim 13, wherein said center block transmits or receives information, which is treated during the input/output operations included in the process nested within the application and executed by said first block, synchronously with said peripheral block.

15. A system according to claim 13, wherein the process executed by said first block is divided into a time-synchronous interrupt handling portion that does not depend on an external state and contains input/output operations, and a non-time-synchronous interrupt handling portion that is executed synchronously with an event detected from an external state.

16. A system according to claim 15, wherein:
information about the event is contained in an interrupt flag information included in an interrupt signal to be transferred from said peripheral block to said center block; and wherein when said first block activates the input/output operations and the arithmetic/logic operations in response to triggering of the interrupt signal, said first block handles each interrupt according to the interrupt flag information.

17. A system according to claim 15 or 16, further comprising an interrupt signal line over which an interrupt signal is sent from said peripheral block to said center block, and a sync signal line over which a sync signal is sent from said center block to said peripheral block between said center block and said peripheral block.

18. A system according to claim 17, wherein said peripheral block is configured to transmit the interrupt flag information over said interrupt signal line; wherein a time-synchronous timing signal produced by said peripheral block is appended to the interrupt flag information; and wherein if a plurality of flags are detected at a same sampling timing, said center block is configured to arbitrate handling of interrupts according to the priorities assigned to the interrupts and indicated by the flags.

19. A system according to claim 18 wherein, after said peripheral block is configured to transmit the interrupt flag information to said center block, said peripheral block clears the interrupt flag information unconditionally.

20. A system according to claim 19 wherein, when the interrupt flag information is not found, said peripheral block is configured to stop transmission to said center block.

21. A system according to claim 13, wherein said second block is configured to perform arithmetic/logic operations at regular intervals irrespective of the action of said peripheral block.

22. A system according to claim 13, wherein said center block is configured to allow said second block to execute the process nested within the application in an input/output completion wait state while said peripheral block is performing inputting/outputting.

23. A system according to claim 13, wherein said first block is configured to be activated with an interrupt signal sent from said peripheral block, and said second block is configured to be activated by an internal system of said center block.

24. A system according to claim 13, wherein:
when certain process included in the process nested within the application and executed by said second block of said center block is completed, said center block is configured to measure a processing time having elapsed since the previous termination of the processing nested within the application and assigned to said first block; and
if the processing time exceeds a predetermined time, transfer of data representing the result of the certain processing is inhibited.

25. A system according to claim 13, wherein:
said peripheral block includes a PCI memory in which input information to be sent to said center block and output information received from said center block are stored; and wherein
said PCI memory is divided into a first storage area in which the input information is stored, and a second storage area in which the output information is stored.

26. A system according to claim 25 wherein, after the output information received from said center block is fully written in said PCI memory, said peripheral block is configured to read information from said PCI memory.

27. A system according to claim 25, wherein when said center block and said peripheral block communicate with each other over said PCI bus, only data values that have changed are sampled and transmitted.

28. A system according to claim 13, further comprising a plurality of peripheral blocks.

29. A system according to claim 28, wherein said plurality of peripheral blocks are configured to perform parallel processing of inputting/outputting relative to said center block.

30. A system according to claim 29, wherein said plurality of peripheral blocks are configured to perform parallel processing by transmitting or receiving a sync signal to or from one another.

31. A system according to claim 13, wherein when a run unit of the application corresponding to the process executed by said first block is large, said first block is configured to divide the run unit to perform the processing.

32. A system for developing logic to be implemented in a built-in microcomputer that is used while being incorporated in an electronic control unit, said system comprising:
a center block that includes a fast computing facility, a memory, and a communication facility,
a peripheral block that includes simulated microcomputer peripheral devices, a computing facility, and a communication facility, and that is connected to said center block over a PCI bus;
and an interface circuit block that includes circuits equivalent to hardware of an electronic control unit and that is connected to said peripheral block, wherein
when said center block executes an application, at the start or end of a run unit of the application corresponding to a process that is nested within the application and that contains both arithmetic/logic operations and input/output operations relative to said memory, input/output information treated during input/output operations is gathered and communicated at one time to said peripheral block over said PCI bus, wherein
said center block includes a first block to execute the process that is nested with the application and that contains both arithmetic/logic operations and input/output operations, and a second block to execute a process that is nested within the application and that contains arithmetic/logic operations alone, wherein
when a run unit of the application corresponding to the process executed by said first block is large, said first block is configured to divide the run unit to perform the processing, and
wherein the run unit of the application is divided into a run unit assigned a high priority and a run unit assigned a low priority.

33. A system for developing logic to be implemented in a built-in microcomputer that is used while being incorporated in an electronic control unit, said system comprising:
a center block that includes a fast computing facility, a memory, and a communication facility;
a peripheral block that includes simulated microcomputer peripheral devices, a computing facility, and a communication facility, and that is connected to said center block over a PCI bus;
and an interface circuit block that includes circuits equivalent to hardware of an electronic control unit and that is connected to said peripheral block, wherein when said center block executes an application, at the start or end of a run unit of the application corresponding to a process that is nested within the application and that contains both arithmetic/logic operations and input/output operations relative to said memory, input/output information treated during input/output operations is gathered and communicated at one time to said peripheral block over said PCI bus, wherein said center block includes a first block to execute the process that is nested with the application and that contains both arithmetic/logic operations and input/output operations, and a second block to execute a process that is nested within the application and that contains arithmetic/logic operations alone, wherein when a run unit of the application corresponding to the process executed by said first block is large, said first block is configured to divide the run unit to perform the processing, and wherein the run unit of the application is divided into two run units corresponding to a time-synchronous interrupt handling that does not depend on an external state and contains the input/output operations and a non-time-synchronous interrupt handling that is executed synchronously with an event whose information is detected from the external state.

34. A system according to claim 33, wherein each of the time-synchronous interrupt handling and non-time-synchronous interrupt handling is subdivided into a first run unit assigned a high priority and a second run unit assigned a low priority.

* * * * *

UNITED STATES PATENT AND TRADEMARK OFFICE
CERTIFICATE OF CORRECTION

PATENT NO. : 7,650,274 B2
APPLICATION NO. : 11/707974
DATED : January 19, 2010
INVENTOR(S) : Takashi Hiquchi et al.

It is certified that error appears in the above-identified patent and that said Letters Patent is hereby corrected as shown below:

In the Drawings

Figure 13:
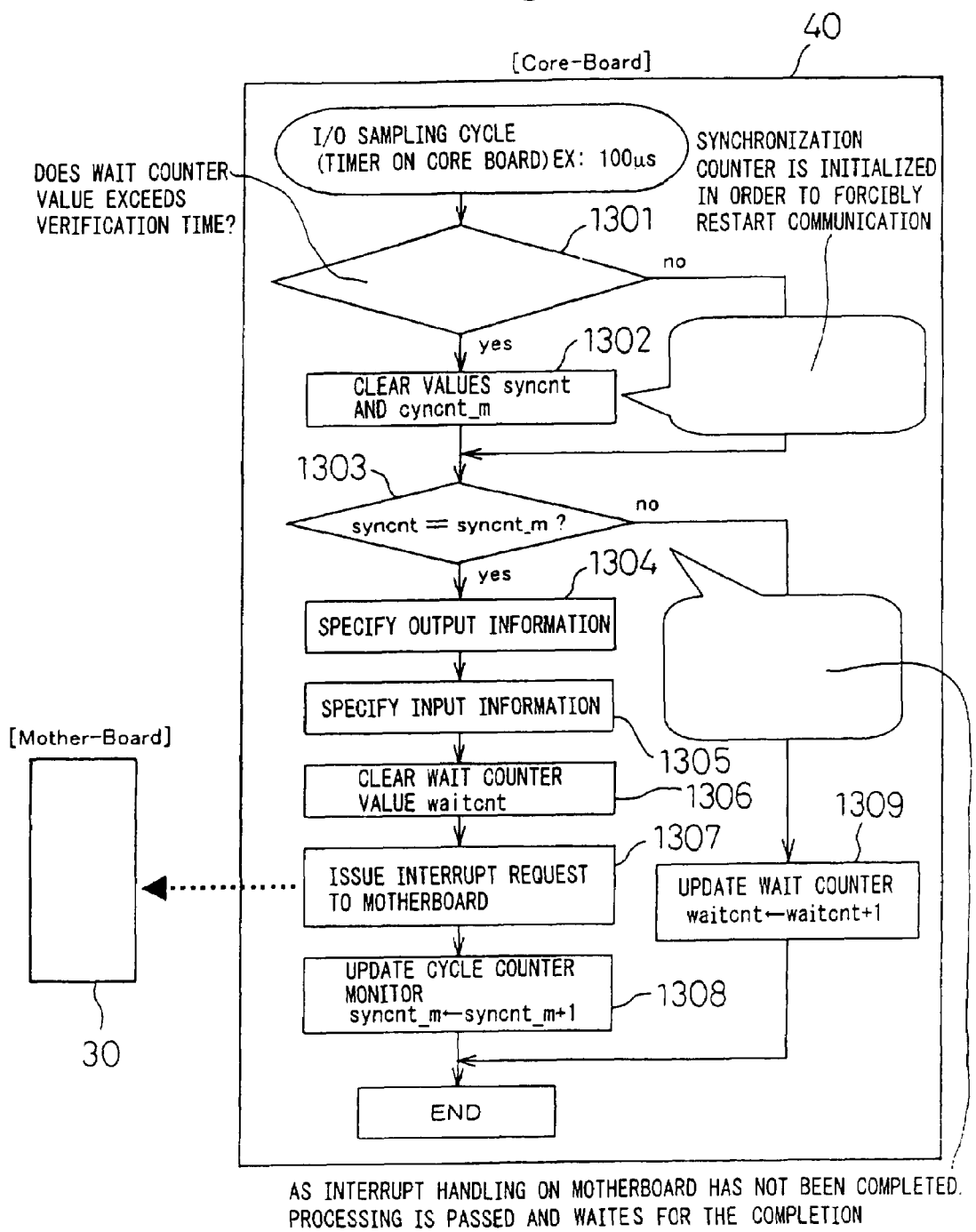
FIG. 13 is a flowchart describing a failsafe operation defined in a communication synchronization process employed in a microcomputer logic development system in accordance with an embodiment of the present invention.

| | |
|---|---|
| FIG. 13 of Sheet 14 of 55 | Delete Drawing Sheet 14 and substitute therefore the Drawing Sheet consisting of Fig. 13 as shown on the attached page |
| Column 42, Claim 32, line 26 | Delete ","<br>Insert -- ; -- |

Signed and Sealed this

Thirtieth Day of November, 2010

David J. Kappos
*Director of the United States Patent and Trademark Office*